United States Patent [19]

Yamauchi

[11] Patent Number: 5,783,957
[45] Date of Patent: Jul. 21, 1998

[54] DIFFERENTIAL AMPLIFIER CIRCUIT, CMOS INVERTER, DEMODULATOR CIRCUIT FOR PULSE-WIDTH MODULATION, AND SAMPLING CIRCUIT

[75] Inventor: Tadaaki Yamauchi, Hyogo, Japan

[73] Assignee: Mitsubishi Denki Kabushiki Kaisha, Tokyo, Japan

[21] Appl. No.: 753,917

[22] Filed: Dec. 3, 1996

Related U.S. Application Data

[62] Division of Ser. No. 527,209, Sep. 12, 1995, Pat. No. 5,621,343.

[30] Foreign Application Priority Data

Dec. 26, 1994 [JP] Japan ................. 6-322874

[51] Int. Cl.⁶ ......................................... H03K 5/02
[52] U.S. Cl. .................................. 327/53; 327/563
[58] Field of Search ......................... 327/51, 52, 53, 327/55, 65, 66, 68, 72, 78, 172, 335, 427, 434, 437, 559–563; 330/253, 261, 260

[56] References Cited

U.S. PATENT DOCUMENTS

| | | |
|---|---|---|
| 4,037,049 | 7/1977 | Lyon .................. 178/67 |
| 5,068,621 | 11/1991 | Hayward et al. ........ 330/253 |
| 5,101,126 | 3/1992 | Butler et al. .......... 330/253 |
| 5,221,909 | 6/1993 | Cole .................. 330/253 |
| 5,384,501 | 1/1995 | Koyama et al. ........ 327/336 |
| 5,389,891 | 2/1995 | Philippe .............. 330/253 |
| 5,430,337 | 7/1995 | Castello et al. ......... 327/65 |
| 5,483,183 | 1/1996 | Li et al. .............. 327/54 |
| 5,485,119 | 1/1996 | Kimura ............... 330/253 |
| 5,598,117 | 1/1997 | Deguchi .............. 327/563 |

FOREIGN PATENT DOCUMENTS 3-214669  9/1991  Japan.

Primary Examiner—Timothy P. Callahan
Assistant Examiner—My-Trang Nu Ton
Attorney, Agent, or Firm—Oblon, Spivak, McClelland, Maier & Neustadt, P.C.

[57] ABSTRACT

There is disclosed a differential amplifier circuit wherein resistors (89, 91) and capacitors (90, 92) are connected respectively between sources of a differential pair of NMOS transistors (85, 87) and a power supply (2). The resistors (89, 91) raise the source potential of the NMOS transistors to reduce current flows during the time no transition of signal level outputted from the differential amplifier circuit occurs, reducing power consumption in the differential amplifier circuit. The capacitor (90, 92) alleviate the effects of voltage drop by the resistors (89, 91) during the signal level transition to prevent reduction in operating speed of the differential amplifier circuit.

25 Claims, 35 Drawing Sheets

DIFFERENTIAL AMPLIFIER CIRCUIT, CMOS INVERTER, DEMODULATOR CIRCUIT FOR PULSE-WIDTH MODULATION, AND SAMPLING CIRCUIT

This is a Division of application Ser. No. 08/527,209 filed on Sep. 12, 1995 now U.S. Pat. No. 5,621,343.

BACKGROUND OF THE INVENTION

1. Field of the Invention

The present invention relates to a differential amplifier circuit, a CMOS inverter, a demodulator circuit for use in data transfer by means of pulse-width modulation process, and a sampling circuit for use in the demodulator circuit, all of which are used for data transfer within a semiconductor-integrated circuit device and achieve high speed operation and low power consumption.

2. Description of the Background Art

FIG. 27 is a block diagram showing data buses for data transfer between a memory cell array which is one type of memories and an arithmetic and logic unit (referred to hereinafter as an ALU) which is one type of computing circuits in a semiconductor integrated circuit device. In FIG. 27, the reference numeral 401 designates a memory cell array; the reference characters $MD_{O1}$, $MD_{O2}$ to $MD_{n1}$, $MD_{n2}$ designate pairs of input/output lines for reading and writing data from and to the memory cell array; $402_1$ to $402_n$ designate pre-amplifier circuits for amplifying data on the pairs of input/output lines $MD_{O1}$, $MD_{O2}$ to $MD_{n1}$, $MD_{n2}$, respectively; 403 designates data buses connected to the pre-amplifier circuits $402_1$ to $402_n$ for transferring data from the memory cell array 401; and 410 designates an ALU receiving the data read from the memory cell array 401 to perform computations on the data.

For computations in the ALU 410 using the information stored in the memory cell array 401, the information is read from the memory cell array 401 through the pairs of input/output lines $MD_{O1}$ to $MD_{n2}$ and is transferred to the ALU 410 through the data buses 403. Since signals are attenuated on the data buses 403 during data transfer, the pre-amplifier circuits $402_1$ to $402_n$ just amplify the signals.

FIG. 28 is a circuit diagram of a differential amplifier circuit including a current mirror load as an example of the conventional pre-amplifier circuits. In FIG. 28, the reference numeral 411 designates a PMOS transistor having a source connected to a power supply 1 providing a voltage $V_{DD}$, a gate and a drain; 412 designates a PMOS transistor having a gate connected to the gate of the PMOS transistor 411, a drain connected to the gate of the PMOS transistor 411, and a source connected to the power supply 1; 413 designates an NMOS transistor having a source connected to a power supply 2 providing a voltage $V_{SS}$, a drain connected to the drain of the PMOS transistor 411, and a gate receiving an input voltage $V_{I1}$; and 414 designates an NMOS transistor having a drain connected to the drain of the PMOS transistor 412, a source connected to the power supply 2, and a gate receiving an input voltage $V_{I2}$.

Operation of the differential amplifier circuit of FIG. 28 is discussed with reference to the waveform charts of FIGS. 29A and 29B. The pre-amplifier circuit of FIG. 28 amplifies small-amplitude differential signals having the input voltages $V_{I1}$ and $V_{I2}$ to output an output voltage $V_{O1}$. At time $t_{100}$, since the input voltage $V_{I1}$ is higher than the input voltage $V_{I2}$, the NMOS transistor 413 flows a greater amount of current than the NMOS transistor 414. The output voltage $V_{O1}$ is 0 V. However, since the input voltages $V_{I1}$ and $V_{I2}$ are both positive and higher than the threshold voltages of the NMOS transistors 413 and 414, current $i_a$ and $i_b$ flow through the NMOS transistors 413 and 414 when the output voltage $V_{O1}$ is stable at the high (voltage $V_{DD}$) or low (voltage $V_{SS}$) level.

At time $t_{101}$ where the input voltage $V_{I1}$ becomes a level equal to the input voltage $V_{I2}$, the currents $i_a$ and $i_b$ flowing through the NMOS transistors 413 and 414 become equal. When the input voltage $V_{I2}$ is higher than the input voltage $V_{I1}$, for example, at time $t_{102}$, the current $i_a$ and $i_b$ flowing through the NMOS transistors 413 and 414 have values $I_L$ and $I_H$ respectively. In this manner, more current flows through the NMOS transistor receiving the higher voltage at its gate and the current continues flowing after the output from the differential amplifier circuit is determined, resulting in a great amount of current consumption. However, the decrease in the direct current for reduction in current consumption reduces the driving capability of the differential amplifier circuit, resulting in low speed operation of the differential amplifier circuit.

As stated above, in the data transfer within the conventional single semiconductor integrated circuit device including a memory such as the memory cell array 401 and a functional block such as the ALU 410 for computing the data read from the memory, it is necessary to arrange the plurality of data buses 403 consisting of an increased number of signal lines within the semiconductor integrated circuit device in order to provide a higher data transfer rate between the memory cell array 401 and the ALU 410. The result is an increased number of pre-amplifier circuits $402_1$ to $402_n$ connected to the data buses 403 and, accordingly, increased power consumption in the pre-amplifier circuits.

Further, the number of long data buses within the semiconductor integrated circuit device increases, resulting in increased layout area of the data buses in the semiconductor integrated circuit device and increased power consumption to drive the plurality of heavily loaded data buses. The data buses wired over relatively long distances between the memory cell array 401 and ALU 410 have large wiring capacitances, resulting in increased power consumption to drive the plurality of heavily loaded data buses.

Additionally, relatively large direct current continues flowing in the differential amplifier circuit during the time no output transition occurs, increasing the current consumption in the differential amplifier circuit.

SUMMARY OF THE INVENTION

According to a first aspect of the present invention, a differential amplifier circuit comprises first and second loads each having a first end connected to a first power supply providing a first voltage and a second end, a first transistor having a first current electrode connected to the second end of the first load, a control electrode receiving a first input signal, and a second current electrode, a second transistor having a first current electrode connected to the second end of the second load, a control electrode receiving a second input signal, and a second current electrode, first voltage drop means having a first end connected to the second current electrode of the first transistor, and a second end connected to a second power supply providing a second voltage, second voltage drop means having a first end connected to the second current electrode of the second transistor, and a second end connected to the second power supply, a first capacitor connected in parallel with the first voltage drop means, and a second capacitor connected in parallel with the second voltage drop means, wherein a potential difference between the first and second signals is amplified and outputted from the first current electrodes of the first and second transistors.

Preferably, according to a second aspect of the present invention, the first load includes first resistor means having a first terminal connected to the first power supply, a second terminal connected to the first current electrode of the first transistor, and a control terminal connected to the first current electrode of the second transistor for changing a resistance in response to a voltage at the control terminal of the first resistor means, and the second load includes second resistor means having a first terminal connected to the first power supply, a second terminal connected to the first current electrode of the second transistor, and a control terminal connected to the first current electrode of the first transistor for changing a resistance in response to a voltage at the control terminal of the second resistor means.

Preferably, according to a third aspect of the present invention, the differential amplifier circuit is used in a semiconductor integrated circuit, and a pair of signals read from a memory cell array in the semiconductor integrated circuit are differentially amplified and transferred to a predetermined functional block in the semiconductor integrated circuit.

According to a fourth aspect of the present invention, a differential amplifier circuit comprises current mirror means having an input terminal connected to a first power supply providing a first voltage, and first and second output terminals, the first and second output terminals of the current mirror means providing output currents of the same value, a first transistor having a first current electrode connected to the first output terminal of the current mirror means, a control electrode receiving a first input signal, and a second current electrode, a second transistor having a first current electrode connected to the second output terminal of the current mirror means, a control electrode receiving a second input signal, and a second current electrode, first voltage drop means having a first end connected to the second current electrode of the first transistor, and a second end connected to a second power supply providing a second voltage, second voltage drop means having a first end connected to the second current electrode of the second transistor, and a second end connected to the second power supply, a first capacitor connected in parallel with the first voltage drop means, and a second capacitor connected in parallel with the second voltage drop means.

Preferably, according to a fifth aspect of the present invention, the differential amplifier circuit is used in a semiconductor integrated circuit, and a pair of signals read from a memory cell array in the semiconductor integrated circuit are differentially amplified and transferred to a predetermined functional block in the semiconductor integrated circuit.

According to a sixth aspect of the present invention, a differential amplifier circuit comprises first and second loads each having a first end connected to a first power supply providing a first voltage, and a second end, a first transistor having a first current electrode connected to the second end of the first load, a control electrode receiving a first input signal, and a second current electrode, a second transistor having a first current electrode connected to the second end of the second load, a control electrode receiving a second input signal, and a second current electrode, first voltage drop means having a first end connected to the second current electrode of the first transistor, and a second end, second voltage drop means having a first end connected to the second current electrode of the second transistor, and a second end connected to the second end of the first voltage drop means, current regulating means having a first terminal connected commonly to the second ends of the first and second voltage drop means and a second terminal connected to a second power supply providing a second voltage, for regulating current, a first capacitor having a first end connected to the first end of the first voltage drop means, and a second end connected to the first terminal of the current regulating means, and a second capacitor having a first end connected to the first end of the second voltage drop means, and a second end connected to the first terminal of the current regulating means.

Preferably, according to a seventh aspect of the present invention, the first load includes first resistor means having a first terminal connected to the first power supply, a second terminal connected to the first current electrode of the first transistor, and a control terminal connected to the first current electrode of the second transistor, for changing a resistance in response to a voltage at the control terminal of the first resistor means, and the second load includes second resistor means having a first terminal connected to the first power supply, a second terminal connected to the first current electrode of the second transistor, and a control terminal connected to the first current electrode of the first transistor, for changing a resistance in response to a voltage at the control terminal of the second resistor means.

Preferably, according to an eighth aspect of the present invention, the differential amplifier circuit is used in a semiconductor integrated circuit, and a pair of signals read from a memory cell array in the semiconductor integrated circuit are differentially amplified and transferred to a predetermined functional block in the semiconductor integrated circuit.

According to a ninth aspect of the present invention, a differential amplifier circuit comprises current mirror means having an input terminal connected to a first power supply providing a first voltage, and first and second output terminals, the first and second output terminals providing output currents of the same value, a first transistor having a first current electrode connected to the first output terminal of the current mirror means, a control electrode receiving a first input signal, and a second current electrode, a second transistor having a first current electrode connected to the second output terminal of the current mirror means, a control electrode receiving a second input signal, and a second current electrode, first voltage drop means having a first end connected to the second current electrode of the first transistor, and a second end, second voltage drop means having a first end connected to the second current electrode of the second transistor, and a second end connected to the second end of the first voltage drop means, current regulating means having a first terminal connected commonly to the second ends of the first and second voltage drop means and a second terminal connected to a second power supply providing a second voltage for regulating current, a first capacitor having a first end connected to the first end of the first voltage drop means, and a second end connected to the first terminal of the current regulating means, and a second capacitor having a first end connected to the first end of the second voltage drop means, and a second end connected to the first terminal of the current regulating means.

Preferably, according to a tenth aspect of the present invention, the differential amplifier circuit is used in a semiconductor integrated circuit, and a pair of signals read from a memory cell array in the semiconductor integrated circuit are differentially amplified and transferred to a predetermined functional block in the semiconductor integrated circuit.

According to an eleventh aspect of the present invention, a differential amplifier circuit comprises first and second loads each having a first end connected to a first power supply providing a first voltage, and a second end, a first transistor having a first current electrode connected to the second end of the first load, a control electrode receiving a first input signal, and a second current electrode, a second transistor having a first current electrode connected to the second end of the second load, a control electrode receiving a second input signal, and a second current electrode, first voltage drop means having a first end connected to the second current electrode of the first transistor, and a second end, second voltage drop means having a first end connected to the second current electrode of the second transistor, and a second end connected to the second end of the first voltage drop means, current regulating means having a first terminal connected commonly to the second ends of the first and second voltage drop means and a second terminal connected to a second power supply providing a second voltage for regulating current, a first capacitor having a first end connected to the first end of the first voltage drop means, and a second end connected to the second power supply, and a second capacitor having a first end connected to the first end of the second voltage drop means, and a second end connected to the second power supply.

Preferably, according to a twelfth aspect of the present invention, the first load includes first resistor means having a first terminal connected to the first power supply, a second terminal connected to the first current electrode of the first transistor, and a control terminal connected to the first current electrode of the second transistor, for changing a resistance in response to a voltage at the control terminal of the first resistor means, and the second load includes second resistor means having a first terminal connected to the first power supply, a second terminal connected to the first current electrode of the second transistor, and a control terminal connected to the first current electrode of the first transistor, for changing a resistance in response to a voltage at the control terminal of the second resistor means.

Preferably, according to a thirteenth aspect of the present invention, the differential amplifier circuit is used in a semiconductor integrated circuit, and a pair of signals read from a memory cell array in the semiconductor integrated circuit are differentially amplified and transferred to a predetermined functional block in the semiconductor integrated circuit.

According to a fourteenth aspect of the present invention, a differential amplifier circuit comprises current mirror means having an input terminal connected to a first power supply providing a first voltage, and first and second output terminals, the first and second output terminals providing output currents of the same value, a first transistor having a first current electrode connected to the first output terminal of the current mirror mean, a control electrode receiving a first input signal, and a second current electrode, a second transistor having a first current electrode connected to the second output terminal of the current mirror means, a control electrode receiving a second input signal, and a second current electrode, first voltage drop means having a first end connected to the second current electrode of the first transistor, and a second end, second voltage drop means having a first end connected to the second current electrode of the second transistor, and a second end connected to the second end of the first voltage drop means, current regulating means having a first terminal connected commonly to the second ends of the first and second voltage drop means and a second terminal connected to a second power supply providing a second voltage for regulating current, a first capacitor having a first end connected to the first end of the first voltage drop means, and a second end connected to the second power supply, and a second capacitor having a first end connected to the first end of the second voltage drop means, and a second end connected to the second power supply.

Preferably, according to a fifteenth aspect of the present invention, the differential amplifier circuit is used in a semiconductor integrated circuit, and a pair of signals read from a memory cell array in the semiconductor integrated circuit are differentially amplified and transferred to a predetermined functional block in the semiconductor integrated circuit.

According to a sixteenth aspect of the present invention, a differential amplifier circuit comprises first and second load each having a first end connected to a first power supply providing a first voltage, and a second end, a first transistor having a first current electrode connected to the second end of the first load, a control electrode receiving a first input signal, and a second current electrode, a second transistor having a first current electrode connected to the second end of the second load, a control electrode receiving a second input signal, and a second current electrode, a third transistor having a first current electrode connected to the second current electrode of the first transistor, a control electrode, and a second current electrode connected to a second power supply providing a second voltage, a fourth transistor having a first current electrode connected to the second current electrode of the second transistor, a control electrode, and a second current electrode connected to the second power supply, a first capacitor having a first end connected to the first current electrode of the third transistor, and a second end connected to the control electrode of the third transistor, a second capacitor having a first end connected to the first current electrode of the fourth transistor, and a second end connected to the control electrode of the fourth transistor, first voltage drop means having a first end connected to the control electrode of the third transistor, and a second end connected to a third power supply providing a third voltage at a level intermediate the first and second voltages, and second voltage drop means having a first end connected to the control electrode of the fourth transistor, and a second end connected to the third power supply, wherein a potential difference between the first and second signals is amplified and outputted from the first current electrodes of the first and second transistors.

Preferably, according to a seventeenth aspect of the present invention, the first load includes first resistor means having a first terminal connected to the first power supply, a second terminal connected to the first current electrode of the first transistor, and a control terminal connected to the first current electrode of the second transistor, for changing a resistance in response to a voltage at the control terminal of the first resistor means, and the second load includes second resistor means having a first terminal connected to the first power supply, a second terminal connected to the first current electrode of the second transistor, and a control terminal connected to the first current electrode of the first transistor, for changing a resistance in response to a voltage at the control terminal of the second resistor means.

Preferably, according to an eighteenth aspect of the present invention, the differential amplifier circuit is used in a semiconductor integrated circuit, and a pair of signals read from a memory cell array in the semiconductor integrated circuit are differentially amplified and transferred to a predetermined functional block in the semiconductor integrated circuit.

According to a nineteenth aspect of the present invention, a differential amplifier circuit comprises current mirror means having an input terminal connected to a first power supply providing a first voltage, and first and second output terminals, the first and second output terminals providing output currents of the same value, a first transistor having a first current electrode connected to the first output terminal of the current mirror means, a control electrode receiving a first input signal, and a second current electrode, a second transistor having a first current electrode connected to the second output terminal of the current mirror means, a control electrode receiving a second input signal, and a second current electrode, a third transistor having a first current electrode connected to the second current electrode of the first transistor, a control electrode, and a second current electrode connected to a second power supply providing a second voltage, a fourth transistor having a first current electrode connected to the second current electrode of the second transistor, a control electrode, and a second current electrode connected to the second power supply, a first capacitor having a first end connected to the first current electrode of the third transistor, and a second end connected to the control electrode of the third transistor, a second capacitor having a first end connected to the first current electrode of the fourth transistor, and a second end connected to the control electrode of the fourth transistor, first voltage drop means having a first end connected to the control electrode of the third transistor, and a second end connected to a third power supply providing a third voltage at a level intermediate the first and second voltages, and second voltage drop means having a first end connected to the control electrode of the fourth transistor, and a second end connected of the third power supply.

Preferably, according to a twentieth aspect of the present invention, the differential amplifier circuit is used in a semiconductor integrated circuit, and a pair of signals read from a memory cell array in the semiconductor integrated circuit are differentially amplified and transferred to a predetermined functional block in the semiconductor integrated circuit.

According to a twenty-first aspect of the present invention, a differential amplifier circuit comprises first and second loads each having a first end connected to a first power supply providing a first voltage, and a second end, a first transistor having a first current electrode connected to the second end of the first load, a control electrode receiving a first input signal, and a second current electrode, a second transistor having a first current electrode connected to the second end of the second load, a control electrode receiving a second input signal, and a second current electrode connected to the second current electrode of the first transistor, a third transistor having a first current electrode connected commonly to the second current electrodes of the first and second transistors, a control electrode, and a second current electrode connected to a second power supply providing a second voltage, a capacitor having a first end connected to the first current electrode of the third transistor, and a second end connected to the control electrode of the third transistor, and voltage drop means having a first end connected to the control electrode of the third transistor, and a second end connected to a third power supply providing a third voltage at a level intermediate the first and second voltages.

Preferably, according to a twenty-second aspect of the present invention, the first load includes first resistor means having a first terminal connected to the first power supply, a second terminal connected to the first current electrode of the first transistor, and a control terminal connected to the first current electrode of the second transistor, for changing a resistance in response to a voltage at the control terminal of the first resistor means, and the second load includes second resistor means having a first terminal connected to the first power supply, a second terminal connected to the first current electrode of the second transistor, and a control terminal connected to the first current electrode of the first transistor, for changing a resistance in response to a voltage at the control terminal of the second resistor means.

Preferably, according to a twenty-third aspect of the present invention, the differential amplifier circuit is used in a semiconductor integrated circuit, and a pair of signals read from a memory cell array in the semiconductor integrated circuit are differentially amplified and transferred to a predetermined functional block in the semiconductor integrated circuit.

According to a twenty-fourth aspect of the present invention, a differential amplifier circuit comprises current mirror means having an input terminal connected to a first power supply providing a first voltage, and first and second output terminals, the first and second output terminals providing output currents of the same value, a first transistor having a first current electrode connected to the first output terminal of the current mirror means, a control electrode receiving a first input signal, and a second current electrode, a second transistor having a first current electrode connected to the second output terminal of the current mirror means, a control electrode receiving a second input signal, and a second current electrode, a third transistor having a first current electrode connected commonly to the second current electrodes of the first and second transistors, a control electrode, and a second current electrode connected to a second power supply providing a second voltage, a capacitor having a first end connected to the first current electrode of the third transistor, and a second end connected to the control electrode of the third transistor, and voltage drop means having a first end connected to the control electrode of the third transistor, and a second end connected to a third power supply providing a third voltage at a level intermediate the first and second voltages.

Preferably, according to a twenty-fifth aspect of the present invention, the differential amplifier circuit is used in a semiconductor integrated circuit, and a pair of signals read from a memory cell array in the semiconductor integrated circuit are differentially amplified and transferred to a predetermined functional block in the semiconductor integrated circuit.

According to a twenty-sixth aspect of the present invention, a CMOS inverter comprises first and second power supply lines formed on a semiconductor substrate and connected respectively to power supplies providing first and second voltages, a P-channel field-effect transistor formed on the semiconductor substrate and having a source connected to the first power supply line, a drain, and a gate receiving an input signal, an N-channel field-effect transistor formed on the semiconductor substrate and having a source connected to the second power supply line, a drain connected to the drain of the P-channel field-effect transistor, and a gate receiving the input signal, a first capacitor formed on the semiconductor substrate adjacent the source of the P-channel field-effect transistor and having a first end connected to the first power supply and a second end connected to the source of the P-channel field-effect transistor, and a second capacitor formed on the semiconductor substrate adjacent the source of the N-channel field-effect transistor and having a first end connected to the second power supply and a second end connected to the source of the N-channel field-effect transistor.

According to a twenty-seventh aspect of the present invention a demodulator circuit for pulse-width modulation which is used for data transfer within a semiconductor integrated circuit by means of pulse-width modulation process, comprises sampling signal generator means for generating a plurality of sampling signals after respective different predetermined times have elapsed since receipt of a leading edge of a pulse signal, a plurality of sampling means provided in corresponding relation to the plurality of sampling signals and receiving the pulse signal and the sampling signals associated therewith, the plurality of sampling means being rendered operable after receipt of the leading edge of the pulse signal to output a detection signal indicating whetheror not trailing edge of the pulse signal is received prior to receipt of the sampling signals, and an encoder for generating data depending on which sampling means, of the plurality of sampling means, judges that the trailing edge of the pulse signal is received prior to receipt of the sampling signals.

According to a twenty-eighth aspect of the present invention, a sampling circuit comprises an inverter receiving a first sampling signal to output the inverted logic of the first sampling signal, a first insulated gate transistor of a first conductivity type having a control electrode receiving the output from the inverter, a first current electrode connected to a first power supply, and a second current electrode, a second insulated gate transistor of a second conductivity type having a control electrode receiving the output from the inverter, a first current electrode, and a second current electrode connected to the second current electrode of the first insulated gate transistor, a third insulated gate transistor of the second conductivity type having a control electrode receiving a signal to be sampled, a first current electrode, and a second current electrode connected to the first current electrode of the second insulated gate transistor, a fourth insulated gate transistor of the second conductivity type having a control electrode receiving a second sampling signal, a first current electrode connected to a second power supply, and a second current electrode connected to the first current electrode of the third insulated gate transistor, a fifth insulated gate transistor of the first conductivity type having a control electrode connected to the second current electrode of the first insulated gate transistor, a first current electrode connected to the first power supply, and a second current electrode, a sixth insulated gate transistor of the second conductivity type having a control electrode receiving the first sampling signal, a first current electrode connected to the second power supply, and a second current electrode connected to the second current electrode of the fifth insulated gate transistor, and a seventh insulated gate transistor of the second conductivity type having a control electrode connected to the second current electrode of the fifth insulated gate transistor, a first current electrode connected to the second power supply, and a second current electrode connected to the first current electrode of the second insulated gate transistor.

According to a twenty-ninth aspect of the present invention, a demodulator circuit for pulse-width modulation which is used for data transfer within a semiconductor integrated circuit by means of pulse-width modulation process, comprises sampling signal generator means for generating a plurality of sampling signals after respective different predetermined times have elapsed since receipt of a leading edge of a pulse signal, a plurality of sampling means provided in corresponding relation to the plurality of sampling signals and receiving the pulse signal and the sampling signals associated therewith, the plurality of sampling means being rendered operable after receipt of the leading edge of the pulse signal to output a detection signal indicating whether or not a trailing edge of the pulse signal is received prior to receipt of the sampling signals, and an encoder for generating data depending on which sampling means, of the plurality of sampling means, judges that the trailing edge of the pulse signal is received prior to receipt of the sampling signals, each of the plurality of sampling means including an inverter receiving a first sampling signal included in the plurality of sampling signals to output an inverted logic of the first sampling signal, a first insulated gate transistor of a first conductivity type having a control electrode receiving the output from the inverter, a first current electrode connected to a first power supply, and a second current electrode, a second insulated gate transistor of a second conductivity type having a control electrode receiving the output from the inverter, a first current electrode, and a second current electrode connected to the second current electrode of the first insulated gate transistor, a third insulated gate transistor of the second conductivity type having a control electrode receiving a signal to be sampled, a first current electrode, and a second current electrode connected to the first current electrode of the second insulated gate transistor, a fourth insulated gate transistor of the second conductivity type having a control electrode receiving a second sampling signal included in the plurality of sampling signals, a first current electrode connected to a second power supply, and a second current electrode connected to the first current electrode of the third insulated gate transistor, a fifth insulated gate transistor of the first conductivity type having a control electrode connected to the second current electrode of the first insulated gate transistor, a first current electrode connected to the first power supply, and a second current electrode, a sixth insulated gate transistor of the second conductivity type having a control electrode receiving the first sampling signal, a first current electrode connected to the second power supply, and a second current electrode connected to the second current electrode of the fifth insulated gate transistor, and a seventh insulated gate transistor of the second conductivity type having a control electrode connected to the second current electrode of the fifth insulated gate transistor, a first current electrode connected to the second power supply, and a second current electrode connected to the first current electrode of the second insulated gate transistor.

The first and second voltage drop means according to the first, second, fourth, sixth, seventh, ninth, eleventh, twelfth, fourteenth, seventeenth and twenty-second aspects of the present invention increases the voltage at the second current electrodes of the first and second transistors in the steady state wherein a constant direct current flows, reducing the direct current flowing in the first and second transistors. On the other hand, the first and second capacitors act to hold the voltage at the second current electrode of the first or second transistor constant when the output from the first or second transistor changes, thereby holding a large amount of voltage gain prior to the charging or discharging of the first or second capacitor is completed when the output of the transistor changes.

The third and fourth transistors according to the second, seventh, twelfth, sixteenth, seventeenth, nineteenth, twenty-first and twenty-second aspects of the present invention receive the third voltage at their control electrode by the first and second voltage drop means when the first and second transistors are steady to limit the direct current flowing in the first and second transistors. On the other hand, the third and fourth transistors receive at their control electrode the third voltage to which the amount of voltage change at the first current electrodes of the third and fourth transistors is added by the first and second capacitors, thereby reducing the resistance so that a large amount of current flows in the first and second transistors.

The first and second resistor means according to the second, seventh, twelfth, seventeenth, and twenty-second aspects of the present invention have resistances such that the resistance of the second resistor means is less than that of the first resistor means when the first transistor is on and the resistance of the first resistor means is less than that of the second resistor means when the second transistor is on. Thus, the first and second resistor means can limit the current flowing through one of the first and second transistors which is on and improve the differential gain of the differential amplifier circuit.

The differential amplifier circuit according to the third, fifth, eighth, tenth, thirteenth, fifteenth, eighteenth, twentieth, twenty-third, and twenty-fifth aspects of the present invention is used to differentially amplify the pair of data read from the memory cell array to reduce the power consumption for each pair of memory cells to a low level. In general, since a plurality of pairs of data are read from the memory cell array by using different pairs of signal lines, a number of differential amplifier circuits are used and a large amount of power consumption is reduced.

The first and second capacitors according to the twenty-sixth aspect of the present invention can hold the source voltage at the voltages of the first and second power supplies during the signal transition when the P-channel field-effect transistor turns on and when the N-channel field-effect transistor turns on. This alleviates the reduction in driving capability of the field-effect transistors due to resistance of the power supply lines.

The plurality of sampling signals outputted from the sampling signal generator means according to the twenty-seventh aspect of the present invention are generated after the respective different predetermined times have elapsed since receipt of the rising edge of the pulse signal. Inspection of the outputs from the plurality of sampling means can determine which sampling means, of the plurality of sampling means, receives the sampling signal prior to the falling edge of the pulse signal, thereby determining the time interval between the rising edge and falling edge of the pulse signal in asynchronous manner. Only the pulse signal permits the encoder to encode the pulse signal in accordance with the pulse width of the pulse signal without the application of other signals serving as a basis of the pulse width of the pulse signal.

The first insulated gate transistor according to the twenty-eighth aspect of the present invention initially turns on in response to the first sampling signal and is precharged at its second current electrode to the voltage at the first power supply. Then, the first sampling signal turns off the first insulated gate transistor and turns on the second insulated gate transistor, and the second sampling signal turns on the fourth insulated gate transistor. In this state, the turning on of the third insulated gate transistor in response to the signal to be sampled changes the second current electrode of the precharged first insulated gate transistor toward the voltage at the second power supply. As the voltage between the control electrode and first current electrode of the fifth insulated gate transistor becomes lower than the threshold voltage, the fifth insulated gate transistor turns on to apply the voltage of the first power supply to the control electrode of the seventh insulated gate transistor. Therefore, the seventh insulated gate transistor turns on, and the second current electrode of the first insulated gate transistor has the second voltage.

However, the second current electrode of the first insulated gate transistor hold the voltage at the first power supply when the third insulated gate transistor turns on during the off state of the second insulated gate transistor responsive to the second sampling signal.

Therefore the voltage at the second current electrode of the first insulated gate transistor of the sampling circuit can determine whether or not the signal to be sampled is applied prior to the second sampling signal.

The sampling means according to the twenty-ninth aspect of the present invention includes the sampling circuit according to the fourteenth aspect of the present invention to sample the falling edge of the pulse at high speeds, transferring a large amount of bit information with a short pulse width.

It is therefore an object of the present invention to achieve a small amount of current consumption in a differential amplifier circuit applied to a pre-amplifier circuit, a small amount of current consumption in data buses by reduction in the number of signal lines used for the data buses, and a small layout area of the data buses.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
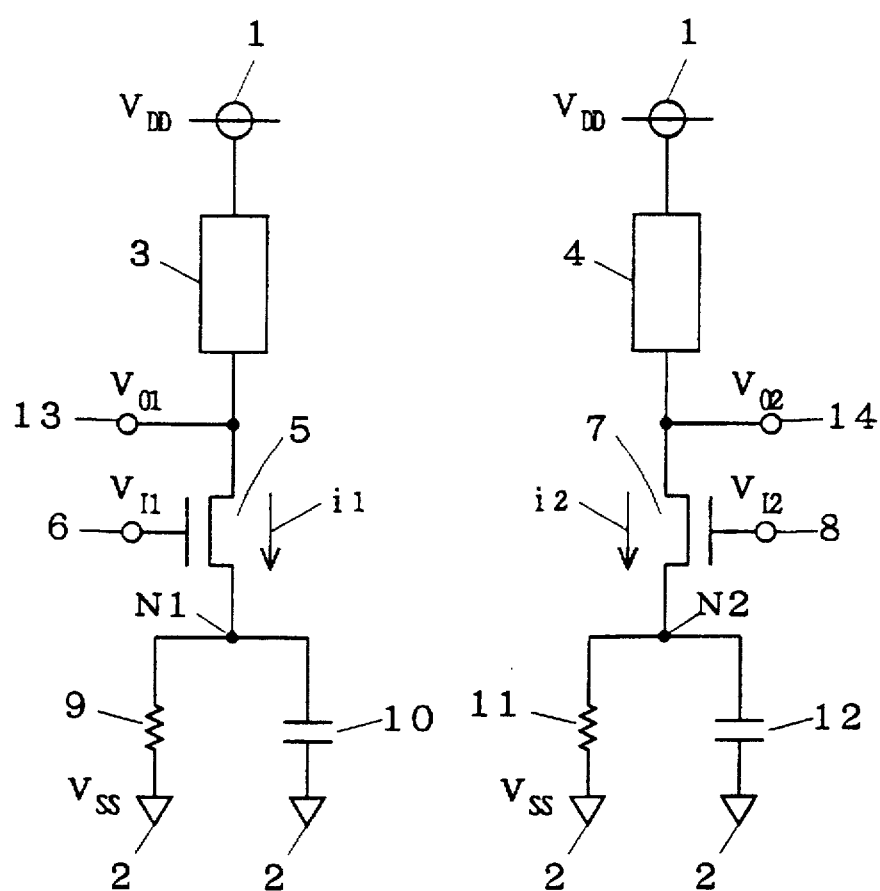
FIG. 1 is a circuit diagram of a differential amplifier circuit according to a first preferred embodiment of the present invention.

A differential amplifier circuit according to a first preferred embodiment of the present invention will now be described with reference to FIGS. 1, 2A and 2B. FIG. 1 is a circuit diagram of the differential amplifier circuit according to the first preferred embodiment of the present invention. In FIG. 1, the reference numerals 3 and 4 designate loads each having a first end connected to a power supply 1 and a second end; 5 designates an NMOS transistor having a source connected to a node N1, a gate connected to an input terminal 6, and a drain connected to the second end of the load 3; 7 designates an NMOS transistor having a source connected to a node N2, a gate connected to an input terminal 8, and a drain connected to the second end of the load 4; 9 designates a resistor having a first end connected to the first node N1 and a second end connected to a power supply 2; 10 designates a capacitor having a first end connected to the node N1 and a second end connected to the power supply 2; 11 designates a resistor having a first end connected to the node N2 and a second end connected to the power supply 2; 12 designates a capacitor having a first end connected to the node N2 and a second end connected to the power supply 2; 13 designates an output terminal connected to the second end of the load 3; and 14 designates an output terminal connected to the second end of the load 4. The loads 3 and 4 are active loads or the like which comprise a passive load including a resistor and a transistor, and a constant current source. Differential input voltages $V_{I1}$ and $V_{I2}$ of small amplitude are provided at the input terminals 6 and 8, respectively. Output voltages $V_{O1}$ and $V_{O2}$ are provided at the output terminals 13 and 14, respectively.

Operation of the differential amplifier circuit of FIG. 1 is described below with reference to the waveform charts of FIGS. 2A and 2B. With the small-amplitude differential signal voltages $V_{I1}$ and $V_{I2}$ applied, there is a current flow in the differential amplifier circuit through the NMOS transistors 5 and 7. The currents flowing through the NMOS transistors 5 and 7 are designated as $i_1$ and $i_2$, respectively. The resistors 9 and 11 cause the source voltages $V_{N1}$ and $V_{N2}$ of the NMOS transistors to rise by the product of current and resistance, that is, $R \times i_1$ and $R \times i_2$, respectively, where R is the resistance of the resistors 9 and 11. For example, when the voltage $V_{I1}$ at the input terminal 6 which is constant at $V_H$ is higher than the voltage $V_{I2}$ at the input terminal 8 which is constant at $V_L$, large current $i_i$ flows in the NMOS transistor 5 and small current $i_2$ flows in the NMOS transistor 7. Then the voltage at the node N1 is higher than the voltage at the node N2 as shown in FIG. 2A. The source voltage $V_{N1}$ is higher than the voltage $V_{N2}$ by the amount of voltage drop of the resistor 9, and the gate-source voltage of the NMOS transistor 5 is lowered. Thus, the direct current $i_i$ is lowered in a stable state in which one of the input voltages $V_{I1}$ and $V_{I2}$ holds the high voltage $V_H$ and the other holds the low voltage $V_L$.

Figure 2A:
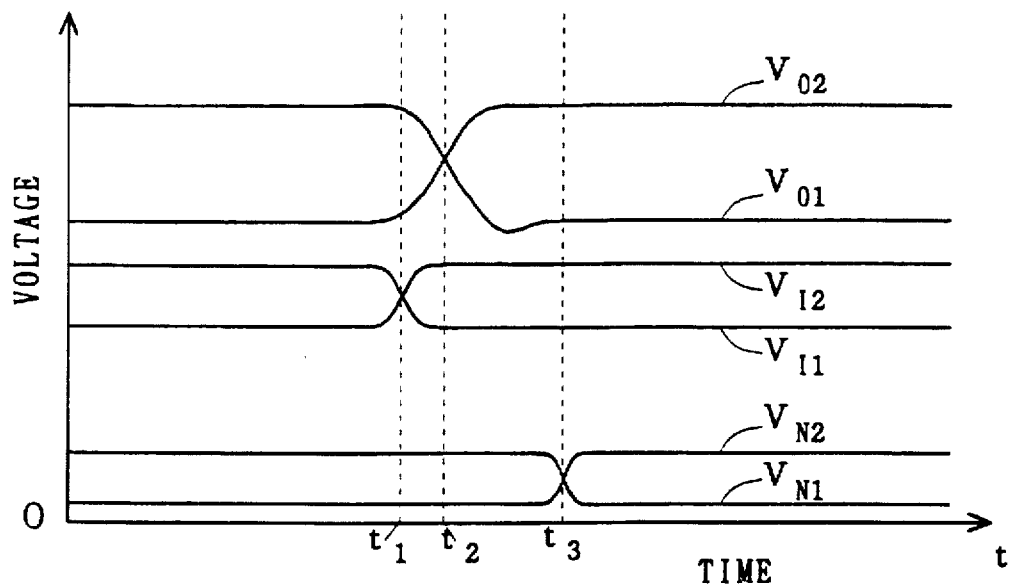
FIGS. 2A and 2B are waveform charts showing the operation of the differential amplifier circuit of FIG. 1.
Figure 2B:
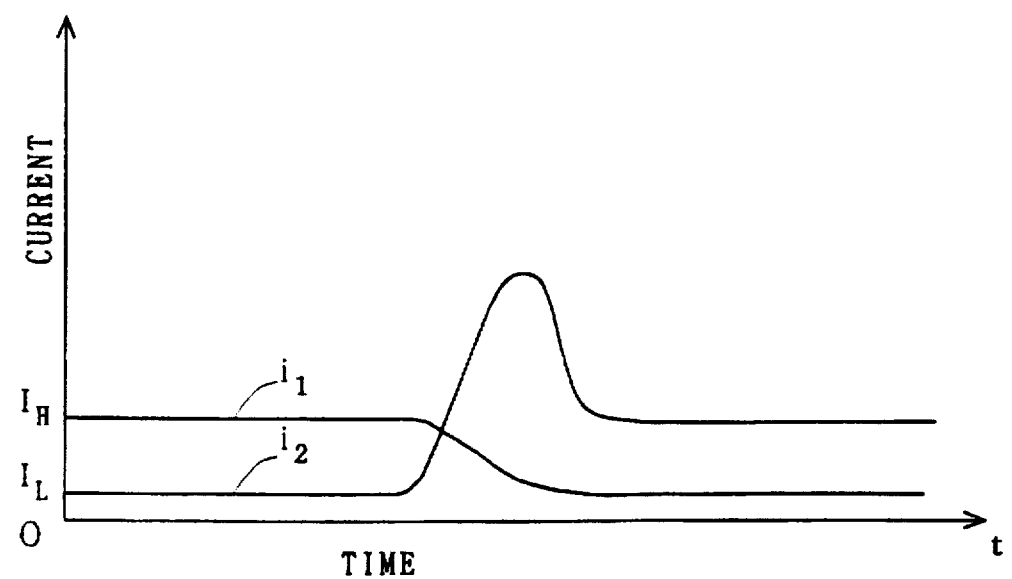

When the magnitudes of the input voltages $V_{I1}$ and $V_{I2}$ are inverted at time $t_1$ of FIG. 2A, the conductance of the NMOS transistor 5 decreases and the current $i_1$ flowing through the NMOS transistor 5 decreases. On the other hand, since the NMOS transistor 7 receives negative charges from the capacitor 12 and is not affected by the voltage drop by the resistor 11, the voltage at the node N2 does not rise soon. Thus, at the instant of signal transition, the voltage gain increases to allow the device and circuit connected to the output terminal $V_{O2}$ to be driven at high speeds. As shown in FIG. 2B, the current $i_2$ has a great peak at the instant of signal transition. The voltage at the node N2 gradually rises during a predetermined time interval determined by the capacitor 12 and the resistance 11 and then becomes stable at a given value. The input voltage $V_{I2}$ can lower the current in the stable state in which the predetermined voltage $V_H$ is held. In this manner, the capacitor 10 or 12 connected to the node N1 or N2 at a low voltage supplies the charges for high speed operation of the differential amplifier circuit during the transition of the input signals $V_{I1}$ and $V_{I2}$. After an elapse of the predetermined time interval determined by the resistance and capacitor value, the source voltages of the NMOS transistors 5, 7 are held high by the amount of voltage drop by the resistors 9, 11, and the small direct current flowing through the transistors 5, 7 is lowered. This accomplishes a high-speed differential amplifier circuit with a small amount of current consumption.

Second Preferred Embodiment

Figure 3:
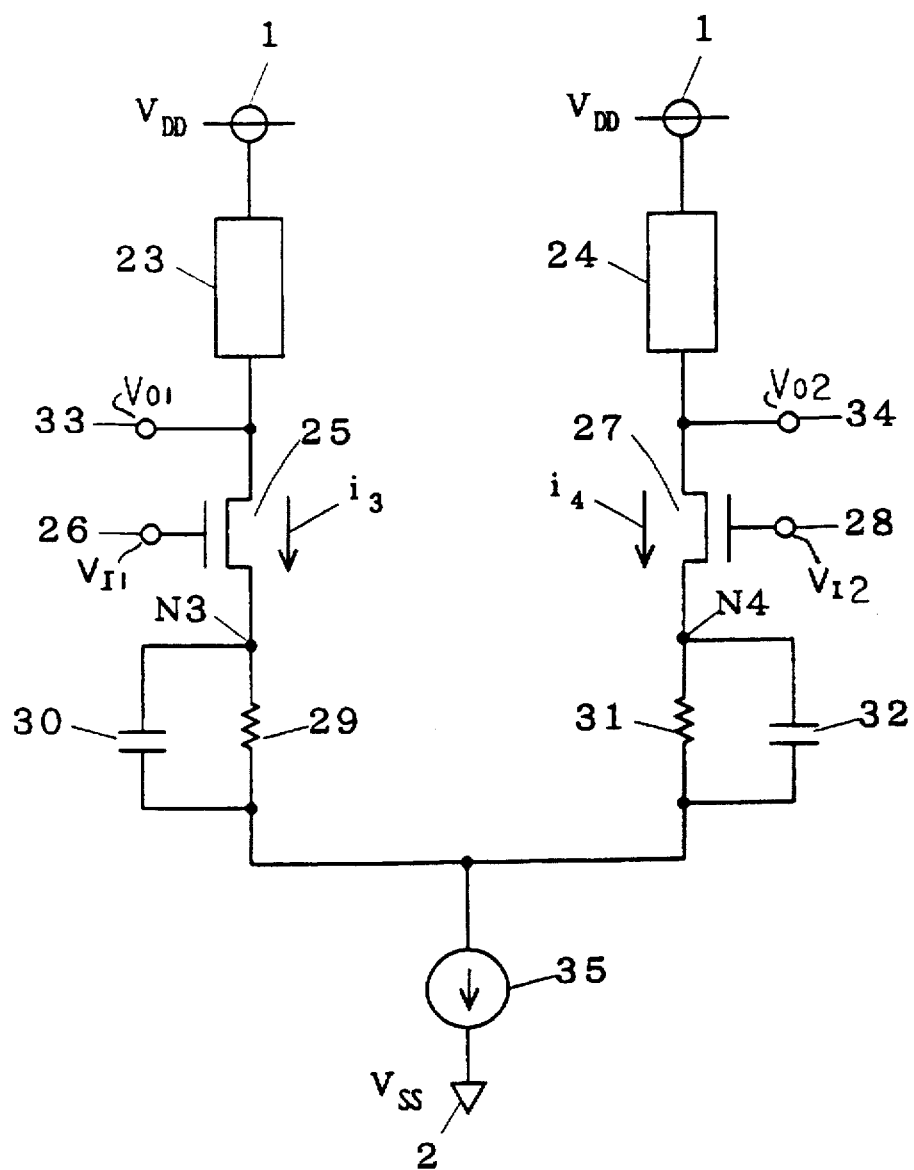
FIG. 3 is a circuit diagram of the differential amplifier circuit according to a second preferred embodiment of the present invention.

The differential amplifier circuit according to a second preferred embodiment of the present invention will be discussed with reference to FIG. 3. FIG. 3 is a circuit diagram of the differential amplifier circuit according to the second preferred embodiment of the present invention. In FIG. 3, the reference numerals 23 and 24 designate loads each having a first end connected to the power supply 1 and a second end; 25 designates an NMOS transistor having a source connected to a node N3, a gate connected to an input terminal 26, and a drain connected to the second end of the load 23; 27 designates an NMOS transistor having a source connected to a node N4, a gate connected to an input terminal 28, and a drain connected to the second end of the load 24; 29 designates a resistor having a first end connected to the node N3 and a second end; 30 designates a capacitor having a first end connected to the node N3 and a second end connected to the second end of the resistor 29; 31 designates a resistor having a first end connected to the node N4 and a second end connected to the second end of the resistor 29; 32 designates a capacitor having a first end connected to the node N4 and a second end connected to the second end of the resistor 29; 33 designates an output terminal connected to the second end of the load 23; 34 designates an output terminal connected to the second end of the load 24; and 35 designates a constant current source having an input terminal connected to the second end of the resistor 29 and an output terminal connected to the power supply 2 for feeding a predetermined current. The loads 23 and 24 are active loads or the like which comprise a passive load including a resistor and a transistor, and a constant current source. Input voltages $V_{I1}$ and $V_{I2}$ are provided at the input terminals 26 and 28, respectively. Output voltages $V_{O1}$ and $V_{O2}$ are provided at the output terminals 33 and 34, respectively.

Similar to the first preferred embodiment, such an arrangement allows the voltage at the node N3 or N4 to be increased by a current $i_3$ or $i_4$ when the input voltages $V_{I1}$ and $V_{I2}$ are stable, thereby decreasing the direct current $i_3$ or $i_4$. A small potential difference between the first and second ends of the capacitor 30 or 32 which is connected to the source of the transistor receiving the lower of the input voltages $V_{I1}$ and $V_{I2}$ alleviates the influence of current suppression by the resistor 29 or 31 during the transition of the input voltages $V_{I1}$ and $V_{I2}$, increasing the voltage gain of the differential amplifier circuit. This permits the differential amplifier circuit to drive the element and circuit connected to the output terminals at high speeds.

Third Preferred Embodiment

Figure 4:
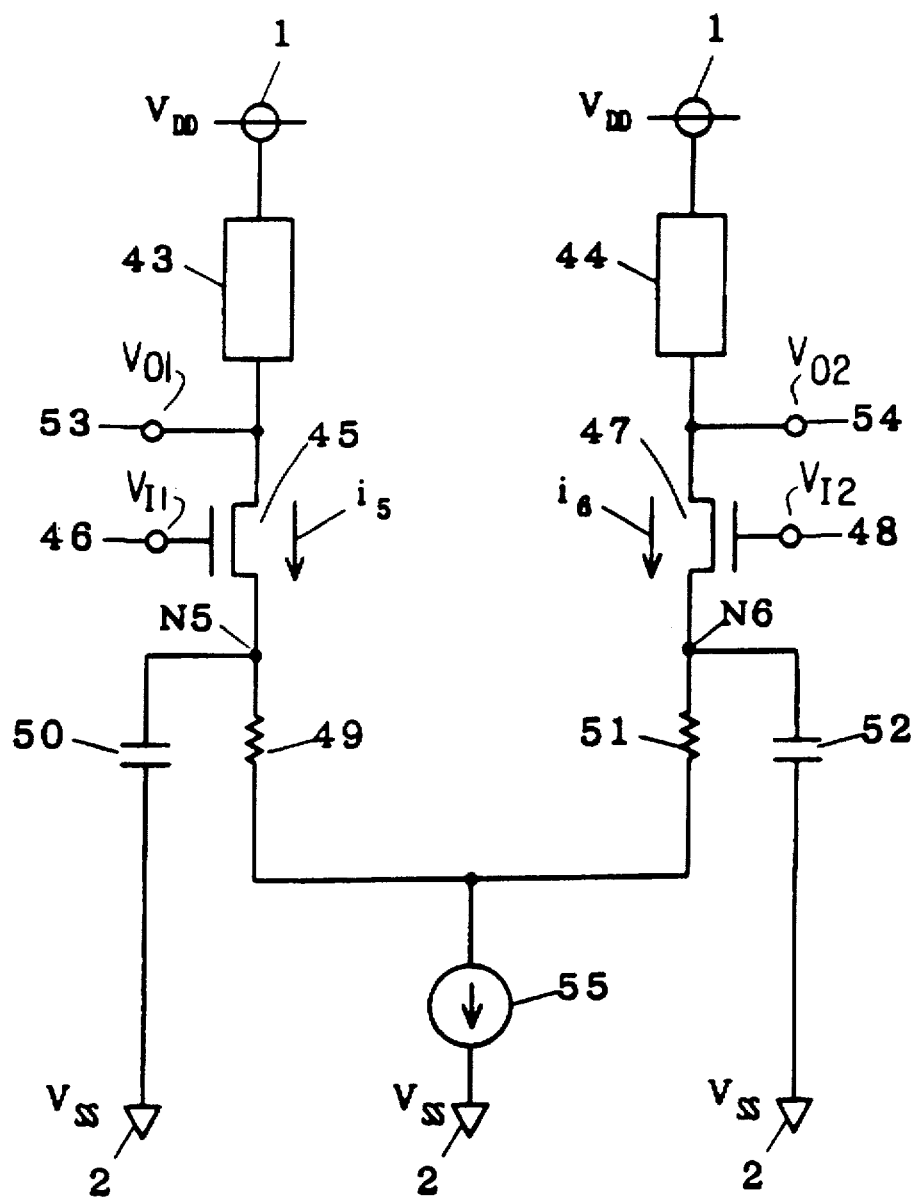
FIG. 4 is a circuit diagram of the differential amplifier circuit according to a third preferred embodiment of the present invention.

The differential amplifier circuit according to a third preferred embodiment of the present invention will be discussed with reference to FIG. 4. FIG. 4 is a circuit diagram of the differential amplifier circuit according to the third preferred embodiment of the present invention. In FIG. 4, the reference numerals 43, 44 designate loads each having a first end connected to the power supply 1 and a second end; 45 designates an NMOS transistor having a source connected to a node N5, a gate connected to an input terminal 46, and a drain connected to the second end of the load 43; 47 designates an NMOS transistor having a source connected to a node N6, a gate connected to an input terminal 48, and a drain connected to the second end of the load 44; 49 designates a resistor having a first end connected to the node N5 and a second end; 50 designates a capacitor having a first end connected to the node N5 and a second end connected to the second power supply 2; 51 designates a resistor having a first end connected to the node N6 and a second end connected to the second end of the resistor 49; 52 designates a capacitor having a first end connected to the node N6 and a second end connected to the second power supply 2; 53 designates an output terminal connected to the second end of the load 43; 54 designates an output terminal connected to the second end of the load 44; and 55 designates a constant current source having an input terminal connected to the second end of the resistor 49 and an output terminal connected to the power supply 2 for feeding a predetermined current. The loads 43, 44 are active loads or the like which comprise a passive load including a resistor and a transistor, and a constant current source. Input voltages $V_{I1}$ and $V_{I2}$ are provided at the input terminals 46 and 48, respectively. Output voltages $V_{O1}$ and $V_{O2}$ are provided at the output terminals 53 and 54, respectively.

Similar to the first preferred embodiment, such an arrangement allows the voltage at the node N5 or N6 to be increased by a current $i_5$ or $i_6$ when the input voltages $V_{I1}$ and $V_{I2}$ are stable, thereby decreasing the direct current $i_5$ or $i_6$. Since the second end of the capacitor 50 or 52 which is connected to the source of the transistor receiving the lower of the input voltages $V_{I1}$ and $V_{I2}$ is connected to the second power supply 2, the direct current supply from the capacitor 50 or 52 alleviates the influence of current suppression by the resistor 49 or 51 during the transition of the input voltages $V_{I1}$ and $V_{I2}$, increasing the voltage gain of the differential amplifier circuit. This permits the differential amplifier circuit to drive the element and circuit connected to the output terminals at high speeds.

Fourth Preferred Embodiment

Figure 5:
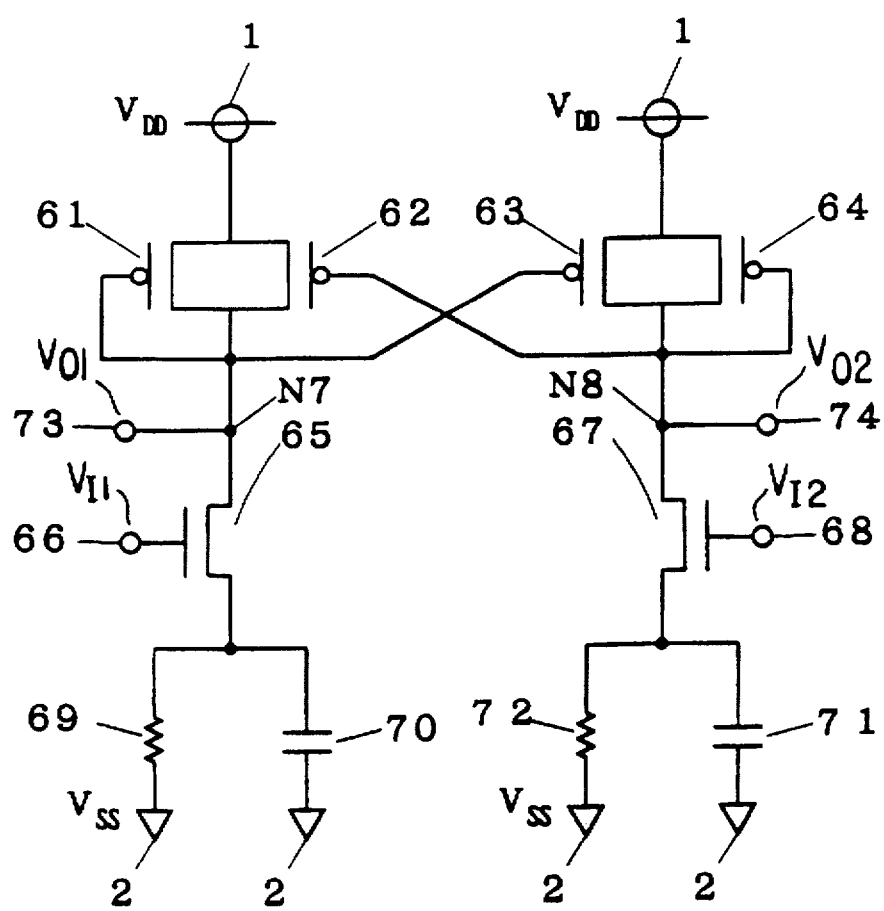
FIG. 5 is a circuit diagram of the differential amplifier circuit according to a fourth preferred embodiment of the present invention.

The differential amplifier circuit according to a fourth preferred embodiment of the present invention will be discussed with reference to FIG. 5. FIG. 5 is a circuit diagram of the differential amplifier circuit according to the fourth preferred embodiment of the present invention. In FIG. 5, the reference numeral 61 designates a PMOS transistor having a source connected to the power supply 1, a gate, and a drain; 62 designates a PMOS transistor having a source connected to the power supply 1, a drain connected to the drain and gate of the PMOS transistor 61, and a gate; 63 designates a PMOS transistor having a source connected to the power supply 1, a gate connected to the drains of the PMOS transistors 61, 62, and a drain connected to the gate of the PMOS transistor 62; 64 designates a PMOS transistor having a source connected to the power supply 1, a gate connected to the drain of the PMOS transistor 63, and a drain connected to the drain of the PMOS transistor 63; 65 designates an NMOS transistor having a source connected to a node N7, a gate connected to an input terminal 66, and a drain connected to the drains of the PMOS transistor 61, 62; 67 designates an NMOS transistor having a source connected to a node N8, a gate connected to an input terminal 68, and a drain connected to the drains of the PMOS transistors 63, 64; 69 designates a resistor having a first end connected to the node N7 and a second end connected to the power supply 2; 70 designates a capacitor having a first end connected to the node N7 and a second end connected to the power supply 2; 72 designates a resistor having a first end connected to the node N8 and a second end connected to the power supply 2; 71 designates a capacitor having a first end connected to the node N8 and a second end connected to the power supply 2; 73 designates an output terminal connected to the drains of the PMOS transistors 61, 62; and 74 designates an output terminal connected to the drains of the PMOS transistors 63, 64.

The differential amplifier circuit of the fourth preferred embodiment differs from that of the first preferred embodiment in that the loads are formed by the cross-coupled PMOS transistors 62, 63. Thus, the differential amplifier circuit of the fourth preferred embodiment can vary the load resistances by increasing or decreasing the current fed from the power supply 1, unlike the first preferred embodiment. For example, when the current flowing through the PMOS transistors 61, 62 which form a load is higher than the current flowing through the PMOS transistors 63, 64 which form a load, the voltage at the node N7 is lower than the voltage at the node N8. At this time, the gate voltage of the PMOS transistor 63 which is equal to the voltage at the node N7 decreases as the voltage at the node N7 decreases, and the PMOS transistor 63 has a low ON-state resistance. At the same time, the gate voltage of the PMOS transistor 62 which is equal to the voltage at the node N8 decreases as the voltage at the node N8 increases, and the PMOS transistor 62 has a high ON-state resistance. Thus the PMOS transistors 62, 63 function to increase the potential difference between the nodes N7 and N8. However, too large potential difference between the nodes N7 and N8 causes the transition in the differential amplifier circuit to require much time. To prevent too large potential difference between the nodes N7 and N8, the transistors 61 and 64 are connected. The resistors 69, 72 and capacitors 70, 71 are similar in function to the resistors 9, 11 and capacitors 10, 12 of the differential amplifier circuit of the first preferred embodiment shown in FIG. 1, providing the same effects as the first preferred embodiment.

Figure 30:
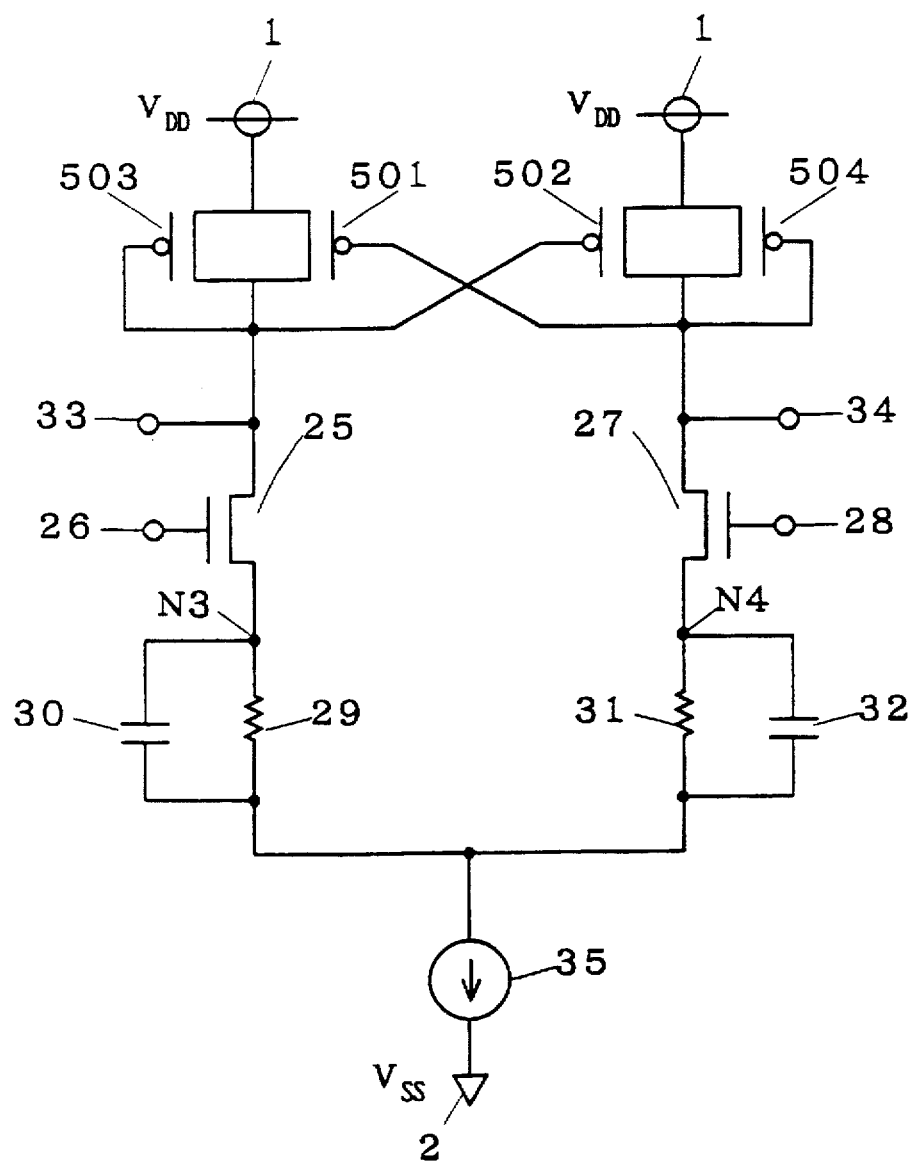
FIG. 30 is a circuit diagram of the differential amplifier circuit according to a second mode of the fourth preferred embodiment of the present invention.

Referring to FIG. 30, the loads 23, 24 shown in FIG. 3 may be replaced with a load including: a PMOS transistor 501 having a source connected to the power supply 1, a drain connected to the output terminal 33, and a gate connected to the output terminal 34; a PMOS transistor 502 having a source connected to the power supply 1, a drain connected to the output terminal 34, and a gate connected to the output terminal 33; a PMOS transistor 503 having a source connected to the power supply 1, a drain connected to the output terminal 33, and a gate connected to the output terminal 33; and a PMOS transistor 504 having a source connected to the power supply, a drain connected to the output terminal 34, and a gate connected to the output terminal 34, thereby providing combined effects of the second and fourth preferred embodiments.

Figure 31:
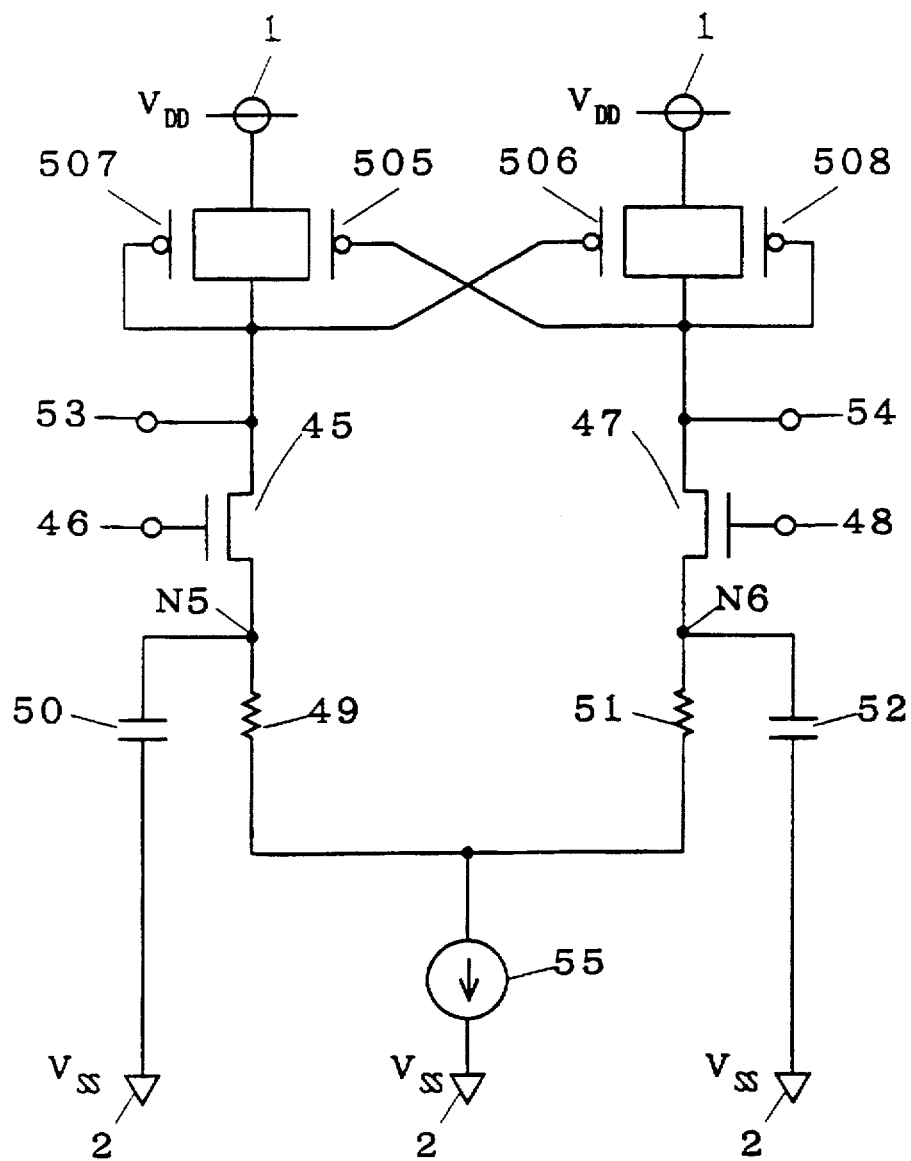
FIG. 31 is a circuit diagram of the differential amplifier circuit according to a third mode of the fourth preferred embodiment of the present invention.

Referring to FIG. 31, the loads 43, 44 shown in FIG. 4 may be replaced with a load including: a PMOS transistor 505 having a source connected to the power supply 1, a drain connected to the output terminal 53, and a gate connected to the output terminal 54; a PMOS transistor 506 having a source connected to the power supply 1, a drain connected to the output terminal 54, and a gate connected to the output terminal 53; a PMOS transistor 507 having a source connected to the power supply 1, a drain connected to the output terminal 53, and a gate connected to the output terminal 53; and a PMOS transistor 508 having a source connected to the power supply 1, a drain connected to the output terminal 54, and a gate connected to the output terminal 54, thereby providing combined effects of the third and fourth preferred embodiments.

Fifth Preferred Embodiment

Figure 6:
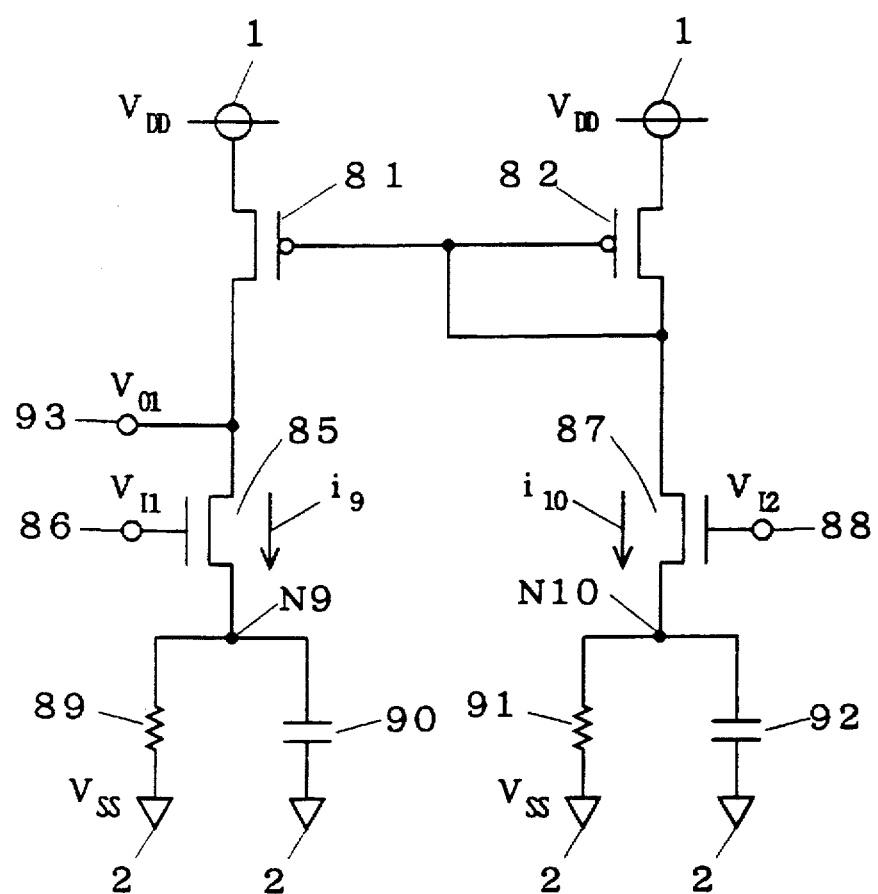
FIG. 6 is a circuit diagram of the differential amplifier circuit according to a fifth preferred embodiment of the present invention.

The differential amplifier circuit according to a fifth preferred embodiment of the present invention will be discussed with reference to FIGS. 6, 7A and 7B. FIG. 6 is a circuit diagram of the differential amplifier circuit according to the fifth preferred embodiment of the present invention. NMOS transistors 85, 87 of the current mirror type differential amplifier circuit have sources connected respectively to resistors 89, 91 and capacitors 90, 92. PMOS transistors 81, 82 form a current mirror load. The PMOS transistor 81 has a source connected to the power supply 1, a gate, and a drain connected to an output terminal 93. The PMOS transistor 82 has a source connected to the power supply 1, a gate connected to the gate of the PMOS transistor 81, and a drain connected to the gate of the PMOS transistor 81.

The NMOS transistor 85 has the source connected to a node N9, a gate connected to an input terminal 86, and a drain connected to the output terminal 93. The NMOS transistor 87 has the source connected to a node N10, a gate connected to an input terminal 88, and a drain connected to the drain of the PMOS transistor 82. The resistor 89 has a first end connected to the node N9 and a second end connected to the power supply 2. The capacitor 90 has a first end connected to the node N9 and a second end connected to the power supply 2. The resistor 91 has a first end connected to the node N10 and a second end connected to the power supply 2. The capacitor 92 has a first end connected to the node N10 and a second end connected to the power supply 2. Input voltages $V_{I1}$ and $V_{I2}$ are provided at the input terminals 86 and 88, respectively. Output voltage $V_{O1}$ is provided at the output terminal 93.

The operation of the differential amplifier circuit of FIG. 6 is described with reference to the waveform charts of FIGS. 7A and 7B. With the small-amplitude differential signals $V_{I1}$ and $V_{I2}$ applied, there is a current flow in the differential amplifier circuit through the NMOS transistors 85 and 87. The currents flowing through the NMOS transistors 85 and 87 are designated as $i_9$ and $i_{10}$ respectively. The resistors 89 and 91 cause the source voltages $V_{N9}$ and $V_{N10}$ of the NMOS transistors to rise by the product of current and resistance, that is, $R \times i_9$ and $R \times i_{10}$, respectively, where R is the resistance of the resistors 89 and 91. For example, when the voltage $V_{I1}$ at the input terminal 86 which is constant at $V_H$ is higher than the voltage $V_{I2}$ at the input terminal 88 which is constant at $V_L$, large current $i_9$ flows in the NMOS transistor 85 and small current $i_{10}$ flows in the NMOS transistor 87. Then the voltage at the node N9 is higher than the voltage at the node N10 as shown in FIG. 7A. Thus the current $I_9$ flowing through the NMOS transistor 85 is higher than the current $I_{10}$ flowing through the NMOS transistor 87. Since the PMOS transistors 81, 82 form the current mirror load, the current extracted from the output terminal 93 through the NMOS transistor 86 is higher than the current fed from the power supply to the output terminal 93 through the PMOS transistor 81, and the output voltage $V_{O1}$ is generally equal to the voltage at the node N9. The source voltage $V_{N9}$ is higher than the voltage $V_{N10}$ by the amount of voltage drop of the resistor 89, and the gate-source voltage of the NMOS transistor 85 is lowered. Thus, the current $i_9$ is lowered in a stable state in which one of the input voltages $V_{I1}$ and $V_{I2}$ holds the high voltage $V_H$ and the other holds the low voltage $V_L$.

Figure 7A:
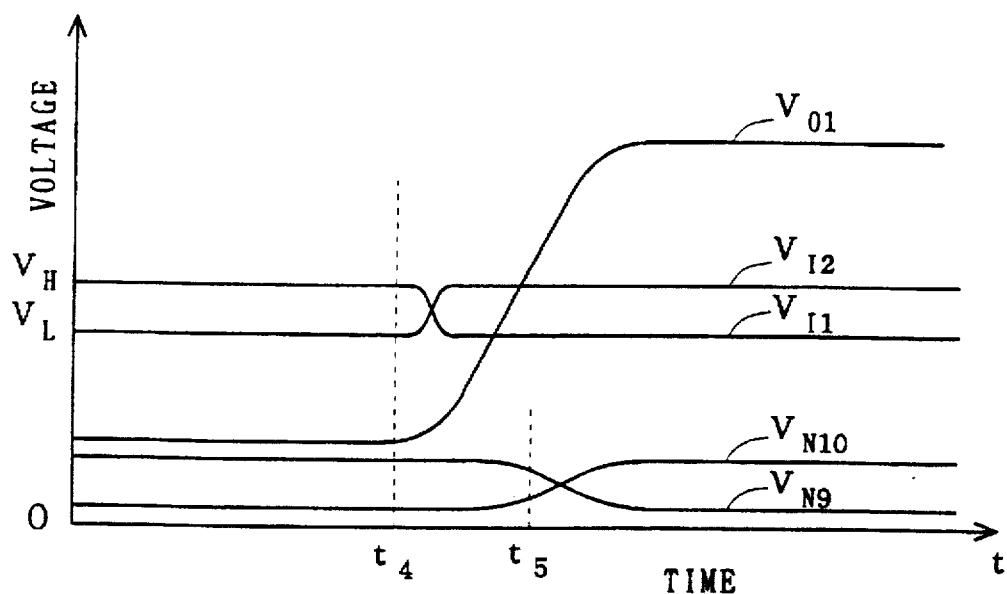
FIGS. 7A and 7B are waveform charts showing the operation of the differential amplifier circuit of FIG. 6.
Figure 7B:
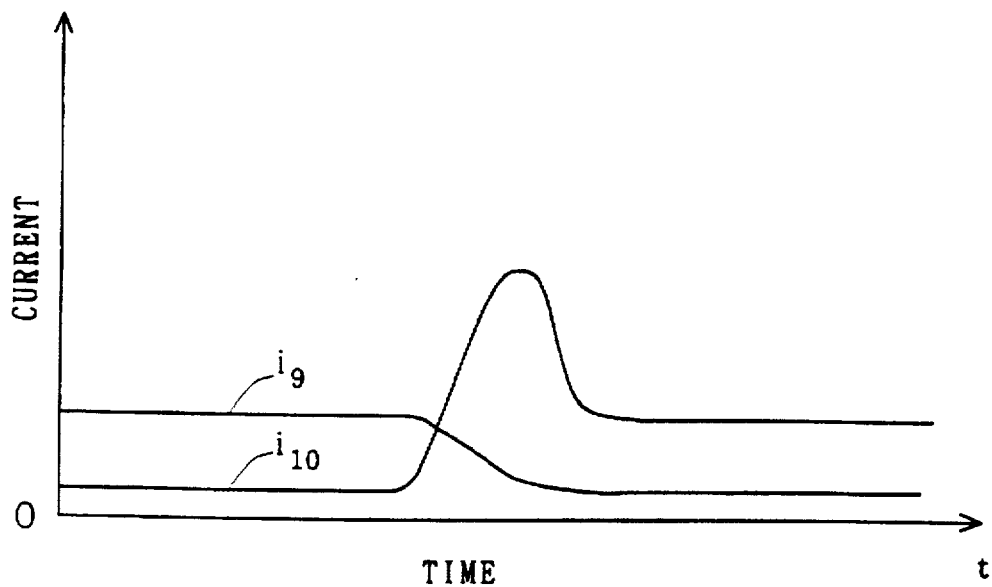

When the magnitudes of the input voltages $V_{I1}$ and $V_{I2}$ are inverted at time $t_4$ of FIG. 7A, the conductance of the NMOS transistor 85 decreases and the current $i_9$ flowing through the NMOS transistor 85 decreases. On the other hand, since the NMOS transistor 87 receives negative charges from the capacitor 92 and is not affected by the resistor 91 at the instant, the voltage at the node N10 does not rise soon. Thus, at the instant of signal transition, the voltage gain increases to allow the device and circuit connected to the output terminal $V_{O1}$ to be driven at high speeds. The current $i_{10}$ has a great peak at the instant of signal transition between times $t_4$ and $t_5$ of FIG. 7A. The voltage at the node N10 gradually rises during a predetermined time interval determined by the capacitor 92 and the resistance 91 and the current $i_{10}$ decreases until they become stable at given values. The input voltage $V_{I2}$ can lower the current in the stable state in which the predetermined voltage $V_H$ is held. In this manner, the capacitor 90 or 92 connected to the node N9 or N10 at a low voltage supplies the charges for high speed operation of the differential amplifier circuit during the transition of the input signals $V_{I1}$ and $V_{I2}$. After an elapse of the predetermined time interval determined by the resistance and capacitor, the source voltages of the NMOS transistors 85, 87 increase by the amount of voltage drop by the resistors 89, 91, and the currents $i_9$ and $i_{10}$ are lowered. This accomplishes a high-speed differential amplifier circuit with a small amount of current consumption.

Figure 32:
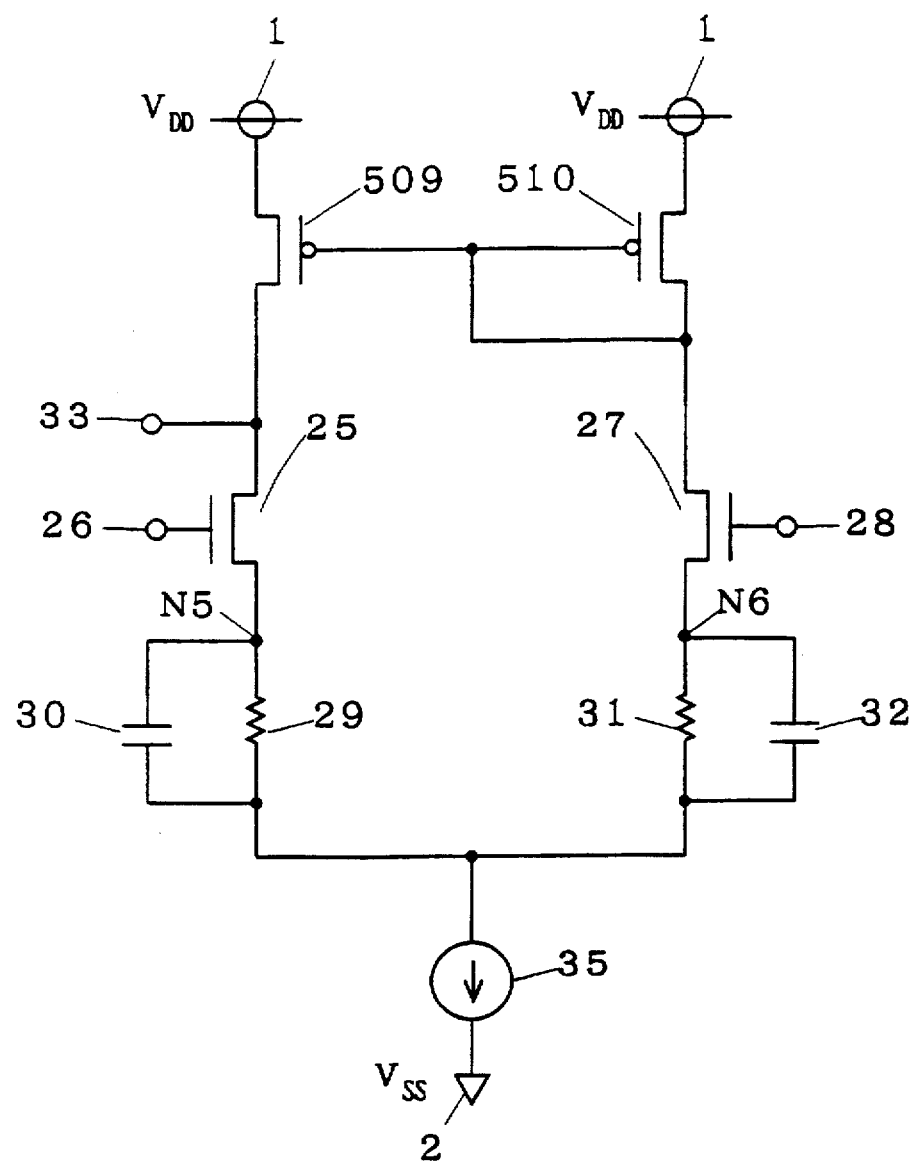
FIG. 32 is a circuit diagram of the differential amplifier circuit according to a second mode of the fifth preferred embodiment of the present invention.

Referring to FIG. 32, the loads 23 and 24 of FIG. 3 may be replaced with a current mirror load including: a PMOS transistor 509 having a source connected to the power supply 1, a drain connected to the output terminal 33, and a gate; and a PMOS transistor 510 having a source connected to the power supply 1, a drain connected to the drain of the NMOS transistor 27, and a gate connected to the gate of the PMOS transistor 509 and drain of the NMOS transistor 27, thereby providing combined effects of the second and fifth preferred embodiments.

Figure 33:
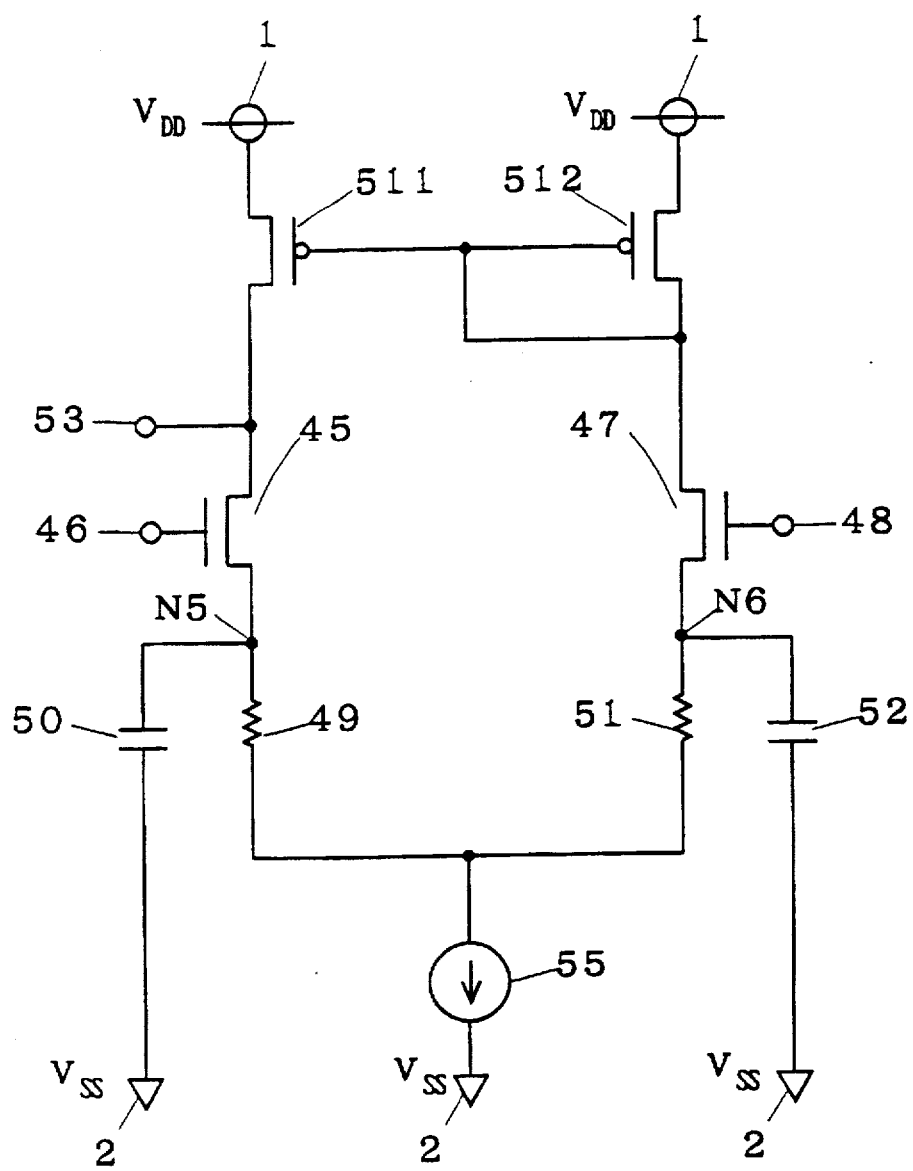
FIG. 33 is a circuit diagram of the differential amplifier circuit according to a third mode of the fifth preferred embodiment of the present invention.

Referring to FIG. 33, the loads 43, 44 of FIG. 4 may be replaced with a current mirror load including: a PMOS transistor 511 having a source connected to the power supply 1, a drain connected to the output terminal 53, and a gate; and a PMOS transistor 512 having a source connected to the power supply 1, a drain connected to the drain of the NMOS transistor 47, and a gate connected to the gate of the PMOS transistor 511 and drain of the NMOS transistor 47, thereby providing combined effects of the third and fifth preferred embodiments.

Sixth Preferred Embodiment

Figure 8:
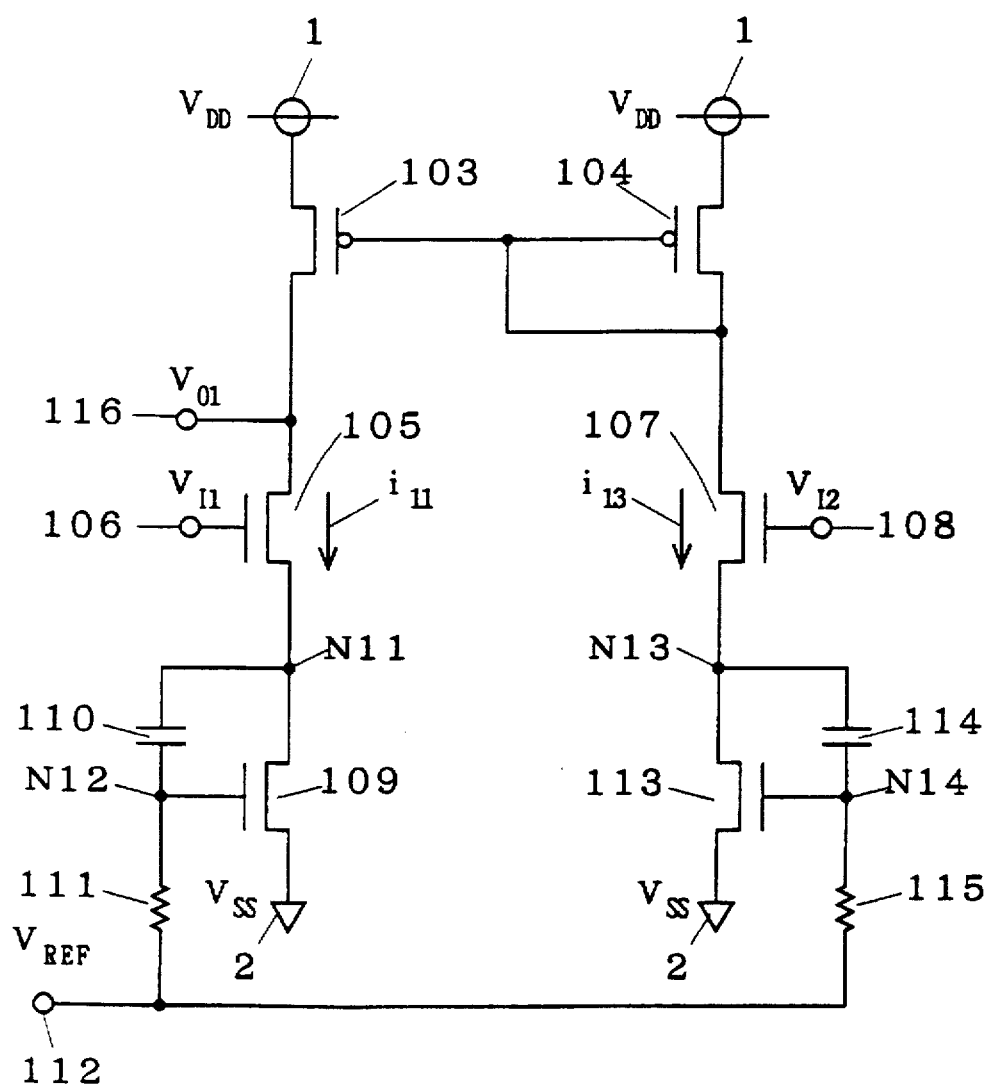
FIG. 8 is a circuit diagram of the differential amplifier circuit according to a sixth preferred embodiment of the present invention.

The differential amplifier circuit according to a sixth preferred embodiment of the present invention will be discussed with reference to FIGS. 8, 9A and 9B. FIG. 8 is a circuit diagram of the differential amplifier circuit according to the sixth preferred embodiment of the present invention. In FIG. 8, the reference numeral 103 designates a PMOS transistor having a source connected to the power supply 1, a drain connected to an output terminal 116, and a gate; 104 designates a PMOS transistor having a source connected to the power supply 1, a gate connected to the gate of the PMOS transistor 103, and a drain connected to the gate of the PMOS transistor 103; 105 designates an NMOS transistor having a drain connected to the drain of the PMOS transistor 103, a gate connected to an input terminal 106, and a source connected to a node N11; 107 designates an NMOS transistor having a drain connected to the drain of the PMOS transistor 104, a gate connected to an input terminal 108, and a source connected to a node N13; 109 designates an NMOS transistor having a drain connected to the node N11, a gate connected to a node N12, and a source connected to the power supply 2; 110 designates a capacitor having a first end connected to the node N11 and a second end connected to the node N12; 111 designates a resistor having a first end connected to the node N12 and a second end connected to a reference voltage terminal 112 providing a reference voltage $V_{REF}$; 113 designates an NMOS transistor having a drain connected to the node N13, a gate connected to a node N14, and a source connected to the power supply 2; 114 designates a capacitor having a first end connected to the node N13 and a second end connected to the node N14; and 115 designates a resistor having a first end connected to the node N14 and a second end connected to the reference voltage terminal 112. Input voltages $V_{I1}$ and $V_{I2}$ are provided at the input terminals 106 and 108, respectively. Output voltage $V_{O1}$ is provided at the output terminal 116.

In the differential amplifier circuit of FIG. 8, the PMOS transistors 103 and 104 form a current mirror. In the differential amplifier circuit including a current mirror load, current flows from the power supply 1 through the PMOS transistor 103 and NMOS transistor 105 or through the PMOS transistor 104 and NMOS transistor 107. The NMOS transistors 109 and 113 are connected in series between the sources of the NMOS transistors 105 and 107 and the power supply 2 respectively to prevent the current from increasing when the input voltages $V_{I1}$ and $V_{I2}$ are fixed and the output voltage $V_{O1}$ is stable. The reference voltage $V_{REF}$ applied to the gates of the NMOS transistors 109, 113 through the resistors 111, 115 are set to an intermediate voltage between the voltage $V_{DD}$ from the power supply 1 and the voltage $V_{SS}$ from the power supply 2. The capacitor 110 is connected between the nodes N11 and N12 and the capacitor 114 is connected between the nodes N13 and N14 to feed back variations in voltage level at the nodes N11 and N13 to the nodes N12 and N14.

The operation of the differential amplifier circuit of FIG. 8 is described with reference to FIGS. 9A and 9B. When the small-amplitude differential signals $V_{I1}$ and $V_{I2}$ are applied at time $t_6$, with $V_{I1} > V_{I2}$ the voltage $V_{DD}$ is fed from the power supply 1 to hold the output terminal 116 at the high level. At time $t_7$, the input voltage $V_{I1}$ becomes higher than the input voltage $V_{I2}$. The increasing input voltage $V_{I1}$ increases a current $i_{11}$ flowing through the NMOS transistor 105, and a voltage $V_{N11}$ at the node N11 starts to rise as shown in FIG. 9A. In response to the voltage increase at the node N11, the capacitor 110 increases the voltage at the node N12 from the reference voltage $V_{REF}$, increasing the conductance of the NMOS transistor 109. The increase in conductance of the NMOS transistor 109 increases the current $i_{11}$ flowing through the NMOS transistor 105 as shown in FIG. 9B, changing the voltage $V_{O1}$ outputted from the output terminal 116 rapidly to the low level. In this manner, currents $i_{11}$ and $i_{13}$ increase and the voltage gain increases during the transition of the input signals $V_{I1}$ and $V_{I2}$.

Figure 9A:
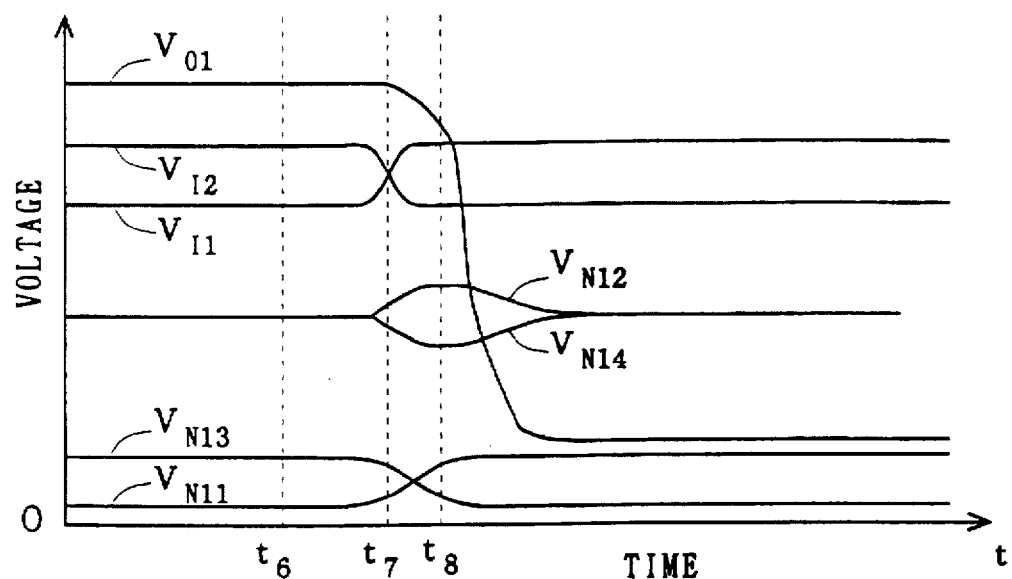
FIGS. 9A and 9B are waveform charts showing the operation of the differential amplifier circuit of FIG. 8.
Figure 9B:
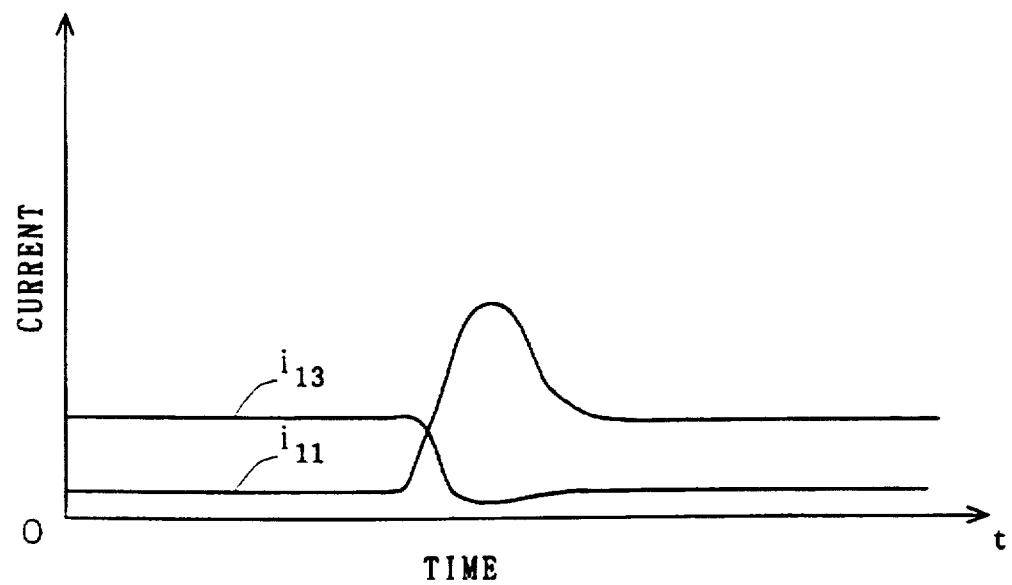

Subsequently, since the reference voltage $V_{REF}$ is applied to the node N12 through the resistor 111, the voltage at the node N12 returns to the reference voltage $V_{REF}$ as shown in FIG. 9A after an elapse of a predetermined time interval determined by the product of the resistance R of the resistor 111 and the capacitance C of the capacitor 110, and the conductance of the NMOS transistor 109 returns to the level equal to the level at time $t_6$. Then the current $i_{13}$ decreases as shown in FIG. 9B.

With the NMOS transistor 107 receiving the input voltage $V_{12}$, on the other hand, when the input voltage $V_{12}$ starts decreasing at time $t_7$, the conductance of the NMOS transistor 107 decreases and the current $i_{13}$ flowing through the NMOS transistor 107 decreases. The decrease in current $i_{13}$ flowing through the NMOS transistor 107 decreases the voltage at the node N13. However, the capacitor 114 decreases the voltage at the node N14 to decrease the conductance of the NMOS transistor 113, thereby suppressing the voltage drop at the node N13. After an elapse of a predetermined time interval determined by the capacitor 114 and the resistor 115, the current $i_{13}$ and the voltage $V_{N13}$ at the node N13 reach steady levels as shown in FIGS. 9A and 9B.

Thus the current consumption is increased to provide high voltage gain only at the instant of transition of the input signals $V_{I1}$ and $V_{I2}$. After the transition, the NMOS transistors 109, 113 decrease the current to reduce current consumption. As above described, the differential amplifier circuit of the sixth preferred embodiment achieves high speed operation and a small amount of current consumption like the first preferred embodiment.

In the sixth preferred embodiment, the circuit including the NMOS transistor 109, capacitor 110, and resistor 111, and the circuit including the NMOS transistor 113, capacitor 114, and resistor 115 are connected to the NMOS transistors 105 and 107 to control the current flowing therethrough, respectively. These circuits may be formed as a common circuit as shown in FIG. 10.

Figure 10:
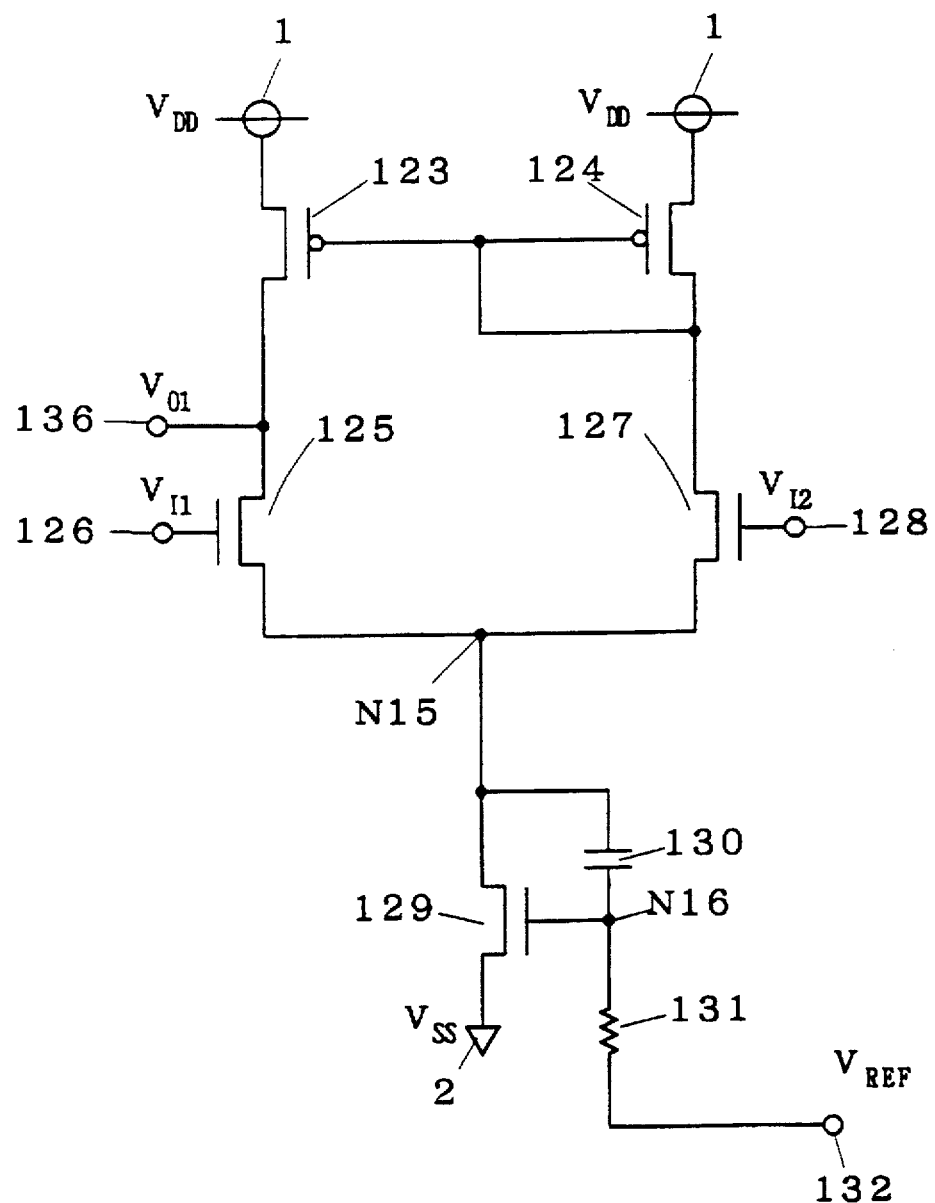
FIG. 10 is a circuit diagram of the differential amplifier circuit according to a second mode of the sixth preferred embodiment of the present invention.

In FIG. 10, the reference numeral 123 designates a PMOS transistor having a source connected to the power supply 1, a drain connected to an output terminal 136, and a gate; 124 designates a PMOS transistor having a source connected to the power supply 1, a gate connected to the gate of the PMOS transistor 123, and a drain connected to the gate of the PMOS transistor 123; 125 designates an NMOS transistor having a drain connected to the drain of the PMOS transistor 123, a gate connected to an input terminal 126, and a source connected to a node N15; 127 designates an NMOS transistor having a drain connected to the drain of the PMOS transistor 124, a gate connected to an input terminal 128, and a source connected to the node N15; 129 designates an NMOS transistor having a drain connected to the node N15, a gate connected to a node N16, and a source connected to the power supply 2; 130 designates a capacitor having a first end connected to the node N15 and a second end connected to the node N16; and 131 designates a resistor having a first end connected to the node N15 and a second end connected to a reference voltage terminal 132 providing the reference voltage $V_{REF}$.

Figure 11:
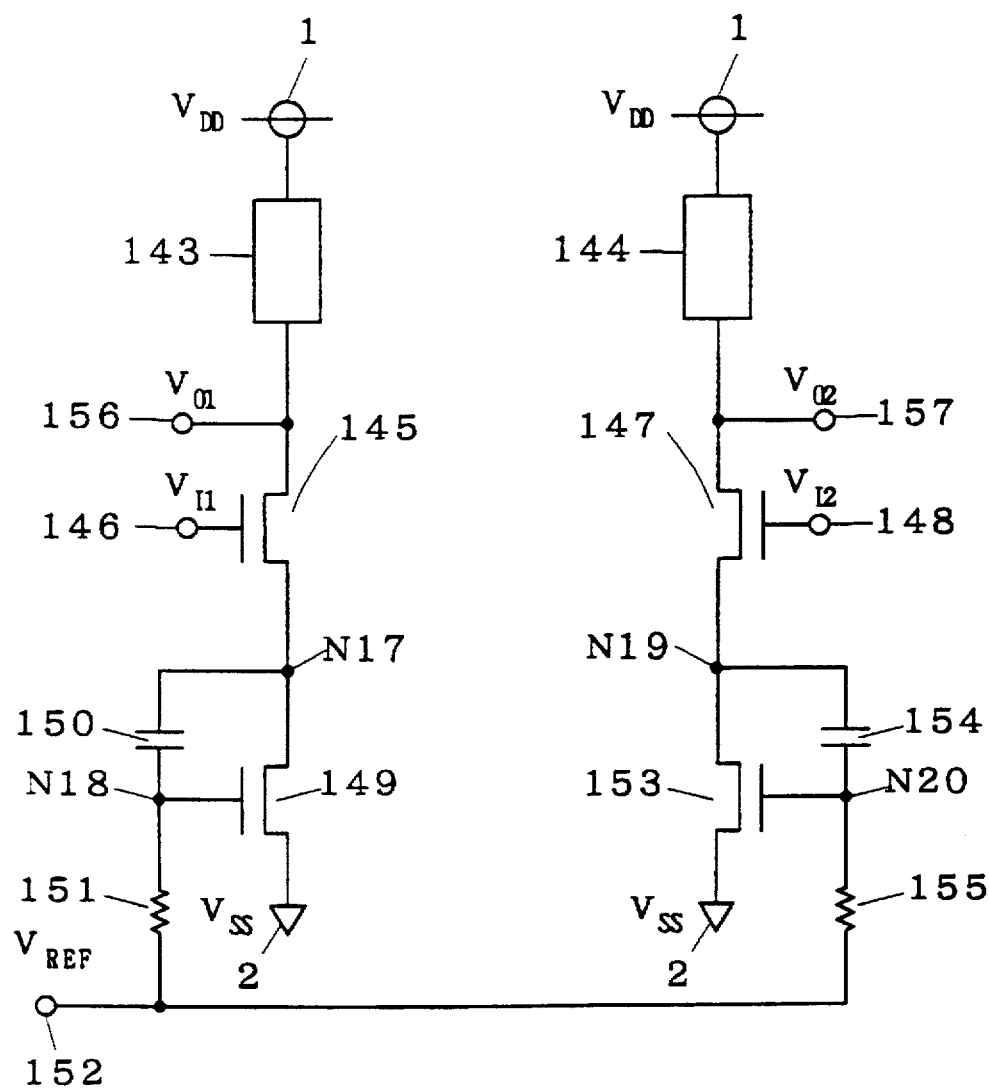
FIG. 11 is a circuit diagram of the differential amplifier circuit according to a third mode of the sixth preferred embodiment of the present invention.

Referring to FIG. 11, the current mirror load of the sixth preferred embodiment may be replaced with the loads as illustrated in the first preferred embodiment, thereby providing similar effects. In FIG. 11, the reference numeral 143 designates a load having a first end connected to the power supply 1 and a second end connected to an output terminal 156; 144 designates a load having a first end connected to the power supply 1 and a second end connected to an output terminal 157; 145 designates an NMOS transistor having a drain connected to the second end of the load 143, a gate connected to an input terminal 146, and a source connected to a node N17; 147 designates an NMOS transistor having a drain connected to the second end of the load 144, a gate connected to an input terminal 148, and a source connected to a node N19; 149 designates an NMOS transistor having a drain connected to the node N17, a gate connected to a node N18, and a source connected to the power supply 2; 150 designates a capacitor having a first end connected to the node N17 and a second end connected to the node N18; 151 designates a resistor having a first end connected to the node N18 and a second end connected to a reference voltage terminal 152 providing the reference voltage $V_{REF}$; 153 designates an NMOS transistor having a drain connected to the node N19, a gate connected to a node N20, and a source connected to the power supply 2; 154 designates a capacitor having a first end connected to the note N19 and a second end connected to the node N20; and 155 designates a resistor having a first end connected to the node N19 and a second end connected to the reference voltage terminal 152.

Figure 12:
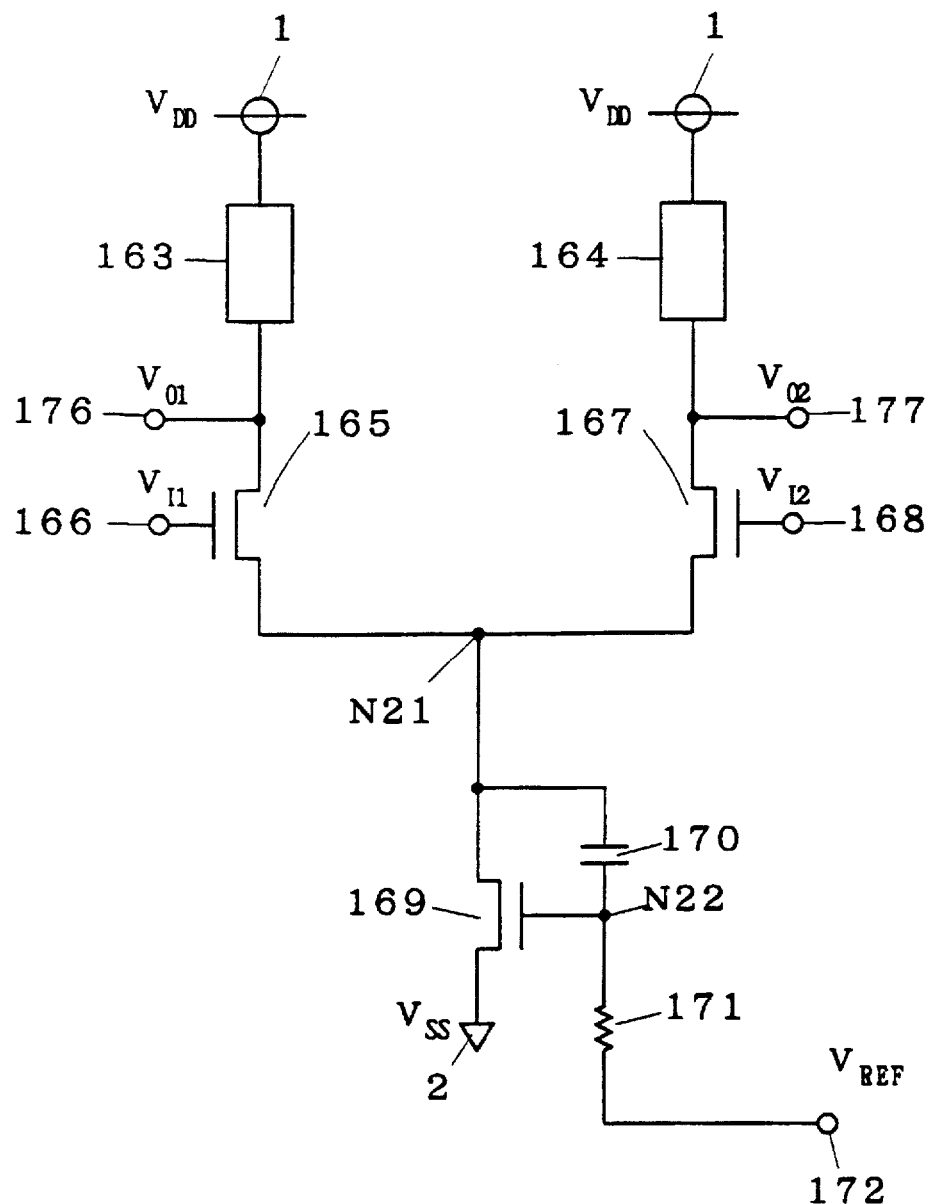
FIG. 12 is a circuit diagram of the differential amplifier circuit according to a fourth mode of the sixth preferred embodiment of the present invention.

FIG. 12 illustrates the differential amplifier circuit including a common regulator circuit into which the circuits for current regulation in the differential amplifier circuit of FIG. 11 are formed. In FIG. 12, the reference numeral 163 designates a load having a first end connected to the power supply 1 and a second end connected to an output terminal 176; 164 designates a load having a first end connected to the power supply 1 and a second end connected to an output terminal 177; 165 designates an NMOS transistor having a drain connected to the second end of the load 163, a gate connected to an input terminal 166, and a source connected to a node N21; 167 designates an NMOS transistor having a drain connected to the second end of the load 164, a gate connected to an input terminal 168, and a source connected to the node N21; 169 designates an NMOS transistor having a drain connected to the node N21, a gate connected to a node N22, and a source connected to the power supply 2; 170 designates a capacitor having a first end connected to the node N21 and a second end connected to the node N22; and 171 designates a resistor having a first end connected to the node N22 and a second end connected to a reference voltage terminal 172 providing the reference voltage $V_{REF}$.

Figure 34:
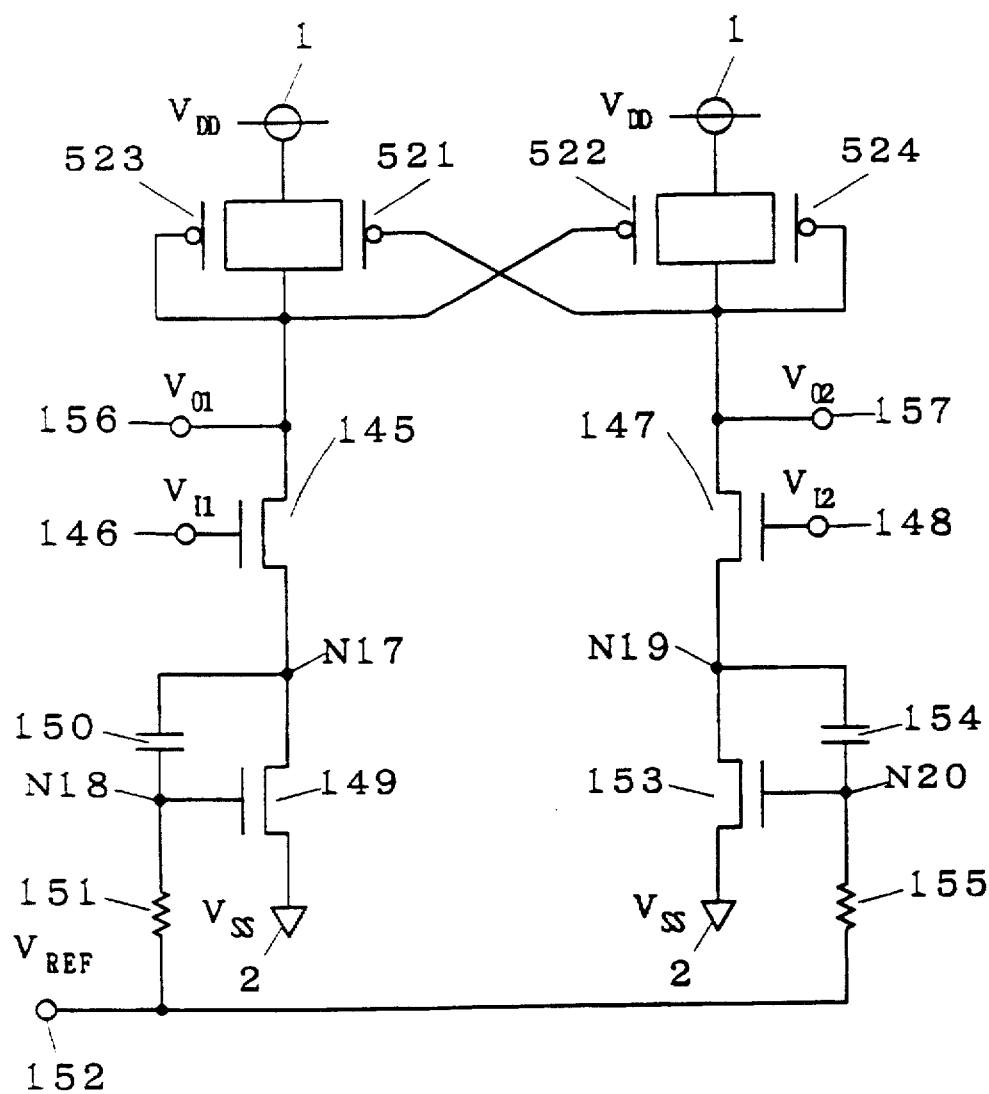
FIG. 34 is a circuit diagram of the differential amplifier circuit according to a fifth mode of the sixth preferred embodiment of the present invention.

Referring to FIG. 34, the loads 143, 144 of FIG. 11 may be replaced with a load including: a PMOS transistor 521 having a source connected to the power supply 1, a drain connected to the output terminal 156, and a gate connected to the output terminal 157; a PMOS transistor 522 having a source connected to the power supply 1, a drain connected to the output terminal 157, and a gate connected to the output terminal 156; a PMOS transistor 523 having a source connected to the power supply 1, a drain connected to the output terminal 156, and a gate connected to the output terminal 156; and a PMOS transistor 524 having a source connected to the power supply 1, a drain connected to the output terminal 157, and a gate connected to the output terminal 157, thereby providing effects similar to those of the sixth preferred embodiment.

Figure 35:
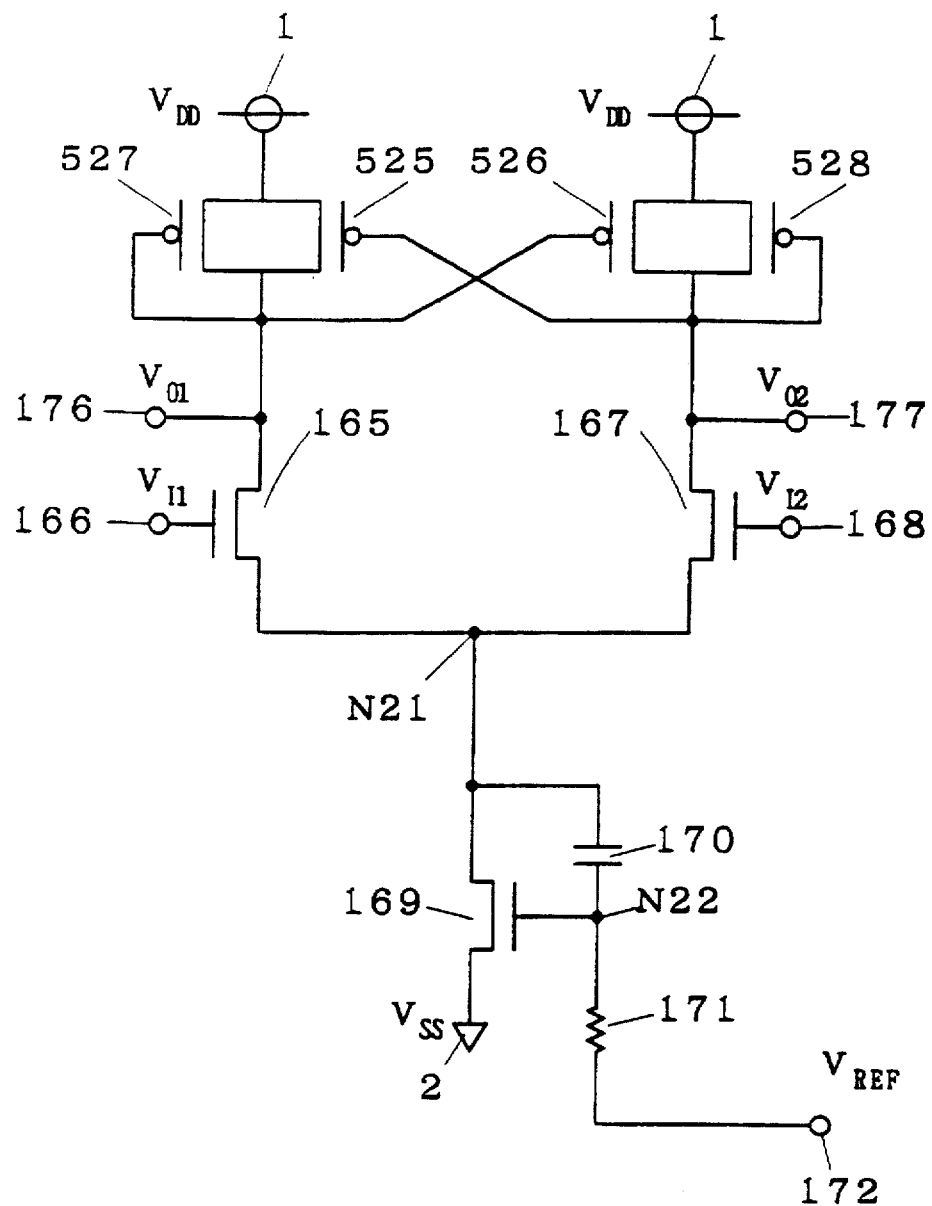
FIG. 35 is a circuit diagram of the differential amplifier circuit according to a sixth mode of the sixth preferred embodiment of the present invention.

Referring to FIG. 35, the loads 163, 164 of FIG. 12 may be replaced with a load including: a PMOS transistor 525 having a source connected to the power supply 1, a drain connected to the output terminal 176, and a gate connected to the output terminal 177; a PMOS transistor 526 having a source connected to the power supply 1, a drain connected to the output terminal 177, and a gate connected to the output terminal 176; a PMOS transistor 527 having a source connected to the power supply 1, a drain connected to the output terminal 176, and a gate connected to the output terminal 176; and a PMOS transistor 528 having a source connected to the power supply 1, a drain connected to the output terminal 177, and a gate connected to the output terminal 177, thereby providing effects similar to those of the sixth preferred embodiment.

Seventh Preferred Embodiment

Figure 13A:
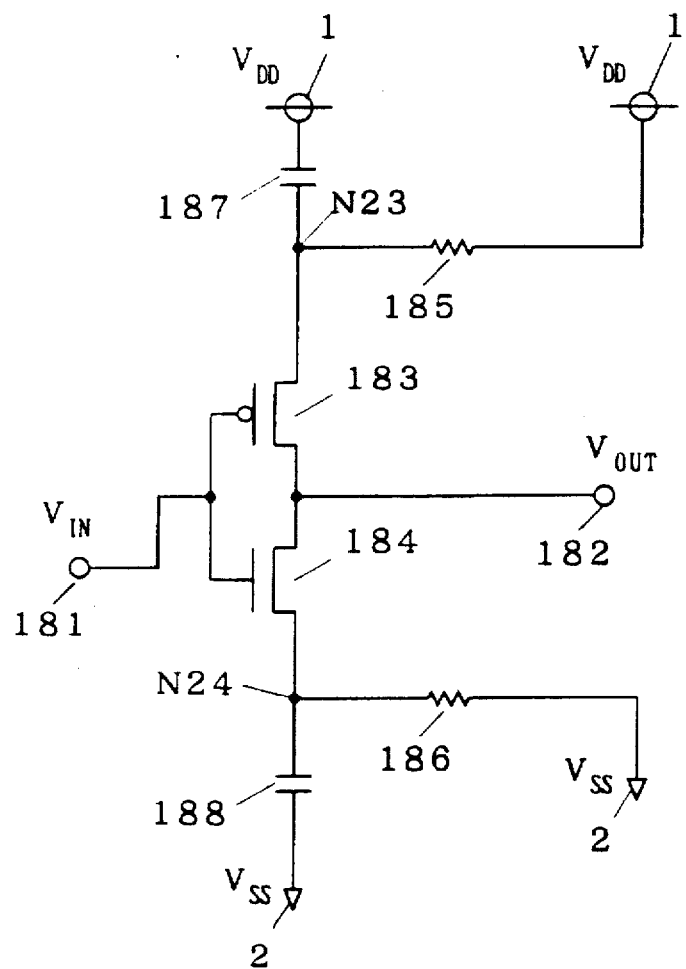
FIG. 13A is a circuit diagram of a CMOS inverter according to a seventh preferred embodiment of the present invention.

A CMOS inverter according to a seventh preferred embodiment of the present invention will now be described with reference to FIGS. 13A and 13B. FIG. 13A is a circuit diagram of the CMOS inverter according to the seventh preferred embodiment of the present invention. In FIG. 13A, the reference numeral 183 designates a PMOS transistor having a gate connected to an input terminal 181, a drain connected to an output terminal 182, and a source connected to a node N23; 184 designates an NMOS transistor having a gate connected to the input terminal 181, a drain connected to the output terminal 182, and a source connected to a node N24; 185 designates a resistor in an interconnection line for providing the voltage $V_{DD}$ to the node N23 from the power supply 1; 186 designates a resistor in an interconnection line for providing the voltage $V_{SS}$ to the node N24 from the power supple 2; 187 designates a capacitor adjacent the source of the PMOS transistor 183; and 188 designates a capacitor adjacent the source of the NMOS transistor 184.

In general, voltage is applied to an inverter in the semiconductor integrated circuit from a power supply through interconnection lines. As the interconnection lines are spaced more closely with increased degree of integration in the semiconductor integrated circuit, the resistance of the interconnection lines increases, causing a low driving capability of the inverter in the initial stage of inverter output changes. To improve the driving capability of the inverter in the initial stage of the output transition, the CMOS inverter of the seventh preferred embodiment is designed so that the capacitors are located adjacent the sources of the PMOS and NMOS transistors forming the CMOS inverter. FIG. 13B is a cross-sectional view of the capacitor 187 adjacent the PMOS transistor 183 in the semiconductor integrated circuit.

Figure 13B:
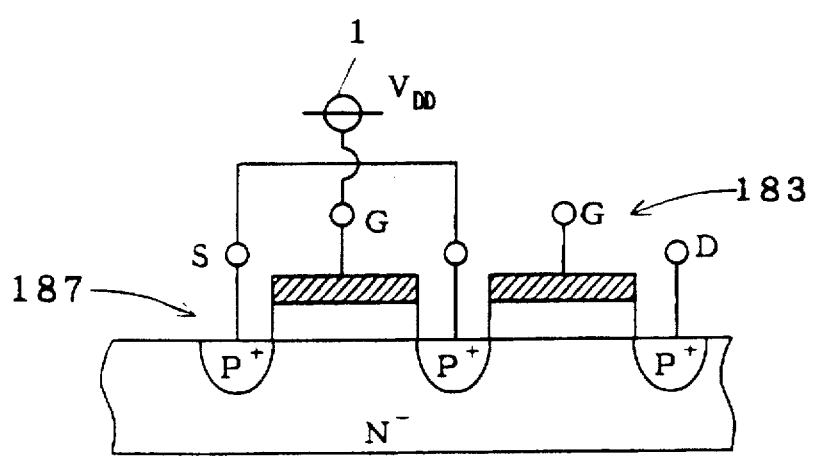
FIG. 13B is a cross-sectional view of the CMOS inverter of FIG. 13A.
Figure 14A:
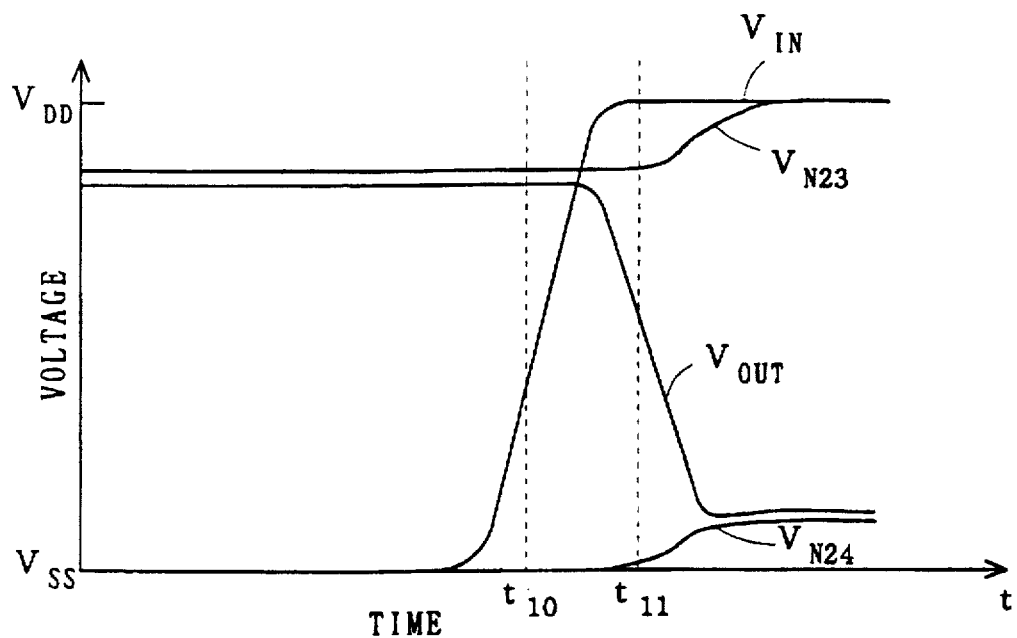
FIGS. 14A and 14B are waveform charts showing the operation of the CMOS inverter of FIGS. 13A and 13B.
Figure 14B:
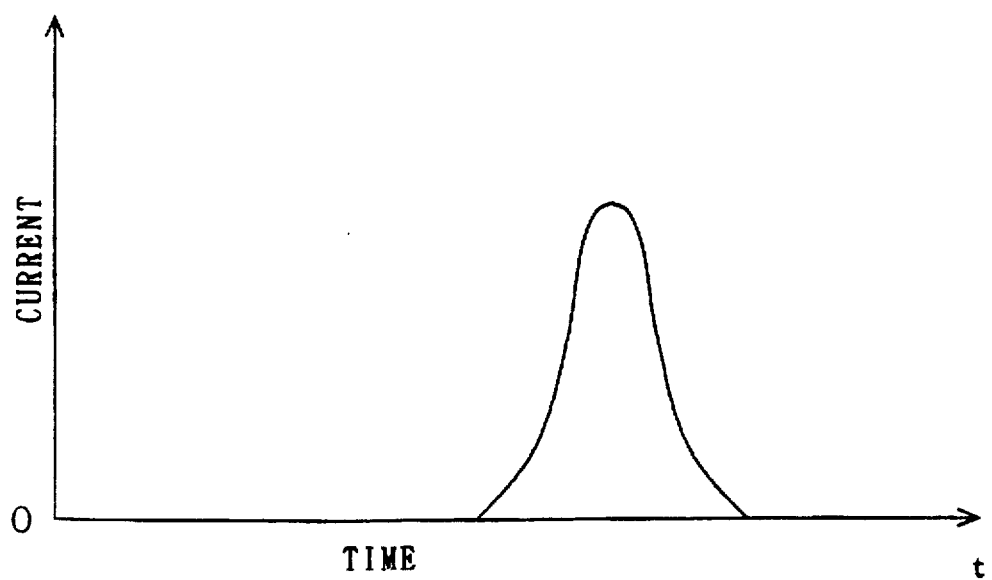

FIGS. 14A and 14B are waveform charts showing the operation of the inverter shown in FIGS. 13A and 13B. Before time $t_{10}$ of FIG. 14A, the inverter provides a high level output, and the voltage $V_{DD}$ is applied to the output terminal 182 through the resistor 185 and PMOS transistor 183. The presence of the resistor 185 decreases the voltage at the node N23. Then in the initial stage of the inverter output change to the low level (from time $t_{10}$ to time $t_{11}$), the node N24 receives voltage from the capacitor 188 and can hold a voltage lower than the voltage given by the voltage drop of the resistor 186 prior to the completion of the capacitor discharge. After the completion of the discharge of the capacitor 188, the voltage $V_{N24}$ at the node 24 is affected by the voltage drop of the resistor 186 to rise. In the initial stage of the transition of the CMOS inverter output, the low source voltage of the NMOS transistor 184 allows the charges to be extracted rapidly through the output terminal 182, shortening the time required for an output voltage $V_{out}$ at the output terminal 182 to change to the low level. Likewise, during the low to high transition, charges are fed through the capacitor 187. This achieves high speed operation of the CMOS inverter.

Eighth Preferred Embodiment

A demodulator circuit for pulse-width modulation and a sampling circuit for use in the semiconductor integrated circuit according to an eighth preferred embodiment of the present invention will now be described with reference to FIGS. 15 to 26. The demodulator circuit according to the eighth preferred embodiment is used in pulse-width modulation for data transfer between functional blocks in the semiconductor integrated circuit to reduce the number of signal lines. As an example, data transfer between a memory cell array and an ALU is discussed herein.

Figure 15:
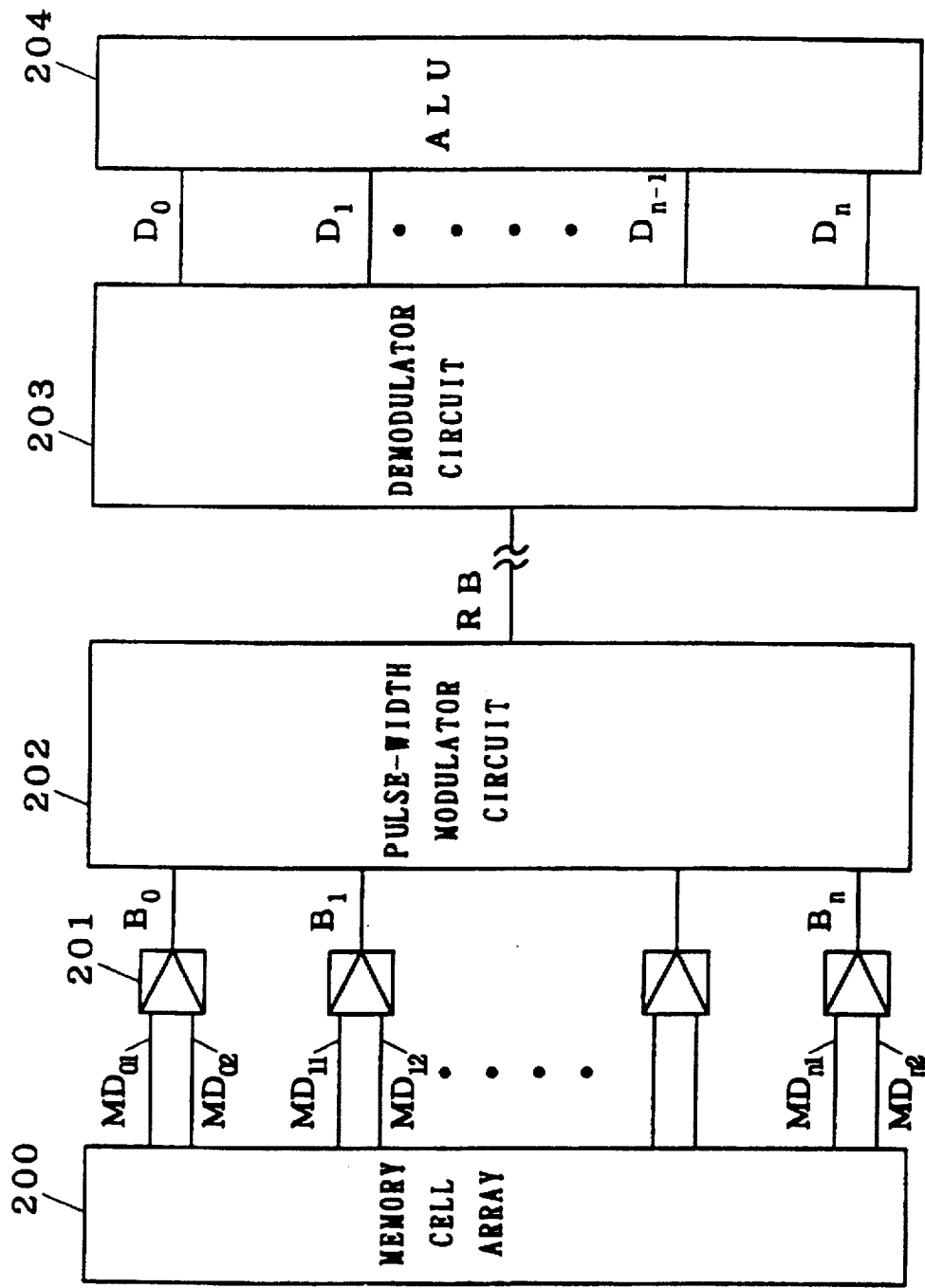
FIG. 15 is a block diagram for illustrating pulse-width modulation data transfer according to an eighth preferred embodiment of the present invention.

FIG. 15 is a block diagram showing the relation between the memory cell array and ALU for data transfer in the pulse-width modulation. In FIG. 15, the reference numeral 200 designates a memory cell array; 201 designates pre-amplifier circuits for differentially amplifying the signals on pairs of input/output lines $MD_{01}$ to $MD_{n2}$ which transfer the stored information read from the memory cell array 200 to output the amplified signals; 202 designates a pulse-width modulator circuit receiving outputs $B_0$ to $B_n$ from the plurality of pre-amplifier circuits 201 for modulating the pulse width of the outputs $B_0$ to $B_n$ to output a signal RB; 203 designates a demodulator circuit receiving the signal RB from the pulse-width modulator circuit 202 to demodulate the signal RB into n-bit data $D_0$ to $D_n$; and 204 designates an ALU for performing computation on the data $D_0$ to $D_n$ outputted from the demodulator circuit 203.

The n-bit data read from the memory cell array 200 through the pairs of input/output lines $MD_{01}$ to $MD_{n2}$ are transferred to the ALU through the single data bus. The n-bit small-amplitude differential data read through the pairs of input/output lines $MD_{01}$ to $MD_{n2}$ are amplified by the n pre-amplifier circuits 201, and the pulse widths of the amplified data are modulated into 2n widths by the pulse-width modulator circuit 202 in accordance with the states of the n-bit data $B_0$ to $B_n$. The demodulator circuit 203 demodulates the width-modulated pulses into n-bit data, and the demodulated output data $D_0$ to $D_n$ are applied to the ALU 204. Such pulse-width modulation permits the transfer of n-bit data at a time through the single data bus within the semiconductor integrated circuit. The demodulator circuit according to the seventh preferred embodiment of the present invention can perform demodulation by using only the width-modulated pulses to achieve the pulse-width modulation, which is generally used in the field of data communications, in the semiconductor integrated circuit device.

Figure 16:
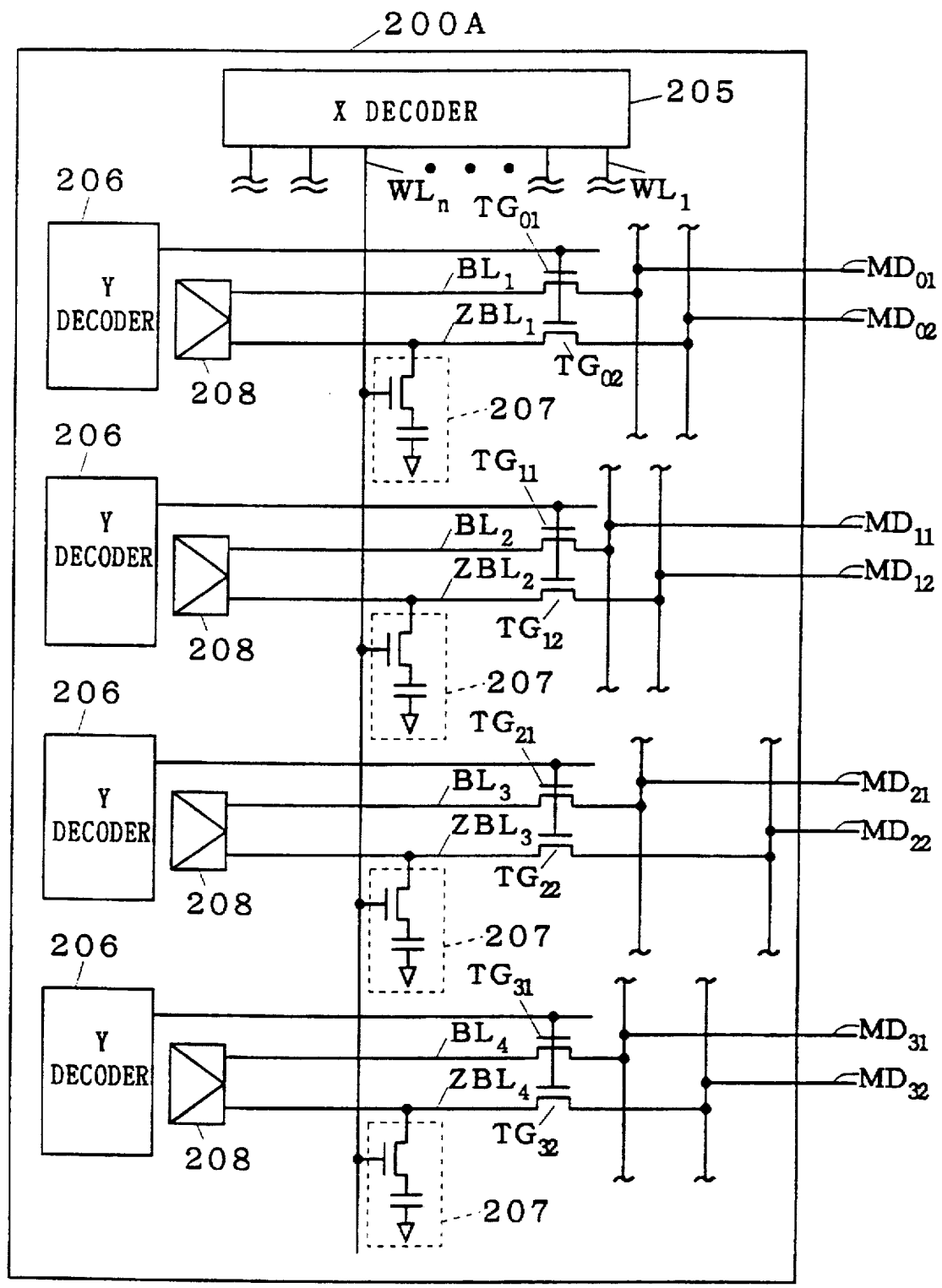
FIG. 16 is a schematic block diagram of a memory cell array.

The respective blocks shown in FIG. 15 are described below. For the purpose of simplification, the number of data is limited to 4 bits in the description of the blocks. FIG. 16 is a block diagram of a memory cell array which can read and write 4-bit data. In FIG. 16, the reference character 200A designates a memory cell array which can read and write 4-bit data; 205 designates an X decoder for decoding a row address in order to activate one of word lines $WL_1$ to $WL_n$ for respective rows; 206 designates Y decoders for bringing a predetermined one of pairs of transfer gates $TG_{01}$ to $TG_{32}$ into conduction to activate one of pairs of bit lines $BL_1$, $ZBL_1$ to $BL_4$, $ZBL_4$ for respective columns and for decoding a column address to output data to the exterior of the memory cell array 200A; 207 designates memory cells for storing 1-bit information therein; and 208 designates sense amplifiers connected to the pairs of bit lines $BL_1$, $ZBL_1$ to $BL_4$, $ZBL_4$ for reading the information stored in the memory cells 207 by amplifying the voltage between the pairs of bit lines. In this manner, signals in the pair signal lines $MD_{01}$ and $MD_{02}$ amplified by the sense amplifiers 208 make a pair.

Figure 25:
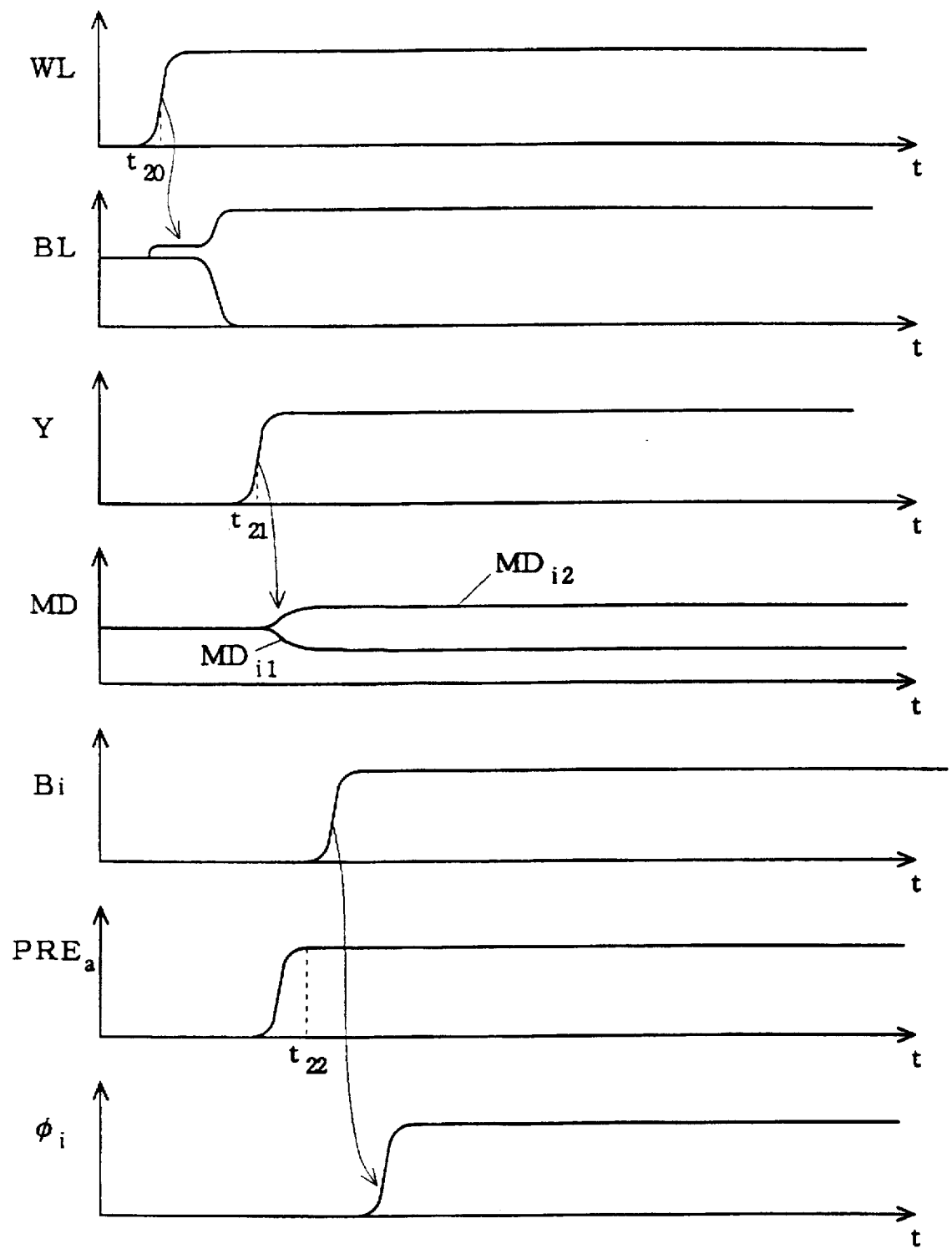
FIGS. 25 and 26 are waveform charts showing data transfer operation between a memory cell array and an ALU.

Referring to FIG. 25, the X decoder 205 in the memory cell array 200A activates a word line WL at time $t_{20}$. The sense amplifiers 208 read data from the memory cells 207 to the bit lines BL, ZBL. Then the Y decoders 206 bring a required one of the transfer gates $TG_{01}$ to $TG_{32}$ into conduction to output data to one of the pairs of input/output lines $MD_{01}$ to $MD_{32}$. The data outputted to the one pair of input/output lines are amplified by the corresponding pre-amplifier circuit 201, and a signal $B_i$ is outputted to the pulse-width modulator circuit 202.

Figure 17:
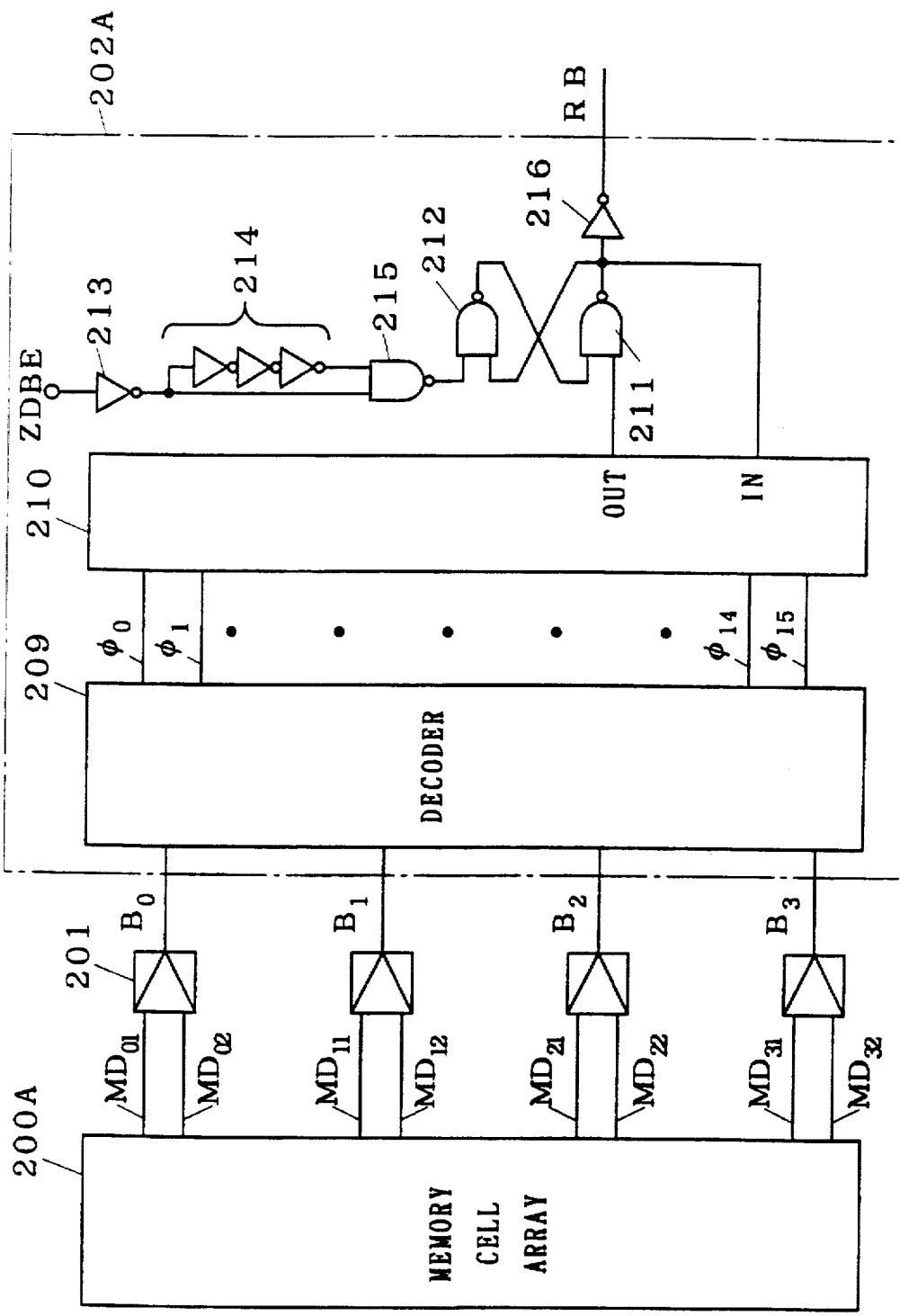
FIG. 17 is a block diagram of a pulse-width modulator circuit.

FIG. 17 is a block diagram of an example of the pulse-width modulator circuit. In FIG. 17, the reference numeral 209 designates a decoder receiving the data $B_0$ to $B_3$ from the pre-amplifier circuits 201 to drive one of signal lines $\phi_0$ to $\phi_{15}$ low; 210 designates a delay-time-variable delay circuit connected to the signal lines $\phi_0$ to $\phi_{15}$ for selectively adding 16 different delay times to a signal provided at its input terminal IN depending upon which one of the signal lines $\phi_0$ to $\phi_{15}$ is low, to output the delayed signal at its output terminal OUT; 211 designates a 2-input NAND gate for performing NAND operation on its first input connected to the output terminal OUT of the delay circuit 210 and its second input; 212 designates an NAND gate having a first input connected to the output of the NAND gate 211 for performing NAND operation on its first and second inputs to provide an output to the second input of the NAND gate 211; 213 designates an inverter receiving a signal ZDBE indicative of the output timing of the pulse signal to output the inverted logic; 214 designates a delay circuit including an odd number of inverters connected in series for adding a predetermined delay time to the output of the inverter 213 to output the inverted logic of the output of the inverter 213; 215 designates an NAND gate for performing NAND operation on the output of the delay circuit 214 and the output of the inverter 213 to provide an output to the second input of the NAND gate 212; and 216 designates an inverter for outputting the inverted logic of the output of the NAND gate 211 as the signal RB of a pulse-width modulator circuit 202A.

Figure 26:
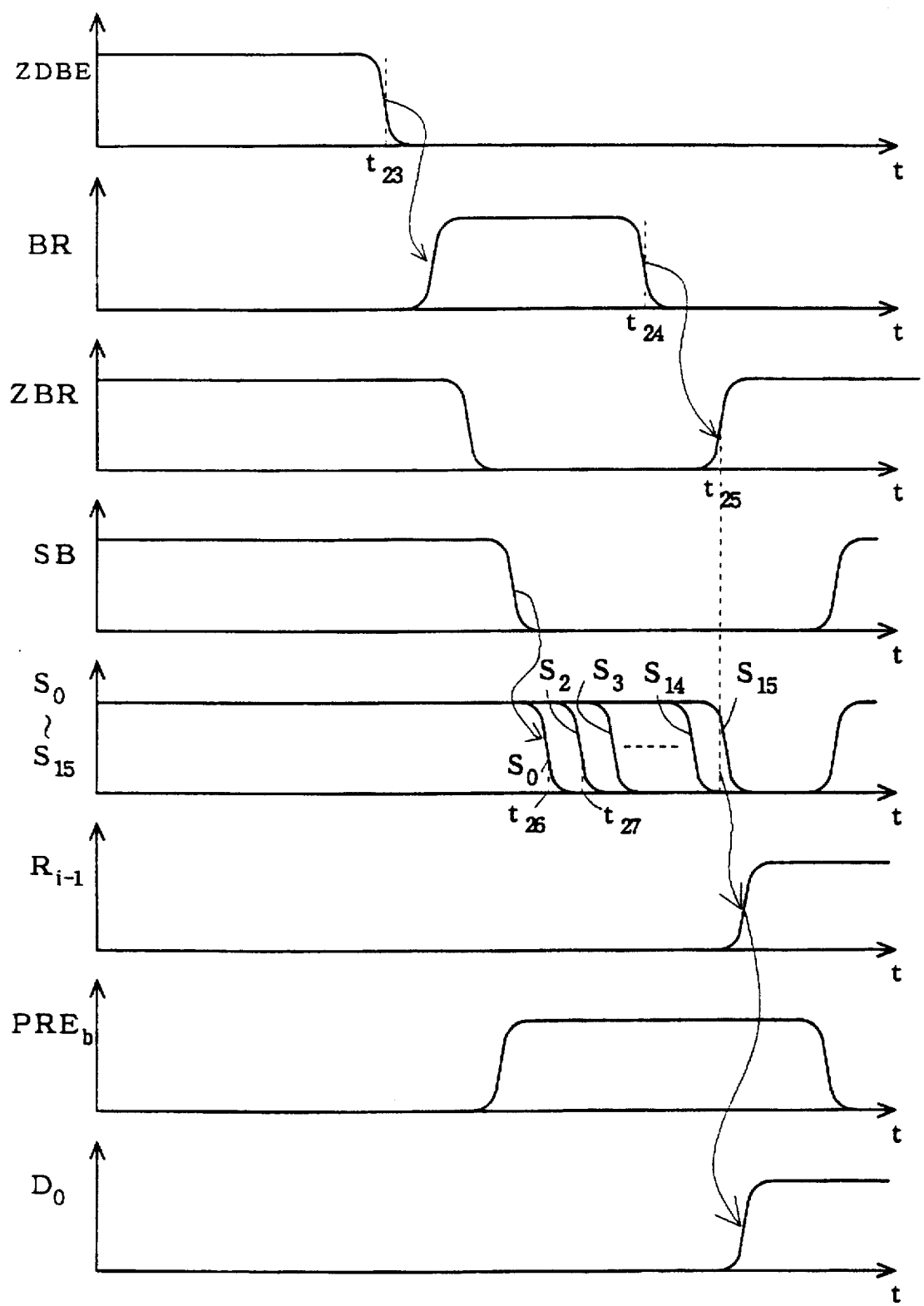

The NAND gates 211 and 212 form a flip-flop circuit whose output is the output from the NAND gate 211. Referring to FIG. 26, the signal ZDBE goes low at time $t_{23}$, and then the NAND gate 215 outputs a one-shot trigger signal. The first input of the NAND gate 212 goes high to reset the flip-flop circuit which in turn provides the low level output. After the reset, the first input of the NAND gate 212 is returned to the high level. After the first input of the NAND gate 212 is reset to the low level, the delay circuit 210 receives, at its input terminal IN, the high-to-low transition of the output of the flip-flop circuit to change the level at its output terminal OUT from high to low after the predetermined delay time determined by the signal lines $\phi_0$ to $\phi_{15}$. This changes the output of the flip-flop circuit from the low level again to the high level. The time interval over which the flip-flop circuit provides the low level output, that is, the pulse width, indicates the data value. The pulse width is the time interval between the rising edge of a pulse of the signal RB after the time $t_{23}$ and the falling edge of a pulse thereof at time $t_{24}$ shown in FIG. 26.

Figure 18:
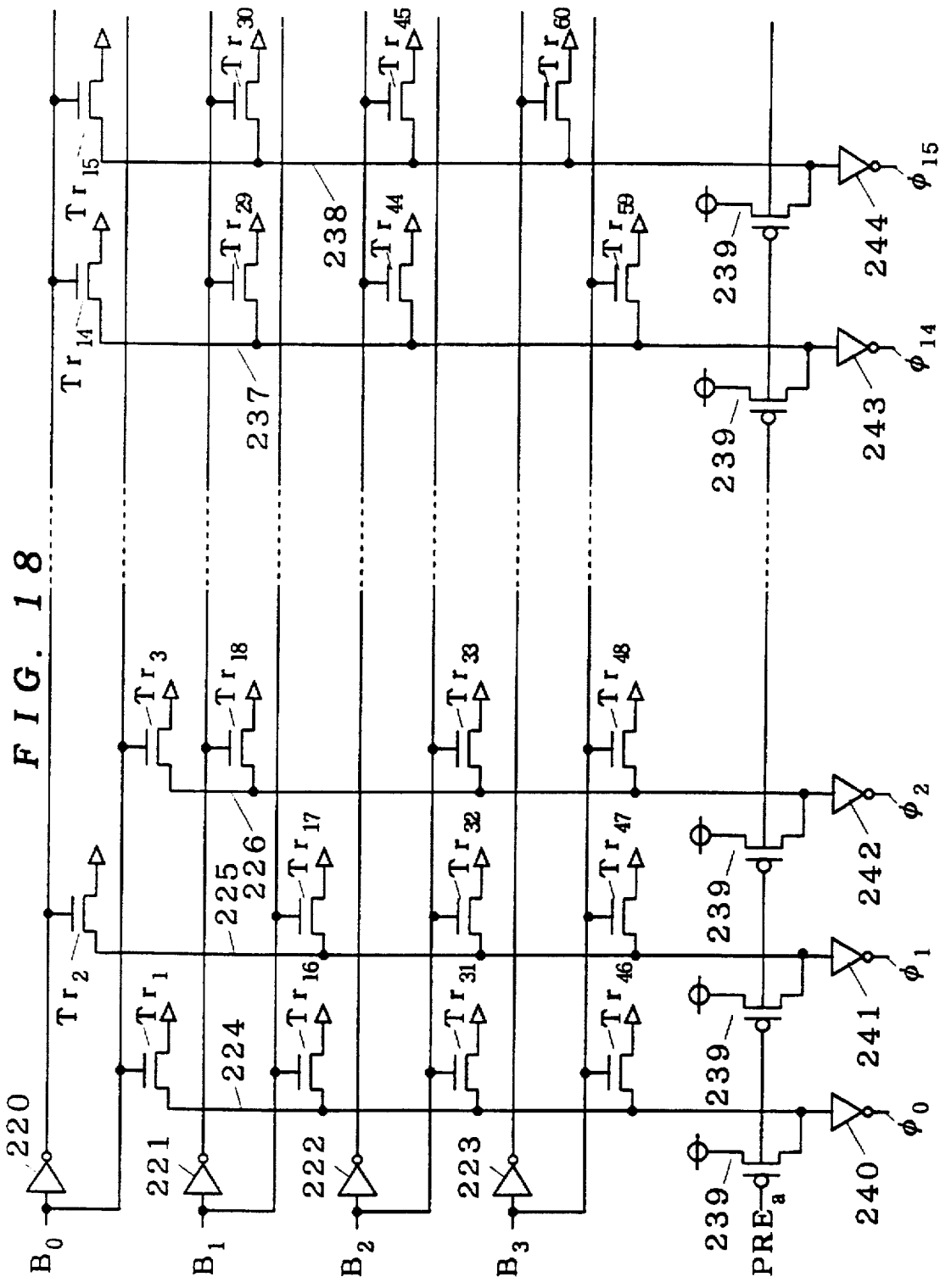
FIG. 18 is a circuit diagram of a decoder in the pulse-width modulator circuit.

The structure of the decoder 209 is discussed below with reference to FIG. 18. In FIG. 18, the reference numerals 220 to 223 designate inverters for outputting the inverted logics of the received data $B_0$ to $B_3$; 224 to 238 designate signal lines; 239 designates PMOS transistors each having a gate receiving a precharge signal $PRE_a$, a drain connected to one of the signal lines 224 to 238, and a source connected to a power supply for precharging the signal lines 224 to 238; $Tr_1$ to $Tr_{60}$ designate NMOS transistors each having a gate receiving one of the data $B_0$ to $B_3$ or its inverted logic, a source connected to a power supply providing a ground voltage, and a drain connected to one of the signal lines 224 to 238; and 240 to 244 designate inverters having input terminals connected to the signal lines 224, 225, 226, 237, 238 and output terminals connected to the signal lines $\phi_0$ to $\phi_2$, $\phi_{14}$, $\phi_{15}$. Although not shown, the decoder 209 further includes inverters connected to the signal lines 227 to 236.

For example, the signal line 224 is connected to the drains of the transistors $Tr_1$, $Tr_{16}$, $Tr_{31}$, $Tr_{46}$ whose gates receive the data $B_0$ to $B_3$, respectively. With all of these data at the low level, the signal line 224 is high and the inverter 240 provides the low level output to the signal line $\phi_0$ after the decoder 209 receives the output $B_i$ from the pre-amplifier circuits 201 as shown in FIG. 25.

The signal line 225 is connected to the transistor $Tr_2$ receiving the inverted logic of the data $B_0$ at its gate and to the transistors $Tr_{17}$, $Tr_{32}$, $Tr_{47}$ receiving the data $B_1$ to $B_3$ at their gates. Thus, the low level signal is outputted to the signal line $\phi_1$ when the data $B_0$ is high and the data $B_1$ to $B_3$ are low. In this manner, the data $B_0$ to $B_3$ may be decoded by the combination of gate connections of the transistors $Tr_1$ to $Tr_{60}$.

Figure 19:
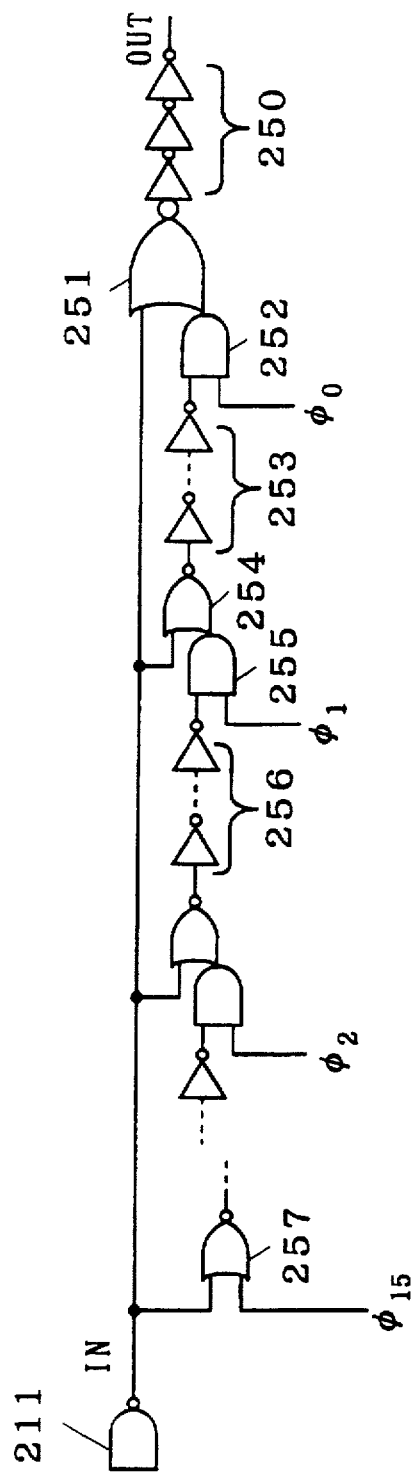
FIG. 19 is a logic diagram of a delay circuit in the pulse-width modulator circuit.

Referring to FIG. 19, the structure of the delay circuit 210 will be described below. In FIG. 19, the reference numeral 250 designates an inverter group comprised of an odd number of inverters connected in series, the last inverter in the group being connected at its output to the output terminal OUT; 251 designates an NOR gate having an output connected to the input terminal of the first inverter of the group 250, a first input connected to the input terminal IN, and a second input; 252 designates an AND gate having an output connected to the second input of the NOR gate 251, a first input connected to the signal line $\phi_0$, and a second input; 253 designates an inverter group comprised of an odd number of inverters connected in series, the last inverter in the group being connected at its output to the second input of the AND gate 252; 254 designates an NOR gate having an output connected to the input of the first inverter of the group 253, a first input connected to the input terminal IN, and a second input; 255 designates an AND gate having an output connected to the second input of the NOR gate 254, a first input connected to the signal line $\phi_1$, and a second input; and 256 designates an inverter group comprised of an odd number of inverters connected in series, the last inverter in the group being connected at its output to the second input of the AND gate 255. The same arrangement as the AND gate 255 connected to the signal line $\phi_1$, the NOR gate 254, and the inverter group 253 is repeatedly provided for the signal lines $\phi_2$ to $\phi_{14}$, and the last signal line $\phi_{15}$ is connected directly to a second input of an NOR gate 257 having a first input connected to the input terminal IN.

When the input terminal IN goes low, the first inputs of the NOR gates 251, 254, 257 and the like change from high to low. With the second input at the low level, the NOR gates 251, 254, 257 and the like outputs a high level signal until the second inputs thereof go high.

Since one of the signal lines $\phi_0$ to $\phi_{15}$ is low, either one of the AND gates 252, 255 and the like connected to the signal lines $\phi_0$ to $\phi_{14}$ at the low level or the signal line $\phi_{15}$ is low. The delay time for the low level output becomes longer in accordance with the number of gates connected between the output terminal OUT and the signal line at the low level. For example, it is assumed that the signal line $\phi_1$ is low. The AND gate 255 connected at its first input to the signal line $\phi_1$ provides the low level output independently of the value of the second input. The low output of the AND gate 255 forces the first and second inputs of the NOR gate 254 low, changing the output of the NOR gate 254 to the high level. The output from the NOR gate 254 is delayed by the inverter group 253 and then applied to the second input of the AND gate 252. Since the signal line $\phi_0$ connected to the first input of the AND gate 252 is high, the output of the AND gate 252 changes to the low level in response to the high-to-low transition at the second input. Because of this change in output of the AND gate 252, the first and second inputs of the NOR gate 251 are both low and the NOR gate 251 provides the high level output. The high level output from the NOR gate 251 is delayed and inverted by the inverter group 250, and the output terminal OUT provides the low level output.

Figure 20:
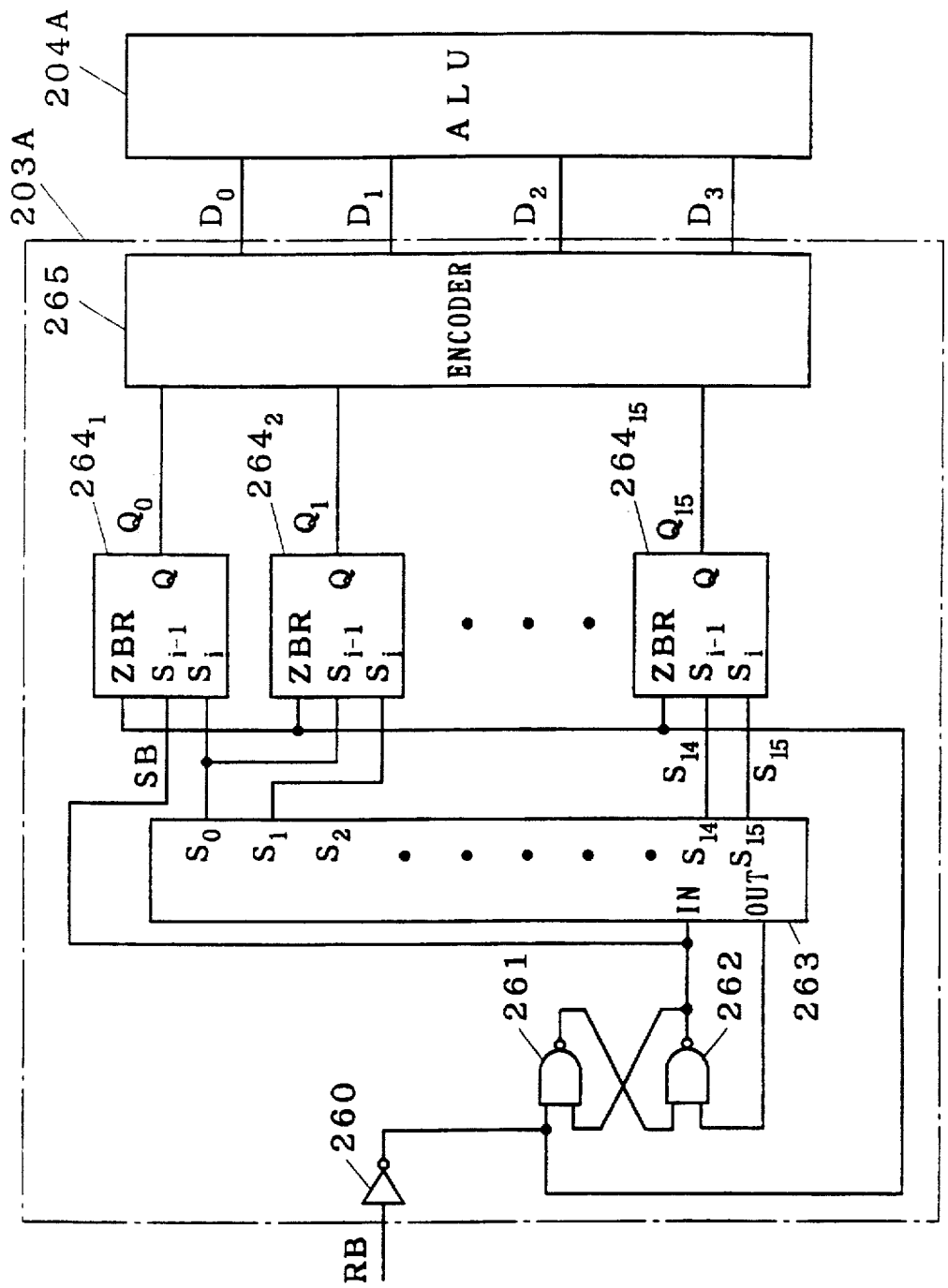
FIG. 20 is a block diagram of a demodulator circuit.

Referring to FIGS. 20 to 24, the structure of the demodulator circuit on the receiver side is described below. FIG. 20 is a block diagram of the demodulator circuit for demodulating the pulse width modulated signal RB having 4-bit information. In FIG. 20, the reference character 203A designates a demodulator circuit for demodulating the signal RB having 4-bit information; 260 designates an inverter receiving the signal RB; 261 designates an NAND gate having a first input connected to the output of the inverter 260, a second input, and an output; 262 designates an NAND gate having a first input connected to the output of the NAND gate 261, a second input, and an output connected to the second input of the NAND gate 261; 263 designates a delay circuit having an input terminal IN connected to the output of the NAND gate 262, an output terminal OUT connected to the second input of the NAND gate 262, and signal terminals $S_0$ to $S_{15}$ for outputting a low level signal after respective predetermined delay times when a low level input is received at the input terminal IN; $264_1$ to $264_{15}$ designate sampling circuits for sampling input data ZBR during the time interval between the falling edges of two different signals $S_{i-1}$ and $S_i$ to output the sampled result at their output terminal Q; and 265 designates an encoder for outputting the data $D_0$ to $D_3$ responsive to the outputs $Q_0$ to $Q_{15}$ from the sampling circuits $264_1$ to $264_{15}$.

The NAND gates 261, 262 form a flip-flop circuit which operates on receipt of the output from the inverter 260 and the output from the output terminal OUT of the delay circuit 263. In general, the memory cell array 200A and ALU 204A are widely spaced to cause a large amount of wiring delay on the data bus, resulting in obtuse waveform on the receiver side. The pulse signal having the obtuse waveform applied to the inverter 260 through the data bus is corrected by the inverter 260 into the signal ZBR. In the absence of the pulse signal, the output of the flip-flop circuit is held high in response to the low level output from the inverter 260. Upon receipt of the pulse signal RB through the signal line after an elapse of a short time since $t_{23}$ in FIG. 26, the inverter 260 outputs the signal ZBR which is low. At this time, since the high level signal is applied to the second input of the NAND gate 262 from the output terminal OUT of the delay circuit 263 the output of the flip-flop circuit changes from high to low.

The delay circuit 263 outputs the low level signal at the signal terminals $S_0$ to $S_{15}$ in response to the low level signal at the input terminal IN after an elapse of respective different delay times. For example, the low level signal is outputted from the signal terminal $S_0$ at time $t_{26}$ of FIG. 26, and the low level signal is outputted from the signal terminal $S_2$ at time $t_{27}$. Each of the sampling circuits $264_1$ to $264_{15}$ receives two of a signal SB applied to the input terminal IN of the delay circuit 263 and signals outputted from the signal terminals $S_0$ to $S_{15}$ of the delay circuit 263. For example, the sampling circuit $264_1$ receives the signal SB and the output from the signal terminal $S_0$.

The output from the inverter 260 is applied to the sampling signal input terminals ZBR of all of the sampling circuits $264_1$ to $264_{15}$. Each of the sampling circuits $264_1$ to $264_{15}$ determines its output Q depending upon whether or not the signal applied to the sampling signal input terminal ZBR changes from low to high during the time interval between the falling edge of the signal at the terminal $S_{i-1}$ and the falling edge of the signal at the terminal $S_i$. That is, the output Q from each sampling circuit is low when the signal applied to the sampling signal input terminal ZBR is high, and is high at other times.

The signal SB and the outputs from the signal terminals $S_0$ to $S_{15}$ of the delay circuit 263 change from high to low in sequential order. Thus, the time at which the output from the inverter 260 changes from low to high again falls within the time interval between the contiguous falling edges of two of the signal SB and outputs from the signal terminals $S_0$ to $S_{15}$ of the delay circuit 263. The encoder 265 produces the different data $D_0$ to $D_3$ depending on the last one of the sampling circuits $264_1$ to $264_{15}$ which outputs the low level signal in ascending order of subscript numerals of the sampling circuits $264_1$ to $264_{15}$.

For instance, when the pulse width is such that the output ZBR from the inverter 260 returns from low to high during the time interval between the falling edges of the signals at the signal terminals $S_0$ and $S_1$ of the delay circuit 263, the outputs ($Q_0$, $Q_1$, $Q_2$, $Q_3$, ... $Q_{15}$) from the sampling circuits $264_1$ to $264_{15}$ are (1, 0, 0, ... 0). The output data ($D_0$, $D_1$, $D_2$, $D_3$) from the encoder 265 on receipt of such outputs from the sampling circuits $264_1$ to $264_{15}$ are (0, 0, 0, 0).

When the pulse width is such that the output ZBR from the inverter 260 returns to the high level during the time interval between the falling edges of the signals at the signal terminals $S_1$ and $S_2$ of the delay circuit 263, the outputs ($Q_0$, $Q_1$, $Q_2$, $Q_3$, ... $Q_{15}$) from the sampling circuits $264_1$ to $264_{15}$ are (1, 1, 0, ... 0). The output data ($D_0$, $D_1$, $D_2$, $D_3$) from the encoder 265 on receipt of such outputs from the sampling circuits $264_1$ to $264_{15}$ are (1, 0, 0, 0).

When the pulse width is such that the output ZBR from the inverter 260 returns to the high level after the falling edge of the signal at the signal terminal $S_{15}$ of the delay circuit 263, the outputs ($Q_0$, $Q_1$, $Q_2$, $Q_3$, ... $Q_{15}$) from the sampling circuits $264_1$ to $264_{15}$ are (1, 1, 1, ... 1). The output data ($D_0$, $D_1$, $D_2$, $D_3$) from the encoder 265 on receipt of such outputs from the sampling circuits $264_1$ to $264_{15}$ are (1, 1, 1, 1).

Figure 21:
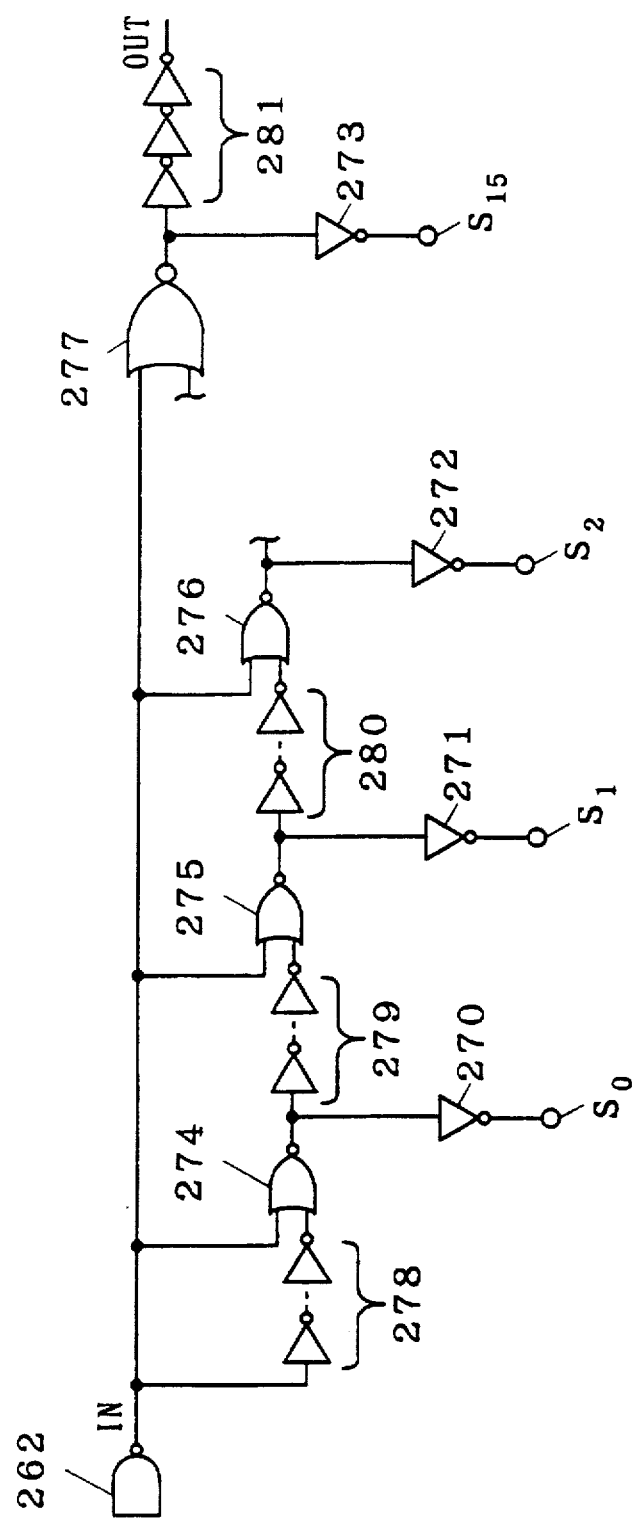
FIG. 21 is a logic diagram of a delay circuit in the demodulator circuit.

Referring to FIG. 21, the structure of the delay circuit 263 is described below. FIG. 21 is a circuit diagram of the delay circuit which is a constituent of the demodulator circuit according to the eighth preferred embodiment of the present invention. In FIG. 21, the reference numerals 270 to 273 designate inverters having outputs connected to the signal terminals $S_0$ to $S_2$ and $S_{15}$, and inputs; 274 to 277 designate NOR gates having first inputs connected to the input terminal IN, second inputs, and outputs connected to the inputs of the inverters 270 to 273; 278 designates an inverter group comprised of an even number of inverters connected in series, the first inverter in the group being connected at its input to the input terminal IN; 279 designates an inverter group comprised of an odd number of inverters connected in series, the first inverter in the group being connected at its input to the output of the NOR gate 274, the last inverter in the group being connected at its output to the second input of the NOR gate 275; 280 designates an inverter group comprised of an odd number of inverters connected in series, the first inverter in the group being connected at its input to the output of the NOR gate 275, the last inverter in the group being connected at its output to the second input of the NOR gate 276; and 281 designates an inverter group comprised of an odd number of inverters connected in series, the first inverter in the group being connected at its input to the output of the NOR gate 277, the last inverter in the group being connected at its output to the output terminal OUT.

Although the circuitry between the NOR gate 276 and the NOR gate 277 is dispensed with, the delay circuit 263 includes inverters connected to the signal terminals $S_3$ to $S_{14}$, inverter groups, and NOR gates which are connected similar to the inverters 271, 272 connected to the signal terminals $S_1$, $S_2$, the inverter group 280 connected between the inputs of the inverters 271, 272, and the NOR gate 276.

The NOR gates 274 to 277 output a high level signal when their first and second inputs are both low. The high level signal is inverted by the inverters 270 to 273 which in turn output the inverted signal at the signal terminals $S_0$ to $S_{15}$. Thus, the time interval between the falling edge of the signal at the input terminal IN and the falling edge of the signal at the second input corresponds to the delay time. The delay time is determined by the number of inverters in the inverter groups 278 to 280. For example, the low level output from the signal terminal $S_0$ contains the delay in the inverter group 278, and the low level output from the signal terminal $S_1$ further contains the delay in the inverter group 279. The low level output from the output terminal OUT further contains the delay in the inverter group 281.

Figure 22:
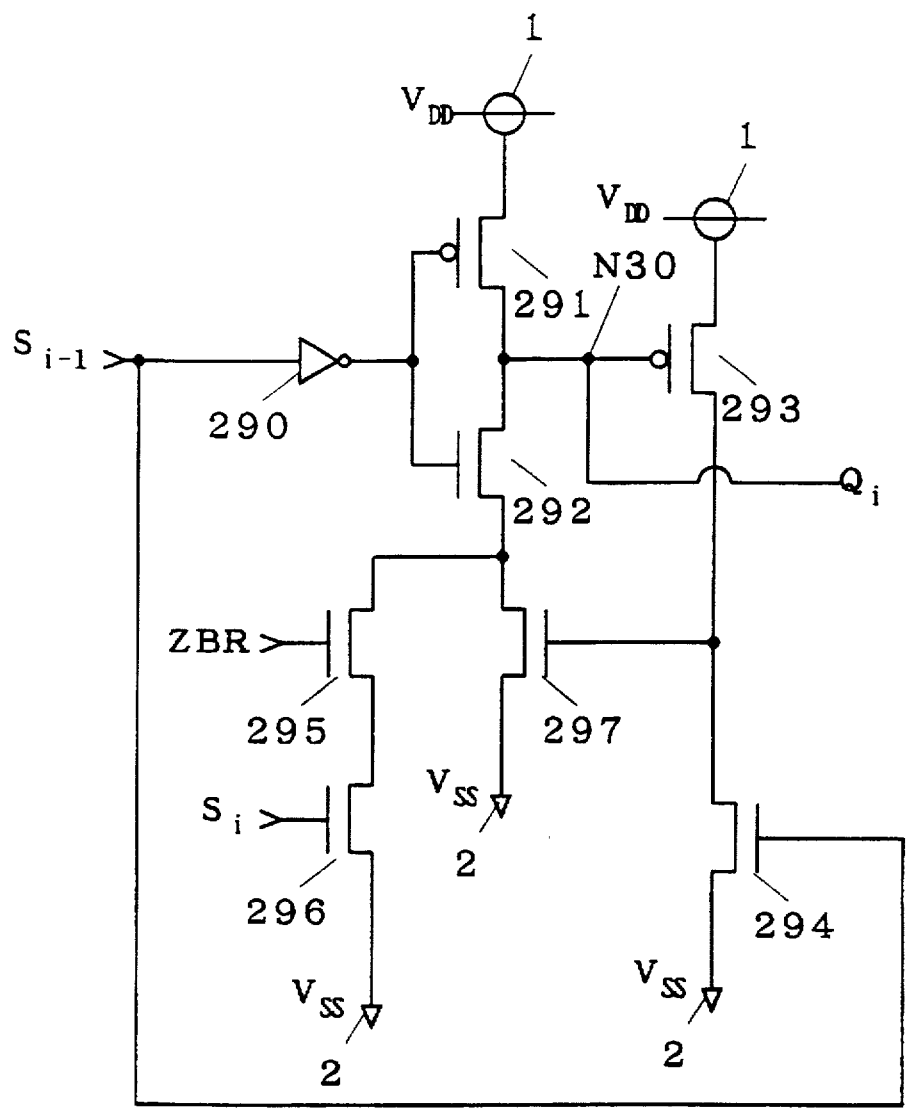
FIG. 22 is a circuit diagram of a sampling circuit.

Referring to FIG. 22, the structure of the sampling circuit will be described below. FIG. 22 is a circuit diagram of the sampling circuit which is a constituent of the demodulator circuit according to the eighth preferred embodiment of the present invention. In FIG. 22, the reference numeral 290 designates an inverter having an input receiving the signal $S_{i-1}$, and an output; 291 designates a PMOS transistor having a source connected to the power supply 1 providing the power supply voltage $V_{DD}$, a gate connected to the output of the inverter 290, and a drain; 292 designates an NMOS transistor having a drain connected to the drain of the PMOS transistor 291, a gate connected to the output of the inverter 290, and a source; 293 designates a PMOS transistor having a gate connected to the drains of the PMOS transistor 291 and NMOS transistor 292, a source connected to the power supply 1, and a drain; 294 designates an NMOS transistor having a source connected to the power supply 2 providing the ground voltage $V_{SS}$, a drain connected to the drain of the PMOS transistor 293, and a gate receiving the signal $S_{i-1}$; 295 designates an NMOS transistor having a gate receiving the signal ZBR, a drain connected to the source of the NMOS transistor 292, and a source; 296 designates an NMOS transistor having a drain connected to the source of the NMOS transistor 295, a gate receiving the signal $S_i$, and a source connected to the power supply 2; and 297 designates an NMOS transistor having a drain connected to the source of the NMOS transistor 292, a source connected to the power supply 2, and a gate connected to the drain of the PMOS transistor 293. The drains of the PMOS transistor 291 and NMOS transistor 292 output the signal $Q_i$.

The operation of the sampling circuit of FIG. 22 will be discussed with reference to the waveform chart of FIG. 23. While the signal $S_{i-1}$ is high, since the inverter 291 outputs the low level signal, the PMOS transistor 290 is on and the voltage at a node N30 is precharged to the high level. The NMOS transistor 294 is off and the PMOS transistor 293 is off to hold the gate of the NMOS transistor 297 low, holding the NMOS transistor 297 off. At this time, when the signal ZBR is low and the signal $S_i$ is high, the NMOS transistor 296 is on but the NMOS transistor 295 is off.

Figure 23:
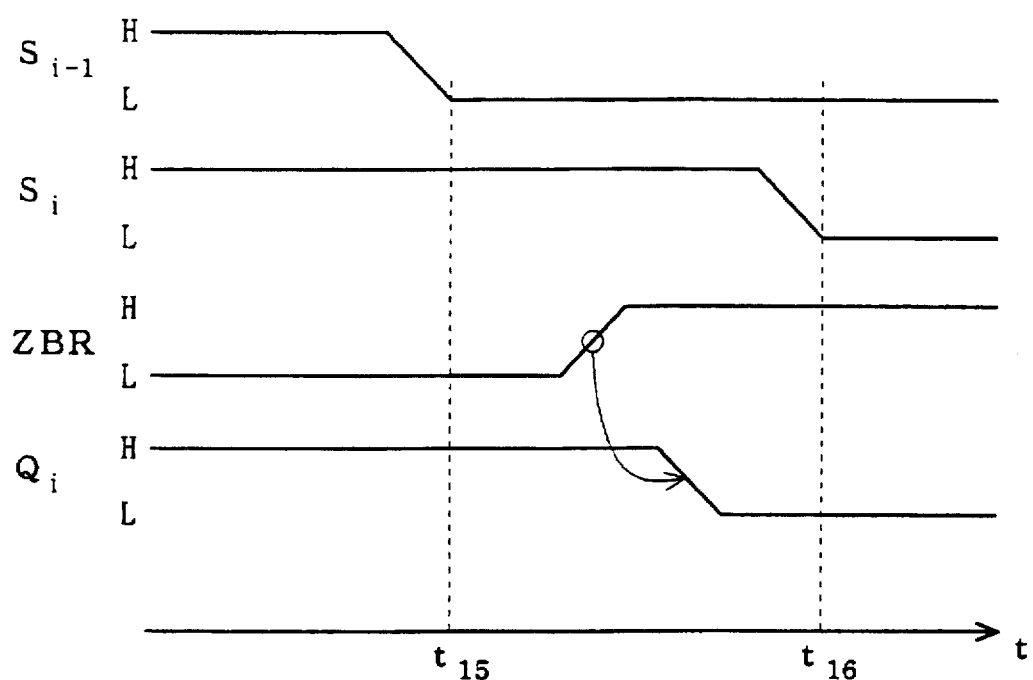
FIG. 23 is a waveform chart showing the operation of the sampling circuit of FIG. 22.

If the signal ZBR goes high as shown in FIG. 23 during the time interval between the falling edge of the signal $S_{i-1}$ at time $t_{15}$ which turns off the PMOS transistor 291 and turns on the NMOS transistor 292 and the falling edge of the signal $S_i$ at time $t_{16}$, the transistor 296 is on because of the high level of the signal $S_i$ and the NMOS transistor 295 turns on by the low-to-high transition of the signal ZBR. This changes the output $Q_i$ to the low level. Thus, when the voltage at the node N30 decreases to a level lower than the threshold voltage of the PMOS transistor 293, the PMOS transistor 293 turns on, and the gate voltage of the NMOS transistor 297 becomes the voltage $V_{DD}$ of the power supply 1. This turns on the NMOS transistor 297, and the voltage at the node N30 becomes the voltage $V_{SS}$ of the power supply 2.

With the signals $S_{i-1}$, $S_i$ low, the PMOS transistor 291 and NMOS transistor 296 are off and the NMOS transistor 292 is on. The NMOS transistor 294 is off. The PMOS transistor 293 which is on causes the voltage $V_{DD}$ to be fed from the power supply 1 to the gate of the NMOS transistor 297 to hold the NMOS transistor 297 off. No charges are extracted from the node N30 through the NMOS transistor 292, thereby holding the voltage at the node N30 high.

The sampling circuit of FIG. 22 outputs the low or high level signal depending on whether or not the data ZBR are held high during the time interval between the falling edge of the signal $S_{i-1}$ and the falling edge of the signal $S_i$. The sampling circuit of FIG. 22 is designed to extract charges from the precharged node N30 when the signal ZBR is high, thereby operating at high speeds. Therefore, the sampling circuit operates sufficiently if the time interval is short between the falling edges of the signals $S_i$ and $S_{i-1}$. This permits the sampling circuit to be applied to a semiconductor integrated circuit with a short pulse signal width and operating at high speeds.

Figure 24:
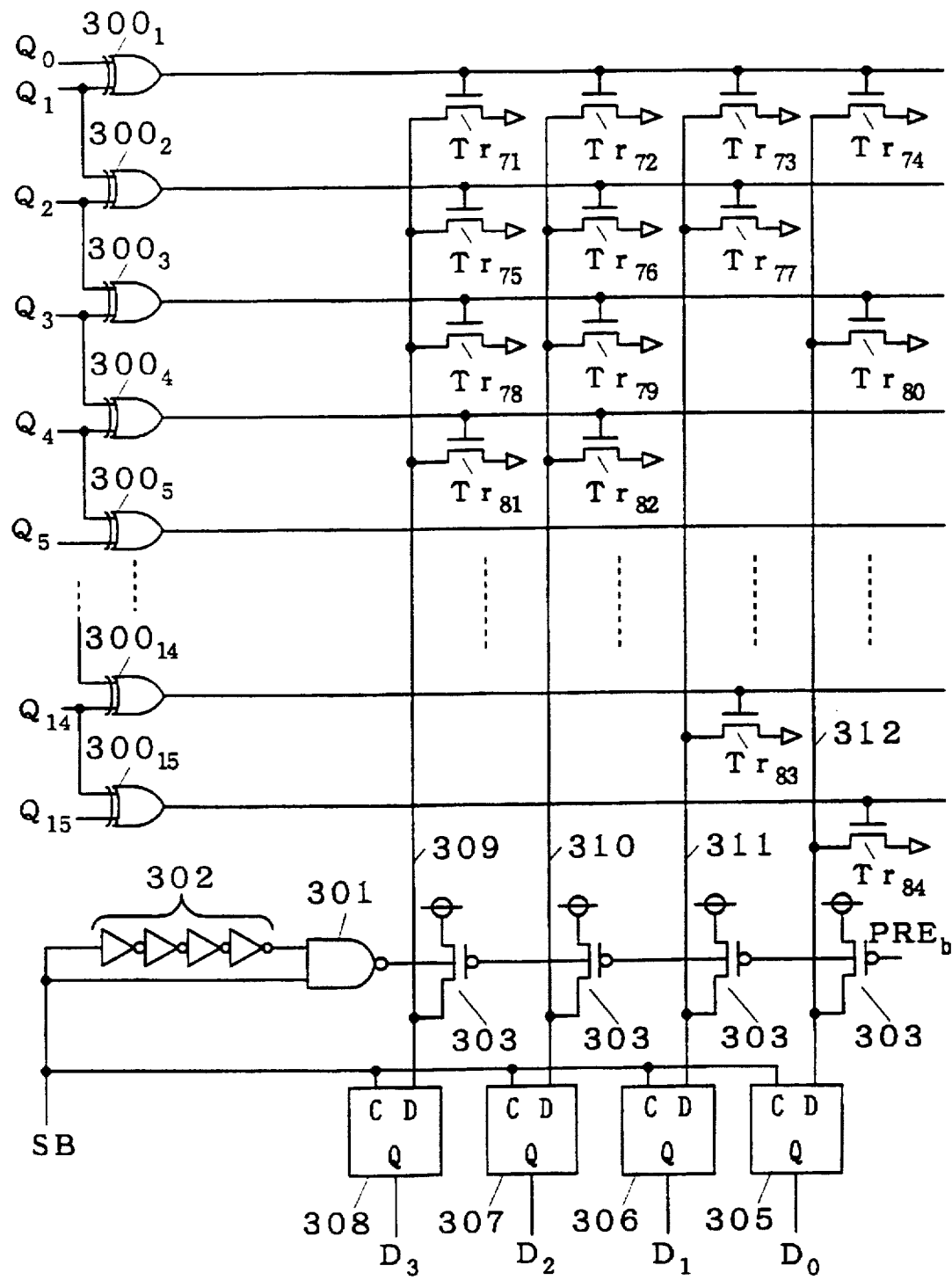
FIG. 24 is a circuit diagram of an encoder in the demodulator circuit.

The structure of the encoder is described below with reference to FIG. 24. In FIG. 24, the reference numerals $300_1$ to $300_{15}$ designate exclusive-OR gates for outputting the exclusive-OR of two adjacent ones of the output signals $Q_0$ to $Q_{15}$ from the sampling circuit, e.g., the output signals $Q_0$ and $Q_1$; $Tr_{71}$ to $Tr_{74}$ designate NMOS transistors each having a drain, a gate connected to the output of the exclusive-OR gate $300_1$, and a source grounded; $Tr_{75}$ to $Tr_{77}$ designate NMOS transistors each having a drain, a gate connected to the output of the exclusive-OR gate $300_2$, and a source grounded; $Tr_{78}$ to $Tr_{80}$ designate NMOS transistors each having a drain, a gate connected to the output of the exclusive-OR gate $300_4$, and a source grounded; $Tr_{81}$ and $Tr_{82}$ designate NMOS transistors each having a drain, a gate connected to the output of the exclusive-OR gate $300_4$, and a source grounded; $Tr_{83}$ designates an NMOS transistor having a drain, a gate connected to the output of the exclusive-OR gate $300_{14}$ and a source grounded; and $Tr_{84}$ designates an NMOS transistor having a drain, a gate connected to the output of the exclusive-OR gate $300_{15}$, and a source grounded.

Although not shown, the encoder further includes exclusive-OR gates for processing the output signals $Q_5$, $Q_6$–$Q_3$, and $Q_{14}$, and NMOS transistors having gates connected to the outputs of the exclusive-OR gates.

The reference numeral 302 designates an inverter group comprised of an even number of inverters connected in series, the first inverter in the group receiving the signal SB at its input; 301 designates an NAND gate having a first input directly receiving the signal SB, a second input connected to the output of the last inverter of the inverter group 302, and an output for providing the result of NAND operation of the first and second inputs thereof; 309 designates a signal line connected to the drains of the NMOS transistors $Tr_{71}$, $Tr_{75}$, $Tr_{78}$, $Tr_{81}$ and the like; 310 designates a signal line connected to the drains of the NMOS transistors $Tr_{72}$, $Tr_{76}$, $Tr_{79}$, $Tr_{82}$ and the like; 311 designates a signal line connected to the drains of the NMOS transistors $Tr_{73}$, $Tr_{77}$, $Tr_{83}$ and the like; 312 designates a signal line connected to the drains of the NMOS transistors $Tr_{74}$, $Tr_{80}$, $Tr_{84}$ and the like; 303 designates PMOS transistors having drains connected to the signal lines 309 to 312, sources connected to a power supply, and gates connected to the output of the NAND gate 301; and 305 to 308 designate flip-flop circuits for latching signals on the signal lines 309 to 312 at the rising edge of the signal SB to output the data $D_0$ to $D_3$.

When the signal SB goes high, the first input of the NAND gate 301 immediately changes to the high level. However, the signal SB delayed by the inverter group 302 is applied to the second input of the NAND gate 301. Thus the NAND gate 301 provides the low level output delayed by the transfer time in the inverter group 302 from the low-tohigh transition of the signal SB. Since the PMOS transistors 303 turn on upon receipt of the high-to-low transition of the NAND gate 301, the signal lines 309 to 312 are precharged. After the precharge, only at least one of the exclusive-OR gates $300_1$ to $300_{15}$ which receives different logics of two adjacent ones of the output signals $Q_0$ to $Q_{15}$ goes high. Only the NMOS transistor having the gate which receives the high level output of the exclusive-OR gate turns on. At least one of the signal lines 309 to 312 which is connected to the above-stated NMOS transistor goes low. The voltage level of the signal lines 309 to 312 is latched by the flip-flop circuits 305 to 308 when the signal SB changes from low to high. A precharge signal PREb for precharging goes low after the data are latched by the flip-flop circuits because of the addition of the delay time in the inverter group 302. In this manner, the signals $Q_0$ to $Q_{15}$ are encoded by the arrangement of the NMOS transistors $Tr_{71}$ to $Tr_{84}$.

The differential amplifier circuit of the first to seventh preferred embodiments may be applied to the pre-amplifier circuit 201 used in pulse-width modulation of the eighth preferred embodiment, thereby reducing the number of signal lines in the data bus and the current in amplifying the data read from the plurality of pairs of input liens.

Figure 27:
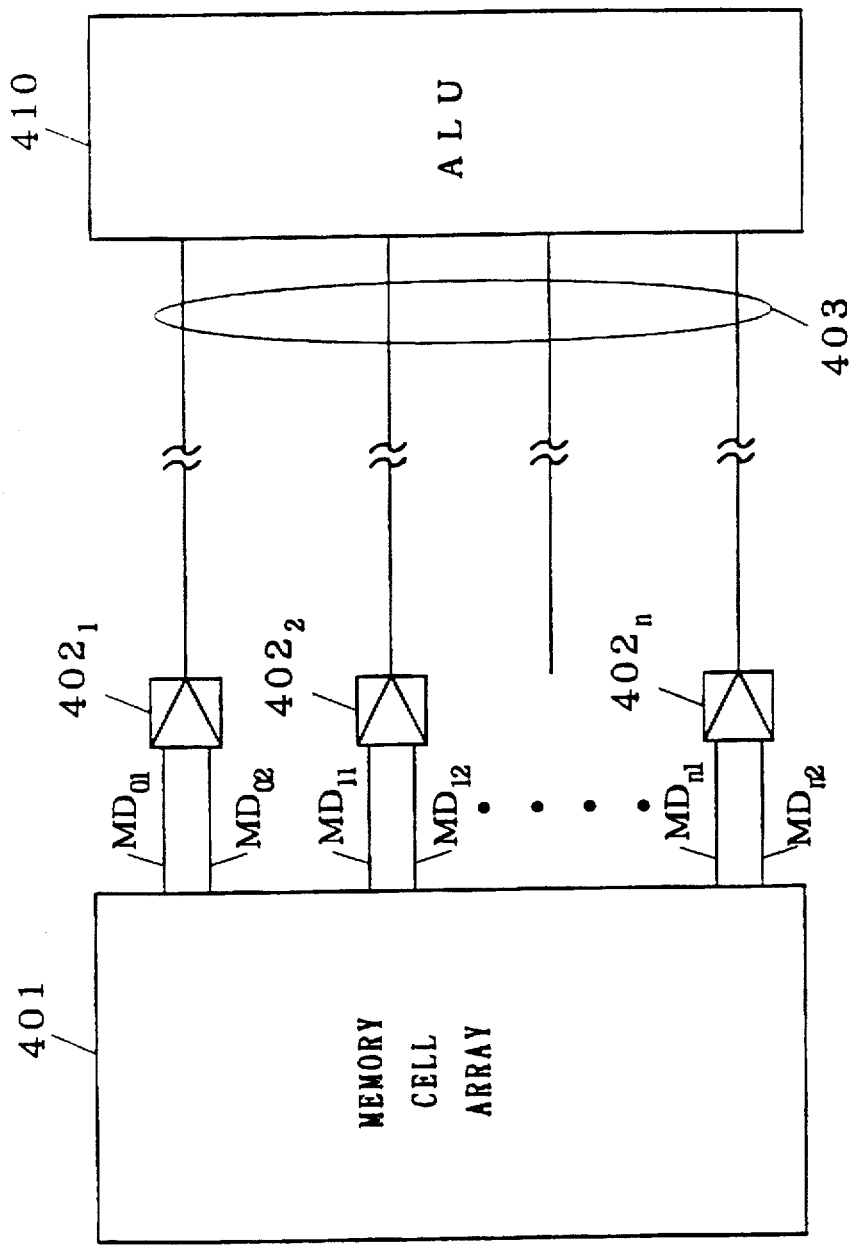
FIG. 27 is a block diagram for illustrating an example of data transfer in a conventional semiconductor integrated circuit.
Figure 28:
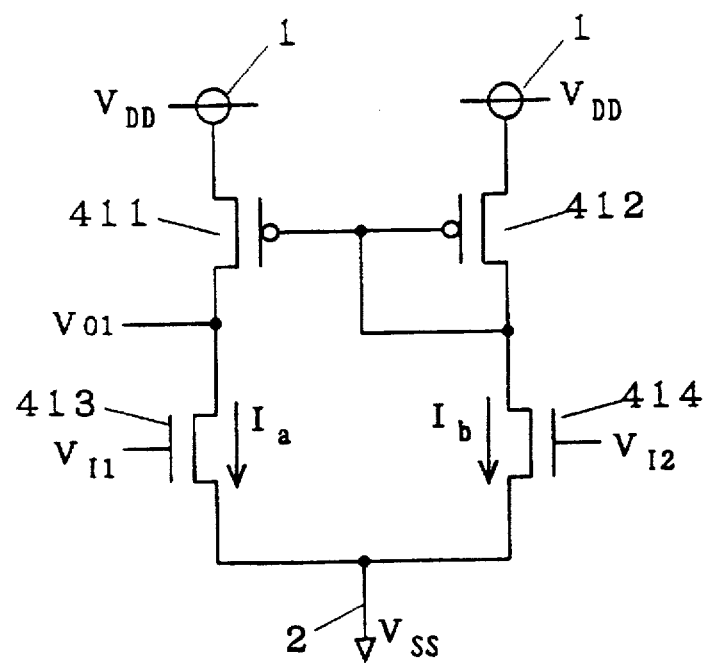
FIG. 28 is a circuit diagram of a conventional differential amplifier circuit.
Figure 29A:
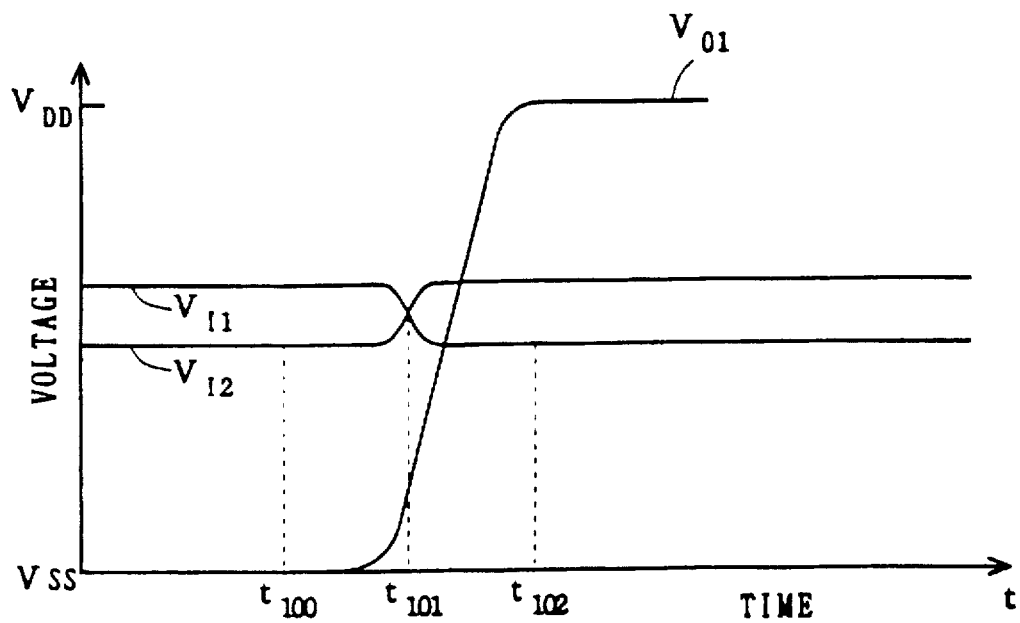
FIGS. 29A and 29B are waveform charts showing the operation of the differential amplifier circuit of FIG. 28.
Figure 29B:
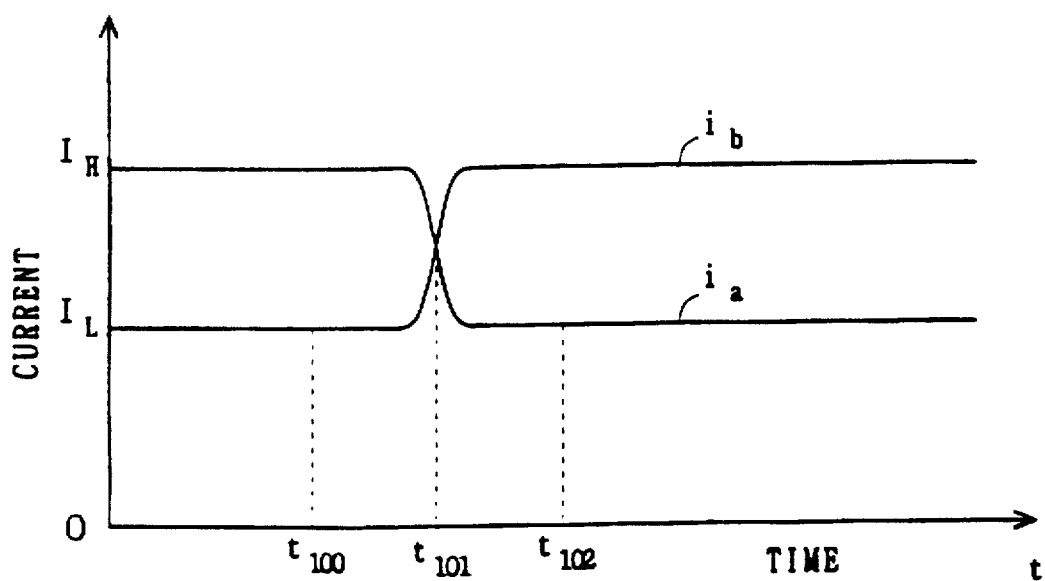

The differential amplifier circuit of the first to sixth preferred embodiments may be applied to the pre-amplifier circuits $402_1$ to $402_n$ for data transfer between the memory cell array and the ALU 410 serving as another functional block shown in FIG. 27, thereby reducing power consumption.

While the invention has been shown and described in detail, the foregoing description is in all respects illustrative and not restrictive. It is therefore understood that numerous modifications and variations can be devised without departing from the scope of the invention.

What is claimed is:

1. A differential amplifier circuit comprising:

first and second loads each having a first end connected to a first power supply providing a first voltage, and a second end;

a first transistor having a first current electrode connected to said second end of said first load, a control electrode receiving a first input signal, and a second current electrode, wherein said first input signal is independent of a voltage at said second current electrode of said first transistor;

a second transistor having a first current electrode connected to said second end of said second load, a control electrode receiving a second input signal, and a second current electrode, wherein said second input signal is independent of a voltage at said second current electrode of said second transistor;

first voltage drop means having a first end connected to said first node, and a second end connected to a second power supply providing a second voltage;

second voltage drop means having a first end connected to said second node, and a second end connected to said second power supply;

a first capacitor connected in parallel with said first voltage drop means; and a second capacitor connected in parallel with said second voltage drop means, wherein a potential difference between said first and second input signals is amplified and outputted from said first current electrodes of said first and second transistors.

2. The differential amplifier circuit of claim 1, wherein said first load includes first resistor means having a first terminal connected to said first power supply, a second terminal connected to said first current electrode of said first transistor, and a control terminal connected to said first current electrode of said second transistor for changing a resistance in response to a voltage at said control terminal of said first resistor means, and wherein said second load includes second resistor means having a first terminal connected to said first power supply, a second terminal connected to said first current electrode of said second transistor, and a control terminal connected to said first current electrode of said first transistor for changing a resistance in response to a voltage at said control terminal of said second resistor means.

3. The differential amplifier circuit of claim 1, said differential amplifier circuit being used in a semiconductor integrated circuit, wherein a pair of signals read from a memory cell array in said semiconductor integrated circuit are differentially amplified and transferred to a predetermined functional block in said semiconductor integrated circuit.

4. A differential amplifier circuit comprising:

current mirror means having an input terminal connected to a first power supply providing a first voltage, and first and second output terminals, said first and second output terminals of said current mirror means providing output currents of the same value;

a first transistor having a first current electrode connected to said first output terminal of said current mirror means, a control electrode receiving a first input signal, and a second current electrode, wherein said first input signal is independent of a voltage at said second current electrode of said first transistor;

a second transistor having a first current electrode connected to said second output terminal of said current mirror means, a control electrode receiving a second input signal, and a second current electrode, wherein said second input signal is independent of a voltage at said second current electrode of said second transistor;

first voltage drop means having a first end connected to said second current electrode of said first transistor, and second end connected to a second power supply providing a second voltage;

second voltage drop means having a first end connected to said second current electrode of said second transistor, and a second end connected to said second power supply;

a first capacitor connected in parallel with said first voltage drop means; and a second capacitor connected in parallel with said second voltage drop means.

5. The differential amplifier circuit of claim 4, said differential amplifier circuit being used in a semiconductor integrated circuit, wherein a pair of signals read from a memory cell array in said semiconductor integrated circuit are differentially amplified and transferred to a predetermined functional block in said semiconductor integrated circuit.

6. A differential amplifier circuit comprising:

first and second loads each having a first end connected to a first power supply providing a first voltage, and a second end;

a first transistor having a first current electrode connected to said second end of said first load, a control electrode receiving a first input signal, and a second current electrode;

a second transistor having a first current electrode connected to said second end of said second load, a control electrode receiving a second input signal, and a second current electrode;

first voltage drop means having a first end connected to said second current electrode of said first transistor, and a second end;

second voltage drop means having a first end connected to said second current electrode of said second transistor, and a second end connected to said second end of said first voltage drop means;

current regulating means having a first terminal connected commonly to said second ends of said first and second voltage drop means and a second terminal connected to a second power supply providing a second voltage, for regulating current;

a first capacitor having a first end connected to said first end of said first voltage drop means, and a second end connected to said first terminal of said current regulating means; and a second capacitor having a first end connected to said first end of said second voltage drop means, and a second end connected to said first terminal of said current regulating means.

7. The differential amplifier circuit of claim 6, wherein said first load includes first resistor means having a first terminal connected to said first power supply, a second terminal connected to said first current electrode of said first transistor, and a control terminal connected to said first current electrode of said second transistor, for changing a resistance in response to a voltage at said control terminal of said first resistor means, and wherein said second load includes second resistor means having a first terminal connected to said first power supply, a second terminal connected to said first current electrode of said second transistor, and a control terminal connected to said first current electrode of said first transistor, for changing a resistance in response to a voltage at said control terminal of said second resistor means.

8. The differential amplifier circuit of claim 6, said differential amplifier circuit being used in a semiconductor integrated circuit, wherein a pair of signals read from a memory cell array in said semiconductor integrated circuit are differentially amplified and transferred to a predetermined functional block in said semiconductor integrated circuit.

9. A differential amplifier circuit comprising:

current mirror means having an input terminal connected to a first power supply providing a first voltage, and first and second output terminals, said first and second output terminals providing output currents of the same value;

a first transistor having a first current electrode connected to said first output terminal of said current mirror means, a control electrode receiving a first input signal, and a second current electrode;

a second transistor having a first current electrode connected to said second output terminal of said current mirror means, a control electrode receiving a second input signal, and a second current electrode;

first voltage drop means having a first end connected to said second current electrode of said first transistor, and a second end;

second voltage drop means having a first end connected to said second current electrode of said second transistor, and a second end connected to said second end of said first voltage drop means;

current regulating means having a first terminal connected commonly to said second ends of said first and second voltage drop means and a second terminal connected to a second power supply providing a second voltage for regulating current;

a first capacitor having a first end connected to said first end of said first voltage drop means, and a second end connected to said first terminal of said current regulating means; and a second capacitor having a first end connected to said first end of said second voltage drop means, and a second end connected to said first terminal of said current regulating means.

10. The differential amplifier circuit of claim 9, said differential amplifier circuit being used in a semiconductor integrated circuit, wherein a pair of signals read from a memory cell array in said semiconductor integrated circuit are differentially amplified and transferred to a predetermined functional block in said semiconductor integrated circuit.

11. A differential amplifier circuit comprising:

first and second loads each having a first end connected to a first power supply providing a first voltage, and a second end;

a first transistor having a first current electrode connected to said second end of said first load, a control electrode receiving a first input signal, and a second current electrode;

a second transistor having a first current electrode connected to said second end of said second load, a control electrode receiving a second input signal, and a second current electrode;

first voltage drop means having a first end connected to said second current electrode of said first transistor, and a second end;

second voltage drop means having a first end connected to said second current electrode of said second transistor, and a second end connected to said second end of said first voltage drop means;

current regulating means having a first terminal connected commonly to said second ends of said first and second voltage drop means and a second terminal connected to a second power supply providing a second voltage for regulating current;

a first capacitor having a first end connected to said first end of said first voltage drop means, and a second end connected to said second power supply; and a second capacitor having a first end connected to said first end of said second voltage drop means, and a second end connected to said second power supply.

12. The differential amplifier circuit of claim 11, wherein said first load includes first resistor means having a first terminal connected to said first power supply, a second terminal connected to said first current electrode of said first transistor, and a control terminal connected to said first current electrode of said second transistor, for changing a resistance in response to a voltage at said control terminal of said first resistor means, and wherein said second load includes second resistor means having a first terminal connected to said first power supply, a second terminal connected to said first current electrode of said second transistor, and a control terminal connected to said first current electrode of said first transistor, for changing a resistance in response to a voltage at said control terminal of said second resistor means.

13. The differential amplifier circuit of claim 11, said differential amplifier circuit being used in a semiconductor integrated circuit, wherein a pair of signals read from a memory cell array in said semiconductor integrated circuit are differentially amplified and transferred to a predetermined functional block in said semiconductor integrated circuit.

14. A differential amplifier circuit comprising:

current mirror means having an input terminal connected to a first power supply providing a first voltage, and first and second output terminals, said first and second output terminals providing output currents of the same value;

a first transistor having a first current electrode connected to said first output terminal of said current mirror means, a control electrode receiving a first input signal, and a second current electrode;

a second transistor having a first current electrode connected to said second output terminal of said current mirror means, a control electrode receiving a second input signal, and a second current electrode;

first voltage drop means having a first end connected to said second current electrode of said first transistor, and a second end;

second voltage drop means having a first end connected to said second current electrode of said second transistor, and a second end connected to said second end of said first voltage drop means;

current regulating means having a first terminal connected commonly to said second ends of said first and second voltage drop means and a second terminal connected to a second power supply providing a second voltage for regulating current;

a first capacitor having a first end connected to said first end of said first voltage drop means, and a second end connected to said second power supply; and a second capacitor having a first end connected to said first end of said second voltage drop means, and a second end connected to said second power supply.

15. The differential amplifier circuit of claim 14, said differential amplifier circuit being used in a semiconductor integrated circuit, wherein a pair of signals read from a memory cell array in said semiconductor integrated circuit are differentially amplified and transferred to a predetermined functional block in said semiconductor integrated circuit.

16. A differential amplifier circuit comprising:

first and second load each having a first end connected to a first power supply providing a first voltage, and a second end;

a first transistor having a first current electrode connected to said second end of said first load, a control electrode receiving a first input signal, and a second current electrode;

a second transistor having a first current electrode connected to said second end of said second load, a control electrode receiving a second input signal, and a second current electrode;

a third transistor having a first current electrode connected to said second current electrode of said first transistor, a control electrode, and a second current electrode connected to a second power supply providing a second voltage;

a fourth transistor having a first current electrode connected to said second current electrode of said second transistor, a control electrode, and a second current electrode connected to said second power supply;

a first capacitor having a first end connected to said first current electrode of said third transistor, and a second end connected to said control electrode of said third transistor;

a second capacitor having a first end connected to said first current electrode of said fourth transistor, and a second end connected to said control electrode of said fourth transistor;

first voltage drop means having a first end connected to said control electrode of said third transistor, and a second end connected to a third power supply providing a third voltage at a level intermediate said first and second voltages; and second voltage drop means having a first end connected to said control electrode of said fourth transistor, and a second end connected to said third power supply, wherein a potential difference between said first and second signals is amplified and outputted from said first current electrodes of said first and second transistors.

17. The differential amplifier circuit of claim 16, wherein said first load includes first resistor means having a first terminal connected to said first power supply, a second terminal connected to said first current electrode of said first transistor, and a control terminal connected to said first current electrode of said second transistor, for changing a resistance in response to a voltage at said control terminal of said first resistor means, and wherein said second load includes second resistor means having a first terminal connected to said first power supply, a second terminal connected to said first current electrode of said second transistor, and a control terminal connected to said first current electrode of said first transistor, for changing a resistance in response to a voltage at said control terminal of said second resistor means.

18. The differential amplifier circuit of claim 16, said differential amplifier circuit being used in a semiconductor integrated circuit, wherein a pair of signals read from a memory cell array in said semiconductor integrated circuit are differentially amplified and transferred to a predetermined functional block in said semiconductor integrated circuit.

19. A differential amplifier circuit comprising:

current mirror means having an input terminal connected to a first power supply providing a first voltage, and first and second output terminals, said first and second output terminals providing output currents of the same value;

a first transistor having a first current electrode connected to said first output terminal of said current mirror means, a control electrode receiving a first input signal, and a second current electrode;

a second transistor having a first current electrode connected to said second output terminal of said current mirror means, a control electrode receiving a second input signal, and a second current electrode;

a third transistor having a first current electrode connected to said second current electrode of said first transistor, a control electrode, and a second current electrode connected to a second power supply providing a second voltage;

a fourth transistor having a first current electrode connected to said second current electrode of said second transistor, a control electrode, and a second current electrode connected to said second power supply;

a first capacitor having a first end connected to said first current electrode of said third transistor, and a second end connected to said control electrode of said third transistor;

a second capacitor having a first end connected to said first current electrode of said fourth transistor, and a second end connected to said control electrode of said fourth transistor;

first voltage drop means having a first end connected to said control electrode of said third transistor, and a second end connected to a third power supply providing a third voltage at a level intermediate said first and second voltages; and second voltage drop means having a first end connected to said control electrode of said fourth transistor, and a second end connected of said third power supply.

20. The differential amplifier circuit of claim 19, said differential amplifier circuit being used in a semiconductor integrated circuit, wherein a pair of signals read from a memory cell array in said semiconductor integrated circuit are differentially amplified and transferred to a predetermined functional block in said semiconductor integrated circuit.

21. A differential amplifier circuit comprising:

first and second loads each having a first end connected to a first power supply providing a first voltage, and a second end;

a first transistor having a first current electrode connected to said second end of said first load, a control electrode receiving a first input signal, and a second current electrode;

a second transistor having a first current electrode connected to said second end of said second load, a control electrode receiving a second input signal, and a second current electrode connected to said second current electrode of said first transistor;

a third transistor having a first current electrode connected commonly to said second current electrodes of said first and second transistors, a control electrode, and a second current electrode connected to a second power supply providing a second voltage;

a capacitor having a first end connected to said first current electrode of said third transistor, and a second end connected to said control electrode of said third transistor; and voltage drop means having a first end connected to said control electrode of said third transistor, and a second end connected to a third power supply providing a third voltage at a level intermediate said first and second voltages.

22. The differential amplifier circuit of claim 21, wherein said first load includes
first resistor means having a first terminal connected to said first power supply, a second terminal connected to said first current electrode of said first transistor, and a control terminal connected to said first current electrode of said second transistor, for changing a resistance in response to a voltage at said control terminal of said first resistor means, and wherein said second load includes
second resistor means having a first terminal connected to said first power supply, a second terminal connected to said first current electrode of said second transistor, and a control terminal connected to said first current electrode of said first transistor, for changing a resistance in response to a voltage at said control terminal of said second resistor means.

23. The differential amplifier circuit of claim 21, said differential amplifier circuit being used in a semiconductor integrated circuit, wherein a pair of signals read from a memory cell array in said semiconductor integrated circuit are differentially amplified and transferred to a predetermined functional block in said semiconductor integrated circuit.

24. A differential amplifier circuit comprising:

current mirror means having an input terminal connected to a first power supply providing a first voltage, and first and second output terminals, said first and second output terminals providing output currents of the same value;

a first transistor having a first current electrode connected to said first output terminal of said current mirror means, a control electrode receiving a first input signal, and a second current electrode;

a second transistor having a first current electrode connected to said second output terminal of said current mirror means, a control electrode receiving a second input signal, and a second current electrode;

a third transistor having a first current electrode connected commonly to said second current electrodes of said first and second transistors, a control electrode, and a second current electrode connected to a second power supply providing a second voltage;

a capacitor having a first end connected to said first current electrode of said third transistor, and a second end connected to said control electrode of said third transistor; and voltage drop means having a first end connected to said control electrode of said third transistor, and a second end connected to a third power supply providing a third voltage at a level intermediate said first and second voltages.

25. The differential amplifier circuit of claim 24, said differential amplifier circuit being used in a semiconductor integrated circuit, wherein a pair of signals read from a memory cell array in said semiconductor integrated circuit are differentially amplified and transferred to a predetermined functional block in said semiconductor integrated circuit.

* * * * *